(12) United States Patent
Kaiser et al.

(10) Patent No.: US 9,356,242 B2
(45) Date of Patent: May 31, 2016

(54) ORGANIC ELECTROLUMINESCENT DEVICE

(75) Inventors: Joachim Kaiser, Darmstadt (DE); Edgar Boehm, Griesheim (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/349,190

(22) PCT Filed: Sep. 8, 2012

(86) PCT No.: PCT/EP2012/003775
§ 371 (c)(1),
(2), (4) Date: Apr. 2, 2014

(87) PCT Pub. No.: WO2013/050101
PCT Pub. Date: Apr. 11, 2013

(65) Prior Publication Data
US 2015/0295184 A1    Oct. 15, 2015

(30) Foreign Application Priority Data
Oct. 6, 2011   (EP) .................................. 11008083

(51) Int. Cl.
*H01L 29/08* (2006.01)
*H01L 51/00* (2006.01)
(Continued)

(52) U.S. Cl.
CPC ............ *H01L 51/0067* (2013.01); *C09K 11/06* (2013.01); *H01L 51/005* (2013.01);
(Continued)

(58) Field of Classification Search
CPC ............ H01L 51/0067; H01L 51/0073; H01L 51/0085; H01L 51/0087; H01L 51/5016; H01L 51/504; H01L 51/0088; H01L 51/0068; H01L 51/0061; H01L 51/006; H01L 51/0059; H01L 51/0058; H01L 51/0057; H01L 51/0056; H01L 51/005; H01L 51/0072; H01L 51/56; H01L 51/5221; H01L 51/5206; H01L 51/5084; H01L 51/5068; H01L 51/5004; C09K 11/06
See application file for complete search history.

(56) References Cited

U.S. PATENT DOCUMENTS

2006/0214568 A1 * 9/2006 Yamazaki ........... H01L 51/0085
                                                                    313/504
2007/0200124 A1 * 8/2007 Suzuri ................... C09K 11/06
                                                                    257/89

(Continued)

FOREIGN PATENT DOCUMENTS

DE   102009012346 A1   9/2010
EP       1999803 A1   12/2008
WO   WO-2011/110262 A1   9/2011

OTHER PUBLICATIONS

Juang, F.-S., et al., "Power Efficiency Improvement of White Phosphorescent Organic Light-Emitting Diode with Thin Double-Emitting Layers and Hole-Trapping Mechnanism", Japanese Journal of Applied Physics, vol. 50, (2011), pp. 04DK04-1 to 04DK04-4.

(Continued)

*Primary Examiner* — Shaun Campbell
(74) *Attorney, Agent, or Firm* — Drinker Biddle & Reath LLP

(57) ABSTRACT

An organic electroluminescent device that includes at least two phosphorescent emitting layers, where phosphorescent emitter layer 1 comprises a hole-conducting matrix material and two different phosphorescent emitters, and phosphorescent emitter layer 2 comprises an electron-conducting matrix material and a phosphorescent emitter.

19 Claims, 1 Drawing Sheet

| 1 |
|---|
| 2 |
| 3 |
| 5 |
| 6 |
| 4 |

(51) Int. Cl.
*H01L 51/50* (2006.01)
*C09K 11/06* (2006.01)
*H01L 51/52* (2006.01)
*H01L 51/56* (2006.01)

(52) U.S. Cl.
CPC .......... *H01L51/006* (2013.01); *H01L 51/0056* (2013.01); *H01L 51/0057* (2013.01); *H01L 51/0058* (2013.01); *H01L 51/0059* (2013.01); *H01L 51/0061* (2013.01); *H01L 51/0068* (2013.01); *H01L 51/0072* (2013.01); *H01L 51/0073* (2013.01); *H01L 51/0085* (2013.01); *H01L 51/0087* (2013.01); *H01L 51/0088* (2013.01); *H01L 51/504* (2013.01); *H01L 51/5016* (2013.01); *C09K 2211/1011* (2013.01); *C09K 2211/1029* (2013.01); *C09K 2211/1044* (2013.01); *C09K 2211/1088* (2013.01); *C09K 2211/185* (2013.01); *H01L 51/5004* (2013.01); *H01L 51/5068* (2013.01); *H01L 51/5084* (2013.01); *H01L 51/5206* (2013.01); *H01L 51/5221* (2013.01); *H01L 51/56* (2013.01); *H01L 2251/5376* (2013.01); *H01L 2251/5384* (2013.01)

(56) References Cited

U.S. PATENT DOCUMENTS

| | | | |
|---|---|---|---|
| 2007/0228938 | A1 | 10/2007 | Hatwar et al. |
| 2009/0033212 | A1* | 2/2009 | Ahn .................... H01L 51/5036 313/504 |
| 2009/0191427 | A1 | 7/2009 | Liao et al. |
| 2011/0284831 | A1 | 11/2011 | Kaiser et al. |
| 2012/0326141 | A1 | 12/2012 | Pflumm et al. |

OTHER PUBLICATIONS

International Search Report for PCT/EP2012/003775 dated Nov. 13, 2012.
Chinese Office Action for corresponding Chinese Patent Application No. 201280049125.2 dated Sep. 28, 2015.

* cited by examiner

Figure 1: Structure of the electroluminescent device
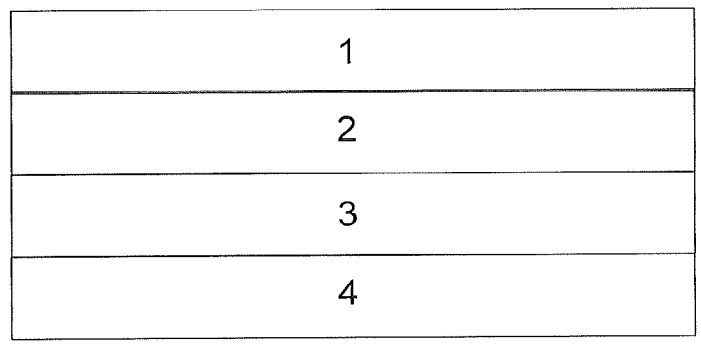
Figure 2: Structure of the tandem OLED
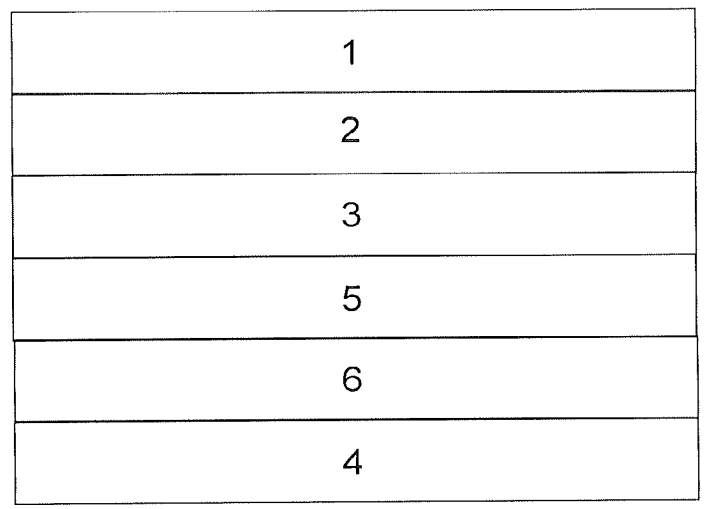

ORGANIC ELECTROLUMINESCENT DEVICE

CROSS-REFERENCE TO RELATED APPLICATIONS

This application is a national stage entry (under 35 U.S.C. §371) of PCT/EP2012/003775, filed Sep. 8, 2012, which claims benefit of European Application No. 11008083.5, filed Oct. 6, 2011, both of which are incorporated herein by reference in their entirety.

BACKGROUND OF THE INVENTION

The present invention relates to organic electroluminescent devices having at least two emitting layers, where the two emitting layers comprise phosphorescent dopants.

The structure of organic electroluminescent devices (OLEDs) in which organic semiconductors are employed as functional materials is described, for example, in U.S. Pat. Nos. 4,539,507, 5,151,629, EP 0676461 and WO 98/27136. A development in the area of organic electroluminescent devices are white-emitting OLEDs. These can be employed either for monochrome white displays or, with coloured filters, for full-colour displays. They are furthermore suitable for lighting applications. White-emitting organic electroluminescent devices based on low-molecular-weight compounds generally have at least two emission layers. Electroluminescent devices having precisely two emission layers are used, in particular, for passive matrix applications, where in accordance with the prior art frequently only fluorescent emitters are used for this purpose. The electroluminescent devices usually have at least three emission layers, which exhibit blue, green and orange or red emission. Either fluorescent or phosphorescent emitters are used in the emission layers, where the phosphorescent emitters exhibit significant advantages owing to the higher achievable efficiency. The general structure of a white-emitting OLED of this type having at least one phosphorescent layer is described, for example, in WO 2005/011013. Owing to the higher achievable efficiency, a white-emitting OLED which comprises only phosphorescent emitter layers would be desirable.

However, since blue-phosphorescent emitters generally do not yet satisfy the common requirements, in particular with respect to the operating lifetime, hybrid OLEDs, i.e. a fluorescent blue emitter layer combined with phosphorescent orange or red and green emitter layers (in the case of three-colour white) or a fluorescent blue emitter layer combined with a phosphorescent yellow to orange emitter layer (in the case of two-colour white), are used in most applications in accordance with the prior art.

A fundamental problem of such hybrid OLEDs consists in that common matrix and emitter materials used in the blue-fluorescent emitter layer generally have an excessively low triplet level for phosphorescent dopants, which can result in triplet excitons being extinguished via the blue emitter layer. This results in lower efficiency of the OLED. In order to obtain maximum efficiency from a white hybrid OLED, care must be taken to prevent this extinguishing of triplet excitons. This is possible through the use of an organic interlayer between the phosphorescent emitter layer and the fluorescent emitter layer. However, very high requirements are made of the materials of an interlayer of this type in order that they on the one hand prevent the extinguishing of triplet excitons, but on the other hand also have no adverse effects on efficiency, lifetime or voltage of the organic electroluminescent device, meaning that it can be difficult to achieve an interlayer of this type.

A further possibility in accordance with the prior art of preventing the extinguishing of triplet excitons via the fluorescent layer consists in implementing the OLED as so-called "stacked OLED" or "tandem OLED", where the phosphorescent layer or layers are arranged in one of the electroluminescent units and the fluorescent layer or layers are arranged in another of the electroluminescent units (for example Y.-S. Tyan et al., SID-Symposium Digest, 2009, 895). Direct contact between the fluorescent emitter layer and the phosphorescent emitter layer can thus be prevented. This structure has the advantage that an organic interlayer is not necessary between the fluorescent emitter layer and the phosphorescent emitter layer. Furthermore, each individual electroluminescent unit of the tandem OLED is subjected to a lower current load than would be the case if all emitting layers were arranged directly one on top of another.

In a tandem OLED, two or more electroluminescent units are connected vertically in series, where charge-generation layers are present between the individual electroluminescent units (for example T.-W. Lee et al., Appl. Phys. Lett. 2008, 92, 043301). The charge-generation layer is usually formed by coupling an n-conducting layer (or a conducting electron-injection layer) and a p-conducting layer (or a conducting hole-injection layer) to one another. The p-conducting layers used in accordance with the prior art comprise, for example, p-doped organic hole-transport materials, where the dopant is, for example, $F_4$-TCNQ or $WO_3$, or inorganic materials, such as, for example, indium tin oxide (ITO), $V_2O_5$, $WO_3$ or $MoO_3$. The n-conducting layer is generally a doped organic electron-transport layer, where the dopant used comprises metals having a low work function, such as, for example, Cs, Li or Mg, or metal carbonates.

In general, it is not sufficient to use only a yellow-phosphorescent dopant in the phosphorescent emitter layer. Thus, a green-phosphorescent dopant and an orange- or red-phosphorescent dopant are usually combined in the phosphorescent electroluminescent unit of the tandem OLED. This can be carried out either by doping both dopants into the same emitter layer or by the two dopants being present in separate emitter layers. However, there are disadvantages in both methods. Thus, a comparatively poor lifetime is obtained if both phosphorescent emitters are doped into one emitter layer. By contrast, although a good lifetime is obtained if the two phosphorescent emitters are present in two separate emitter layers, a strong colour shift with the lifetime which cannot be attributed to the ageing of one of the emitters is, however, observed.

Since it is generally not an advance in practice if only the operating lifetime is improved, but this is accompanied by a relatively large colour shift, the technical problem on which the present invention is based is therefore to provide a device architecture for these two phosphorescent layers which has a comparatively good or improved lifetime of the phosphorescent emission unit and at the same time a small colour shift with the lifetime.

Surprisingly, it has been found that an OLED having the structure defined below solves this problem and results in a very small colour shift at the same time as a very good lifetime.

BRIEF SUMMARY OF THE INVENTION

The invention thus relates to an organic electroluminescent device comprising, in this sequence: anode, phosphorescent emitter layer 1, phosphorescent emitter layer 2, which is in direct contact with emitter layer 1, and cathode, characterised in that emitter layer 1 comprises a hole-conducting matrix material and two different phosphorescent emitters and emitter layer 2 comprises an electron-conducting matrix material and a phosphorescent emitter, where the phosphorescent emitter of emitter layer 2 has the same emission maximum as the shorter-wave phosphorescent emitter of emitter layer 1.

BRIEF DESCRIPTION OF THE SEVERAL VIEWS OF THE DRAWING

FIG. 1 shows a diagrammatic depiction of an embodiment of an OLED in accordance with the invention.

FIG. 2 shows a diagrammatic depiction of an embodiment of a tandem OLED in accordance with the invention.

DETAILED DESCRIPTION OF THE INVENTION

The structure of the OLED according to the invention is depicted diagrammatically in FIG. 1. 1 here denotes the anode, 2 denotes emitter layer 1, comprising a hole-conducting matrix material and two different phosphorescent emitters, 3 denotes emitter layer 2, comprising an electron-conducting matrix material and the shorter-wave phosphorescent emitter, and 4 denotes the cathode. The OLED may also comprise further layers which are not depicted in FIG. 1. This may also be a tandem OLED. This is depicted diagrammatically in FIG. 2. 1 here denotes the anode, 2 denotes emitter layer 1, comprising a hole-conducting matrix material and two different phosphorescent emitters, 3 denotes emitter layer 2, comprising an electron-conducting matrix material and the shorter-wave phosphorescent emitter, 5 denotes a charge-generation layer, which may also be composed of a plurality of individual layers, 6 denotes a further emitting layer and 4 denotes the cathode.

A matrix material in the sense of the present invention is a material which can be used in an emission layer in order to dope in the emitting material in typically a volume concentration of <25%, but which does not itself contribute significantly to light emission, in contrast to the doped-in emitter material. Materials that do contribute significantly to light emission in an emitter layer and materials that do not, and materials that can thus be regarded as emitters and materials that can be regarded as matrix materials, can be recognised by comparison of the electroluminescence spectrum of the OLED in which the emitter layer is present with photoluminescence spectra of the individual materials. The photoluminescence spectrum of the individual materials here is measured in solution in a concentration of 1.5 mg in 250 ml of solvent, where the measurement is carried out at room temperature and any solvent in which the substance dissolves in the said concentration is suitable. Particularly suitable solvents are usually toluene, but also dichloromethane.

A phosphorescent compound in the sense of this invention, as is present in the phosphorescent emitter layer of the organic device according to the invention, is a compound which exhibits luminescence from an excited state having spin multiplicity >1, in particular from an excited triplet state, at room temperature. In the sense of this invention, all luminescent transition-metal complexes, in particular all luminescent iridium, platinum and copper compounds, are to be regarded as phosphorescent compounds.

A fluorescent compound in the sense of this invention, as may be present, for example, as emitter in one of the electroluminescent units of a tandem OLED, is a compound which exhibits luminescence from an excited singlet state at room temperature. In the sense of this invention, all luminescent compounds which are built up only from the elements C, H, N, O, S, F, B and P, in particular, are intended to be taken to be fluorescent compounds.

The organic electroluminescent device does not necessarily have to comprise only layers that are built up from organic or organometallic materials. Thus, it is also possible for anode, cathode, charge-generation layers and/or one or more further layers to comprise inorganic materials or to be built up entirely from inorganic materials.

In the sense of the present invention, "shorter-wave phosphorescent emitter" means that the emitter has an emission maximum in photoluminescence having a shorter wavelength than the other phosphorescent emitter. The photoluminescence spectrum of the individual materials here is measured in solution in a concentration of 1.5 mg in 250 ml of solvent, where the measurement is carried out at room temperature and any solvent in which the substance dissolves in the said concentration is suitable. Particularly suitable solvents are usually toluene, but also dichloromethane. In a preferred embodiment of the invention, the emission maximum of the shorter-wave phosphorescent emitter is at a wavelength which is shorter by between 10 and 140 nm than that of the longer-wave phosphorescent emitter, particularly preferably at a wavelength which is shorter by between 50 and 110 nm than that of the longer-wave phosphorescent emitter.

In the sense of the present invention, "the same emission maximum" means that the emission maximum of the emitters in photoluminescence differs by a maximum of 10 nm. The photoluminescence spectrum here is measured as described above.

In a preferred embodiment of the invention, the phosphorescent emitter in emitter layer 2 is identical to the shorter-wave phosphorescent emitter in emitter layer 1.

In a preferred embodiment of the invention, phosphorescent emitter layer 1 is a yellow-, orange- or red-emitting layer and phosphorescent emitter layer 2 is a green- or yellow-emitting layer.

A yellow-emitting layer here is taken to mean a layer whose photoluminescence maximum is in the range from 540 to 570 nm. An orange-emitting layer is taken to mean a layer whose photoluminescence maximum is in the range from 570 to 600 nm. A red-emitting layer is taken to mean a layer whose photoluminescence maximum is in the range from 600 to 750 nm. A green-emitting layer is taken to mean a layer whose photoluminescence maximum is in the range from 490 to 540 nm. A blue-emitting layer is taken to mean a layer whose photoluminescence maximum is in the range from 440 to 490 nm. The photoluminescence maximum of the layer here is determined by measurement of the photoluminescence spectrum of the layer having a layer thickness of 50 nm, where the layer has the same composition as in the organic electroluminescent device, i.e. comprises emitter and matrix.

In a preferred embodiment of the invention, the two emitter layers according to the invention, emitter layer 1 and emitter layer 2, emit in total light having colour coordinates $0.45 \leq CIE\ x \leq 0.58$ and preferably $0.48 \leq CIE\ x \leq 0.55$.

A hole-conducting material in the sense of the present invention, as is used as matrix material in emitter layer 1, is preferably a material which has an HOMO (highest occupied molecular orbital) of $\geq -5.5$ eV, preferably $\geq -5.3$ eV. The HOMO here is determined by quantum-chemical calculation, as described in detail in general terms below in the example part.

The triplet energy $T_1$ of the hole-conducting matrix material is preferably ≥2.3 eV, particularly preferably ≥2.6 eV. The triplet energy $T_1$ here should be greater than that of the longest-wave emitter.

An electron-conducting material in the sense of the present invention, as is used as matrix material in emitter layer 2, is preferably a material whose LUMO (lowest unoccupied molecular orbital) is in the range from −2.3 eV to −3.1 eV, preferably in the range from −2.6 eV to −2.9 eV. The LUMO here is determined by quantum-chemical calculation, as described in detail in general terms below in the example part.

Emitter layer 2 may also comprise a mixture of an electron-conducting matrix material and at least one further matrix material. If the emitter layer also comprises one or more further matrix materials in addition to the electron-conducting matrix material, the LUMO of the further matrix material or materials is preferably greater than the LUMO of the electron-conducting matrix material +0.2 eV.

The triplet energy $T_1$ of the electron-conducting matrix material is preferably ≥2.5 eV, particularly preferably ≥2.7 eV. The triplet energy $T_1$ here should be greater than that of the phosphorescent emitter.

The triplet energy $T_1$ of a molecule is defined as the energy difference between the energy of the ground state of a molecule and the energy of the lowest triplet state of this molecule. The triplet energy $T_1$ here is determined by quantum-chemical methods, as described in detail in general terms below in the example part.

In a preferred embodiment of the invention, the shorter-wave phosphorescent emitter is present in emitter layer 1 in a concentration of 3 to 25% by vol., particularly preferably in a concentration of 5 to 15% by vol. Furthermore, the longer-wave phosphorescent emitter is preferably present in emitter layer 1 in a concentration of 2 to 15% by vol., particularly preferably in a concentration of 3 to 10% by vol.

The concentration ratio of the two phosphorescent emitters in emitter layer 1 here is preferably selected so that at least 90% of the total emission originates from the longer-wave phosphorescent emitter. This can be determined by building a comparative OLED in which the dopant is omitted in emitter layer 2, so that only emitter layer 1 luminesces. A quantitative comparison between the electroluminescence spectrum of this comparative OLED with the photoluminescence spectra of the two emitters used enables an estimate of which emitter contributes how strongly to the emission.

In a further preferred embodiment of the invention, the phosphorescent emitter is present in emitter layer 2 in a concentration of 2 to 20% by vol., particularly preferably in a concentration of 5 to 15% by vol. In a preferred embodiment of the invention, emitter layer 2 comprises precisely one phosphorescent emitter.

In a further preferred embodiment of the invention, the layer thickness of emitter layer 1 is between 5 and 50 nm, particularly preferably between 10 and 30 nm.

In still a further preferred embodiment of the invention, the layer thickness of emitter layer 2 is between 5 and 50 nm, particularly preferably between 10 and 30 nm.

The embodiments of the invention which are described above and below can be combined with one another as desired. The embodiments mentioned as preferred above and below are preferably combined with one another.

The electron-conducting matrix material in emitter layer 2 is not restricted further, and various classes of substance are generally suitable for this purpose. Suitable and preferred electron-conducting matrix materials are selected from the group consisting of triazines, pyrimidines and aromatic ketones.

In a preferred embodiment of the invention, the electron-conducting matrix material is a triazine derivative or a pyrimidine derivative which is substituted by at least one aromatic or heteroaromatic ring system, preferably by at least two aromatic or heteroaromatic ring systems and particularly preferably by three aromatic or heteroaromatic ring systems. Suitable triazine derivatives which can be used as electron-conducting material are compounds of the following formula (1) or (2), and suitable pyrimidine derivatives are the compounds of the following formulae (3), (4) or (5),

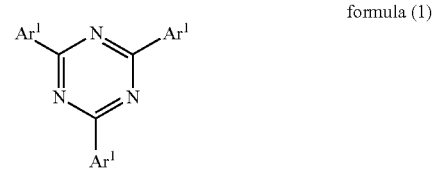

formula (1)

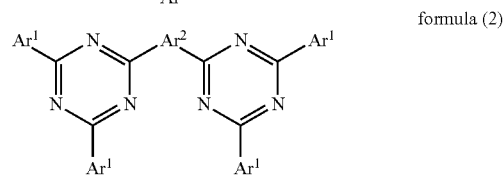

formula (2)

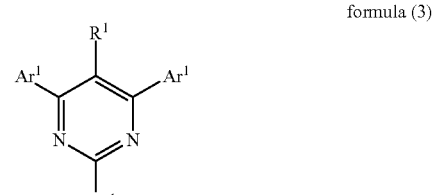

formula (3)

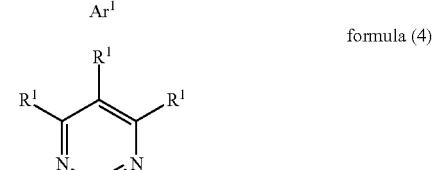

formula (4)

formula (5)

where the following applies to the symbols used:

$Ar^1$ is, identically or differently on each occurrence, a monovalent aromatic or heteroaromatic ring system having 5 to 60 aromatic ring atoms, which may in each case be substituted by one or more radicals $R^1$;

$Ar^2$ is a divalent aromatic or heteroaromatic ring system having 5 to 60 aromatic ring atoms, which may be substituted by one or more radicals $R^1$;

$R^1$ is on each occurrence, identically or differently, H, D, F, Cl, Br, I, CHO, C(=O)$Ar^3$, P(=O)($Ar^3$)$_2$, S(=O)$Ar^3$, S(=O)$_2Ar^3$, CR$^2$=CR$^2Ar^3$, CN, NO$_2$, Si(R$^2$)$_3$, B(OR$^2$)$_2$, B(R$^2$)$_2$, B(N(R$^2$)$_2$)$_2$, OSO$_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C≡C$, $Si(R^2)_2$, $Ge(R^2)_2$, $Sn(R^2)_2$, C=O, C=S, C=Se, C=NR$^2$, P(=O)(R$^2$), SO, $SO_2$, NR$^2$, O, S or CONR$^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

$Ar^3$ is on each occurrence, identically or differently, an aromatic or heteroaromatic ring system having 5 to 40 aromatic ring atoms, which may be substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents $R^2$ here may also form a mono- or polycyclic, aliphatic or aromatic ring system with one another.

An aryl group in the sense of this invention contains at least 6 C atoms; a heteroaryl group in the sense of this invention contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a short non-aromatic unit, such as, for example, a C, N or O atom or a carbonyl group. Thus, for example, systems such as 9,9'-spirobifluorene, 9,9-diarylfluorene, triarylamine, diaryl ether, diarylmethane, stilbene, benzophenone, etc., are also intended to be taken to be aromatic ring systems in the sense of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo [2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl and cyclooctenyl. A $C_2$- to $C_{40}$-alkynyl group is preferably taken to mean ethynyl, propynyl, butynyl, pentynyl, hexynyl, heptynyl and octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, benzanthracene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In compounds of the formula (1) to (5), at least one group $Ar^1$ is preferably selected from the groups of the following formulae (6) to (13), and the other groups $Ar^1$ have the meaning indicated above,

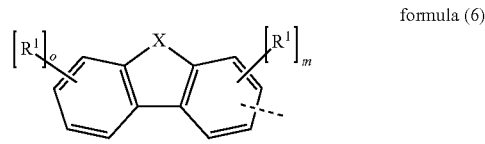

formula (6)

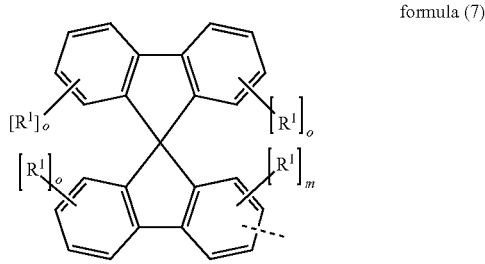

formula (7)

formula (8)
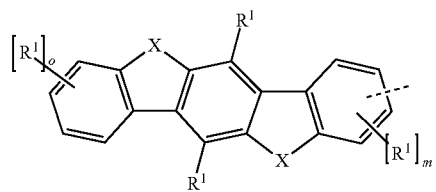

formula (9)
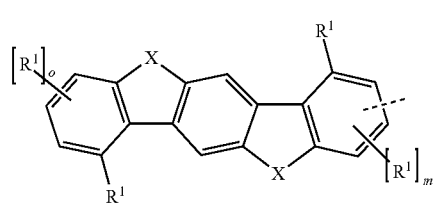

formula (10)
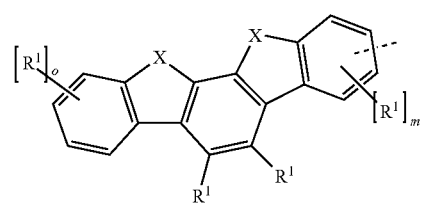

formula (11)
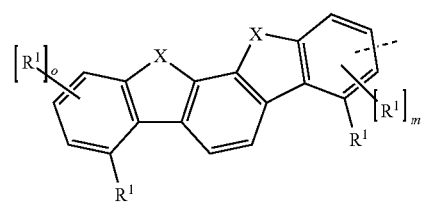

formula (12)
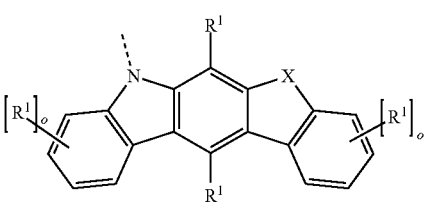

formula (13)
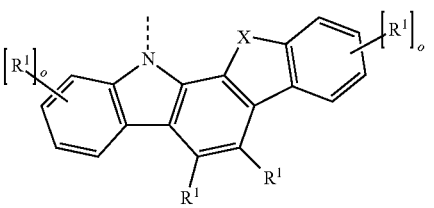

where $R^1$ has the same meaning as described above, the dashed bond represents the link to the triazine unit, and furthermore:

X is, identically or differently on each occurrence, a divalent bridge selected from $B(R^1)$, $C(R^1)_2$, $Si(R^1)_2$, C=O, C=NR$^1$, C=C(R$^1$)$_2$, O, S, S=O, SO$_2$, N(R$^1$), P(R$^1$) and P(=O)R$^1$;

m is on each occurrence, identically or differently, 0, 1, 2 or 3;

o is on each occurrence, identically or differently, 0, 1, 2, 3 or 4.

X preferably stands, identically or differently on each occurrence, for NR$^1$ or C(R$^1$)$_2$.

Particularly preferred groups $Ar^1$ are selected from the groups of the following formulae (6a) to (13a), formula (6a)
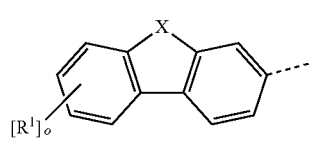

formula (7a)
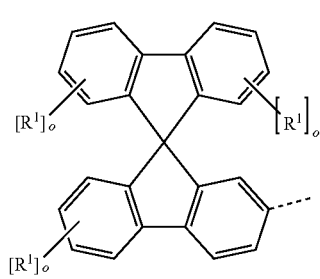

formula (8a)
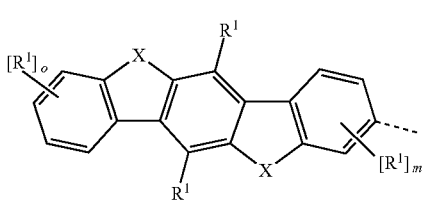

formula (9a)
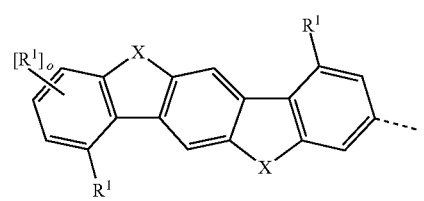

formula (10a)
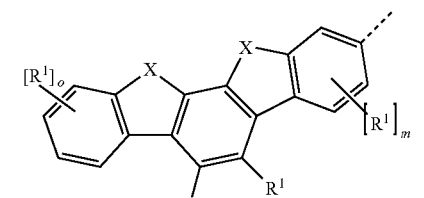

formula (11a)
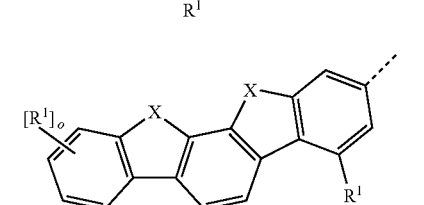

formula (12a)
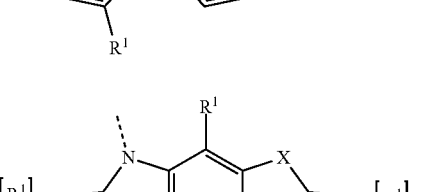

formula (13a)

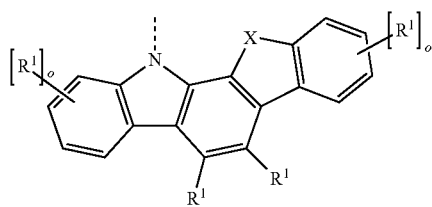

formula (19)

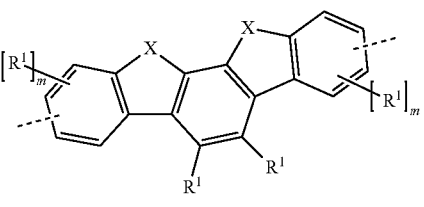

formula (20)

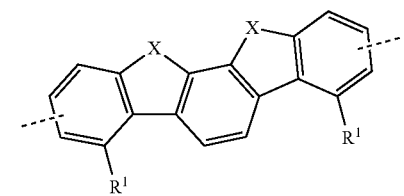

where the symbols and indices used have the same meaning as described above. X here is preferably selected, identically or differently, from $C(R^1)_2$, $N(R^1)$, O and S, particularly preferably $C(R^1)_2$ or $N(R^1)$.

Preferred compounds of the formula (1) and (3) to (5) contain one or two groups of the above-mentioned formula (6) to (13), in particular one group, and contain two or one groups selected from phenyl, 1-naphthyl, 2-naphthyl, ortho-, meta- or para-biphenyl, each of which may be substituted by one or more radicals $R^1$.

Preferred groups $Ar^2$ in compounds of the formula (2) are selected from the groups of the following formulae (14) to (20), where the symbols and indices used have the same meaning as described above, and the dashed bond represents the link to the two triazine units.

Particularly preferred groups $Ar^2$ are selected from the groups of the following formulae (14a) to (20a), formula (14)

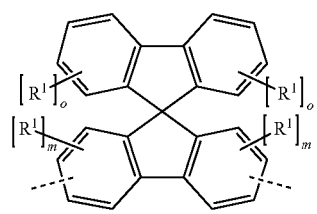

formula (15)

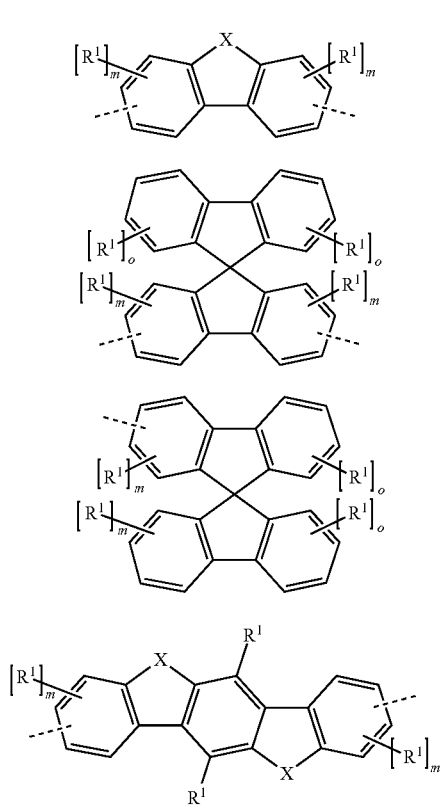

formula (14a)

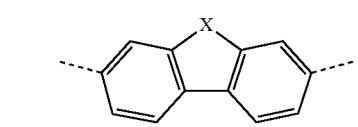

formula (15a)

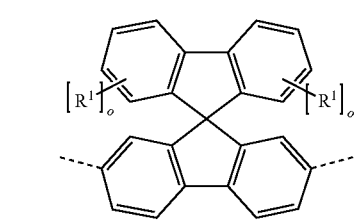

formula (16)

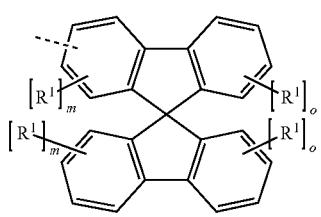

formula (16a)

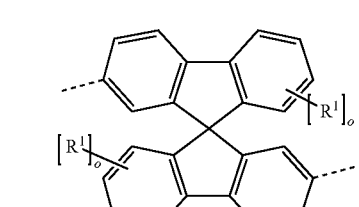

formula (17)

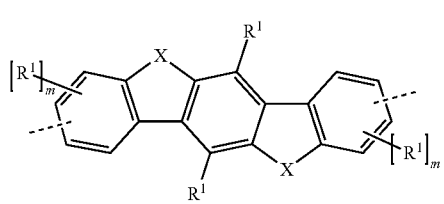

formula (17a)

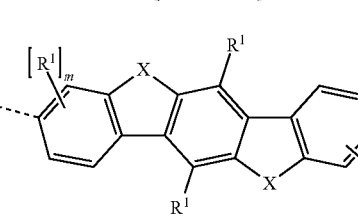

formula (18)

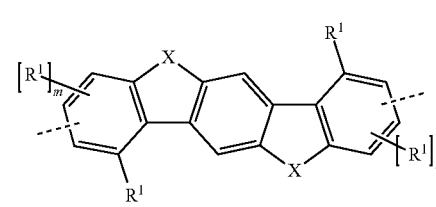

formula (18a)

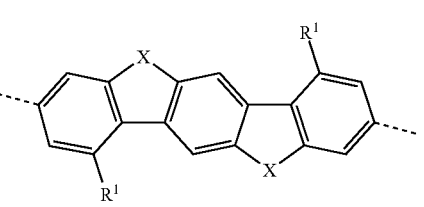

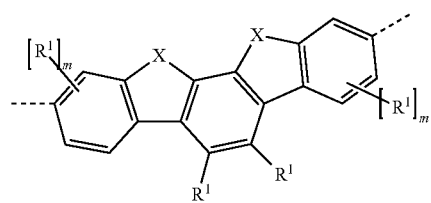
formula (19a)

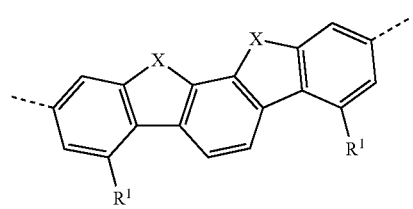
formula (20a)

where the symbols and indices used have the same meaning as described above. X here is preferably selected, identically or differently, from $C(R^1)_2$, $N(R^1)$, O and S, particularly preferably $C(R^1)_2$ or $N(R^1)$.

Preference is furthermore given to compounds of the above-mentioned formula (2) in which the group $Ar^2$ is selected from the above-mentioned formulae (14) to (20) and $Ar^1$ is selected, identically or differently on each occurrence, from the above-mentioned formulae (6) to (13) or phenyl, 1- or 2-naphthyl, ortho-, meta- or para-biphenyl, each of which may be substituted by one or more radicals $R^1$, but are preferably unsubstituted.

Examples of suitable triazine derivatives are structures 1 to 150 depicted below. Entirely analogously, pyrimidine derivatives which contain pyrimidine groups instead of the triazine groups depicted in the structures are suitable.

1

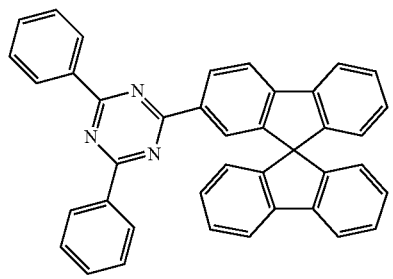

2

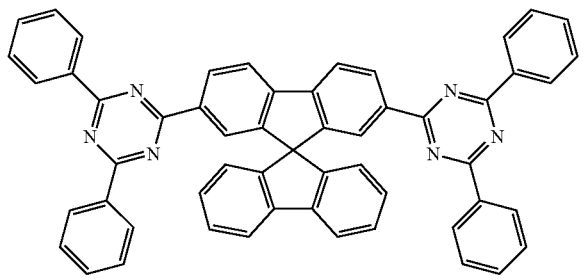

3

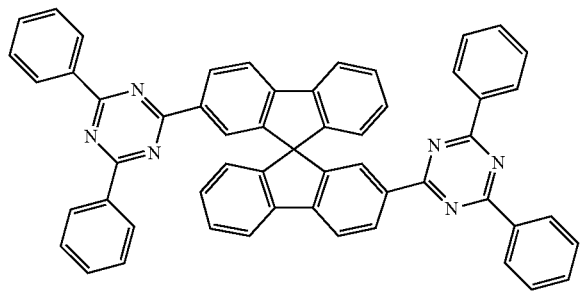

4

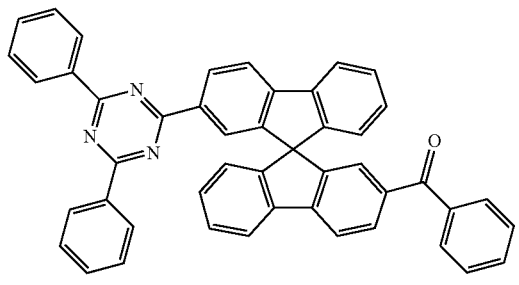

5

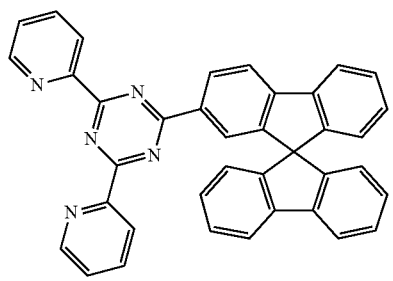

6

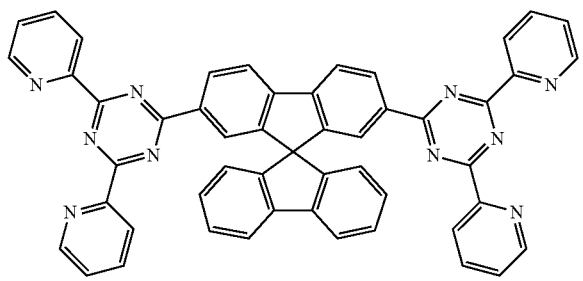

-continued
7
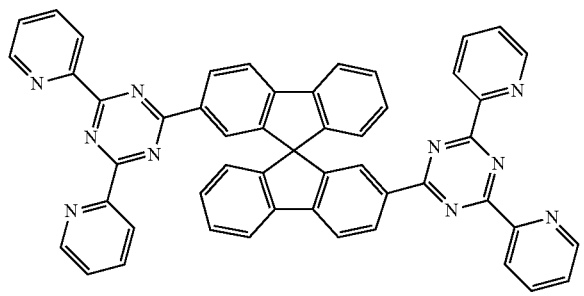
8
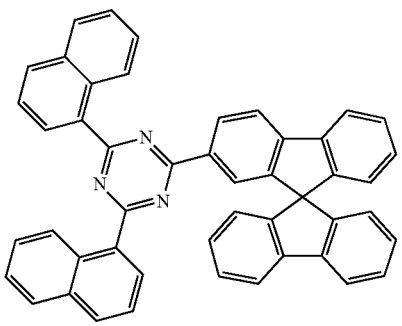
9
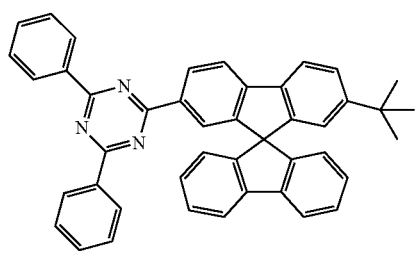
10
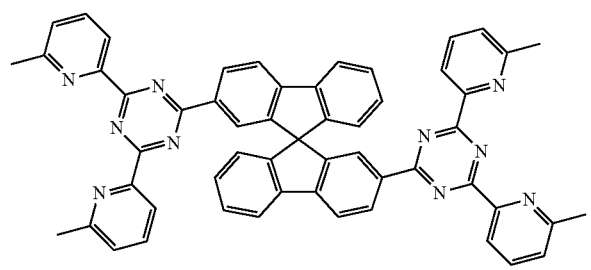
11
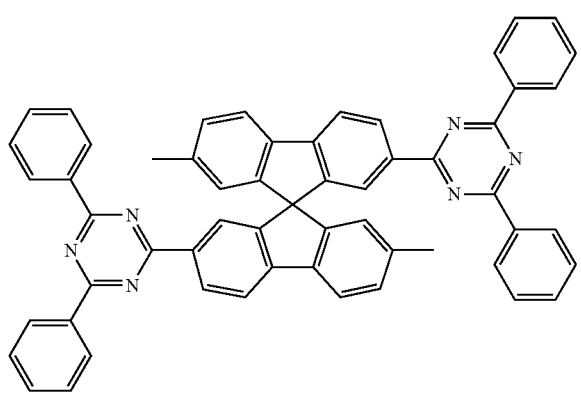
12
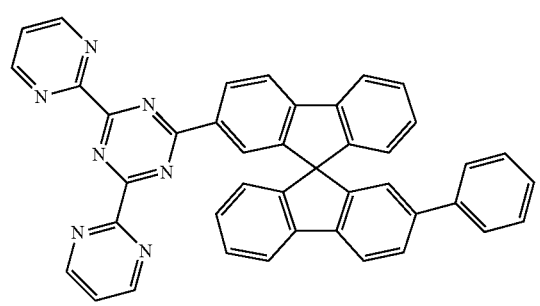
13
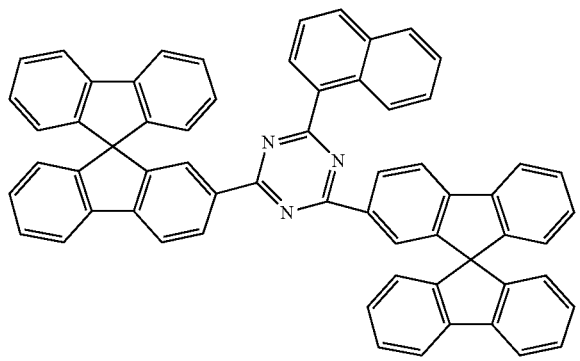
14
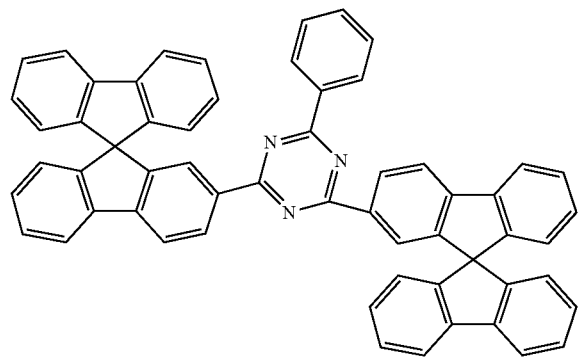

15
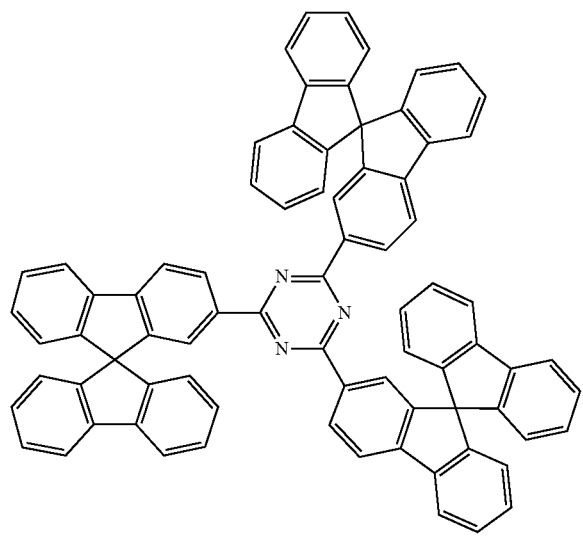
16
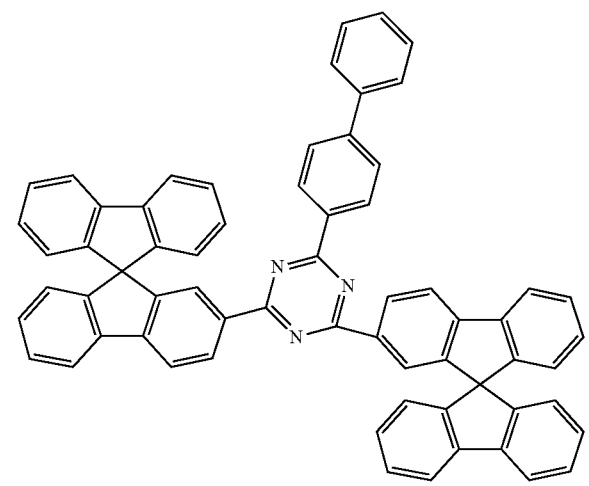
17
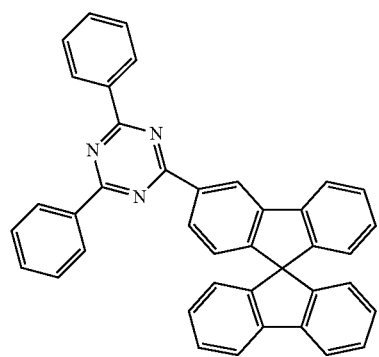
18
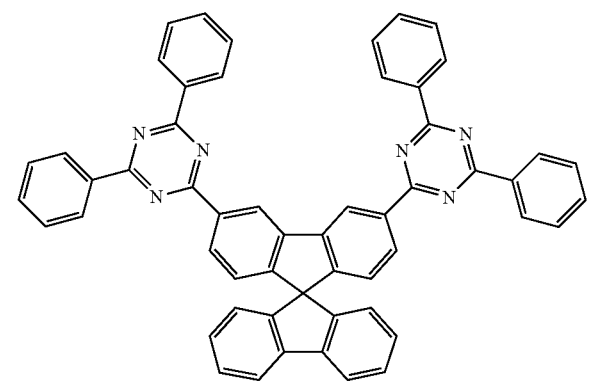
19
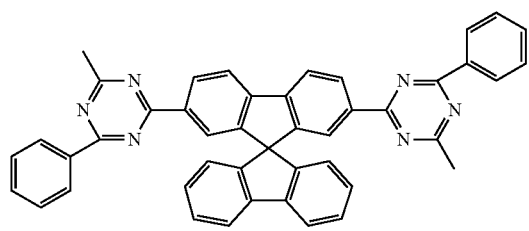
20
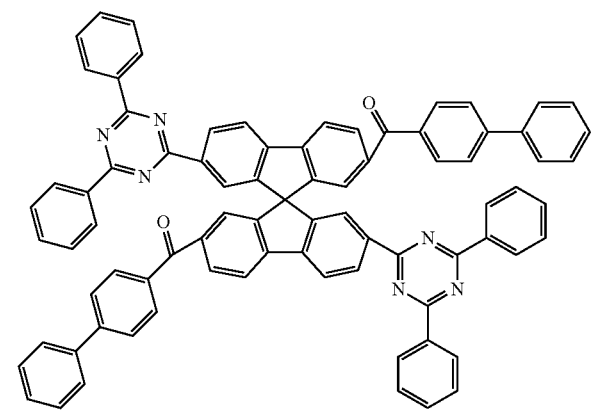

-continued
21
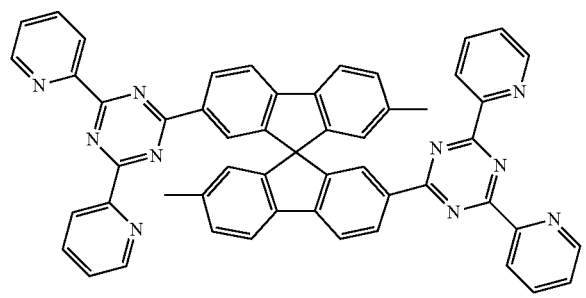
22
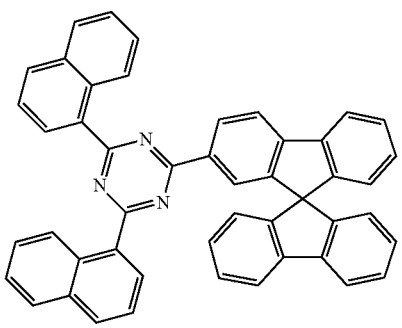
23
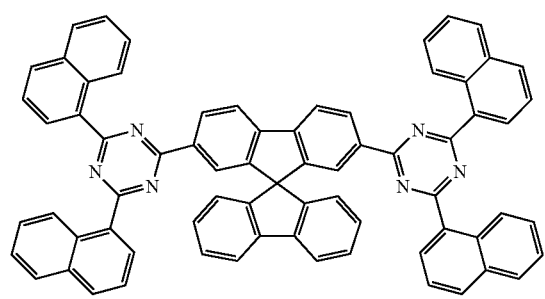
24
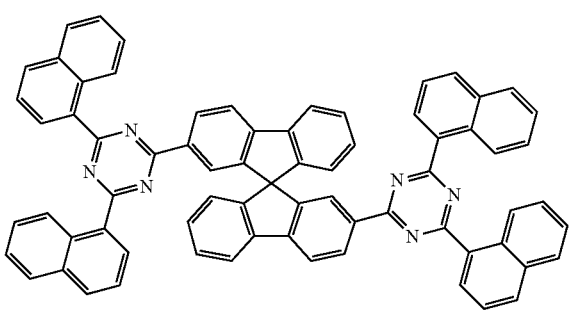
25
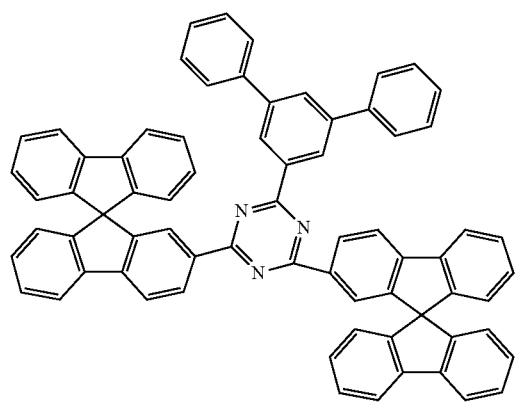
26
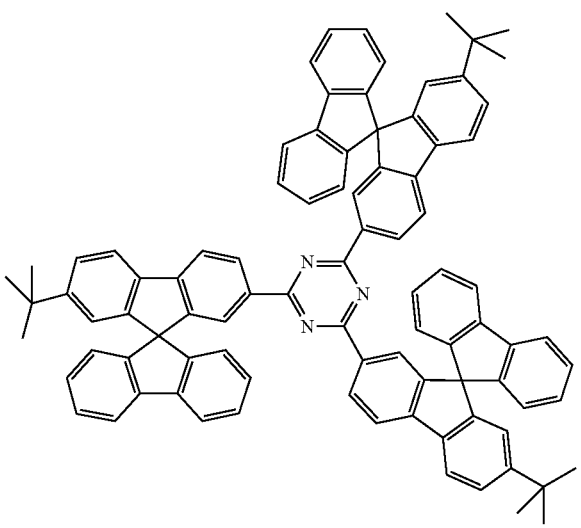
27
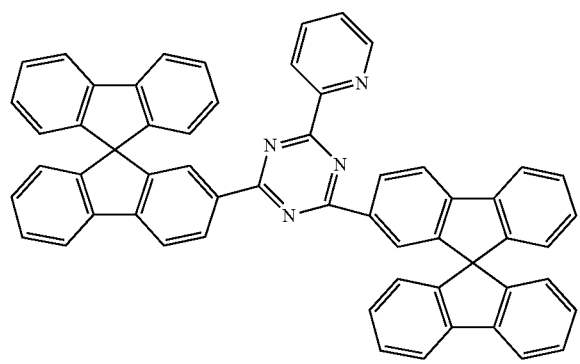
28
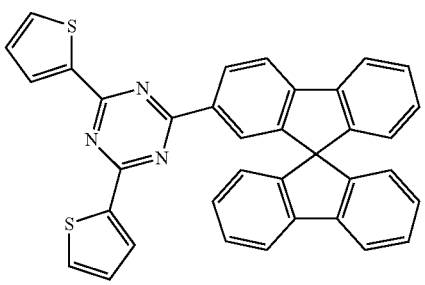

-continued
29
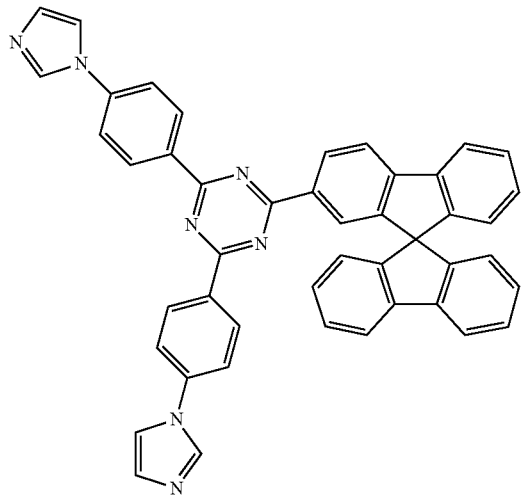
30
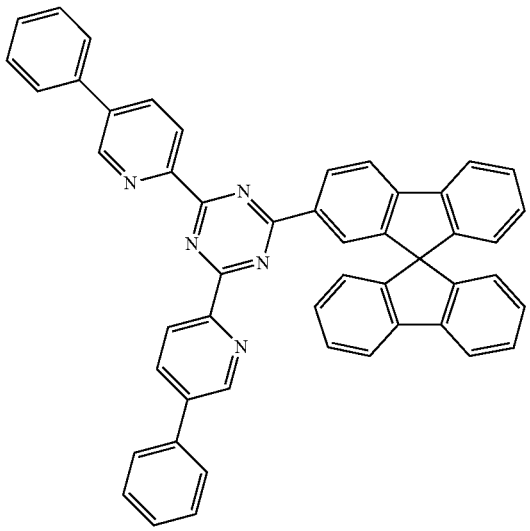
31
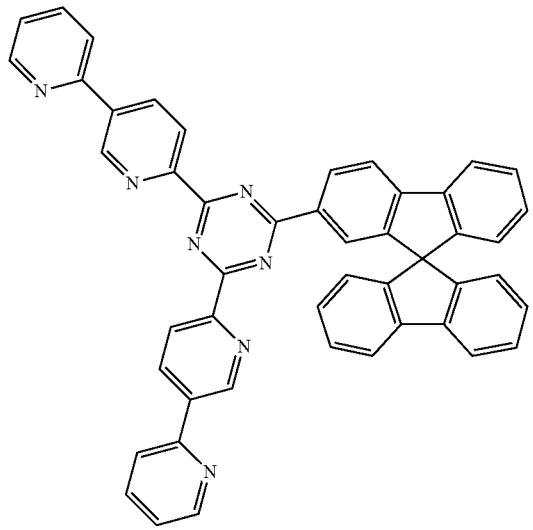
32
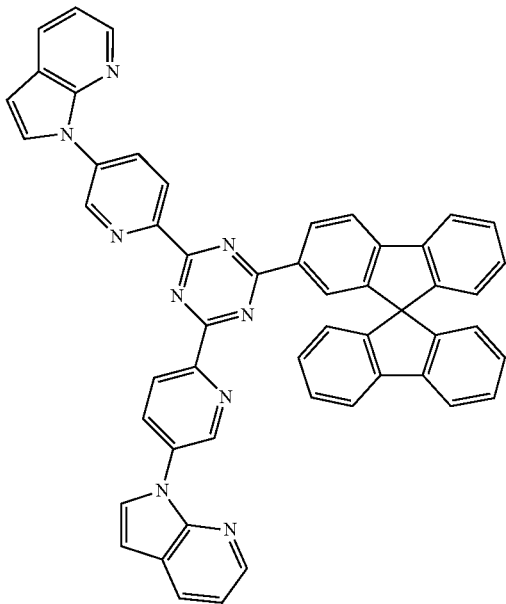
33
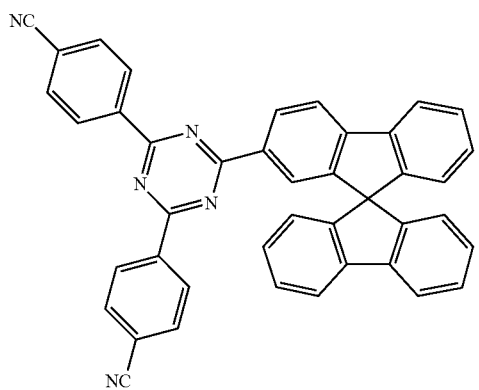
34
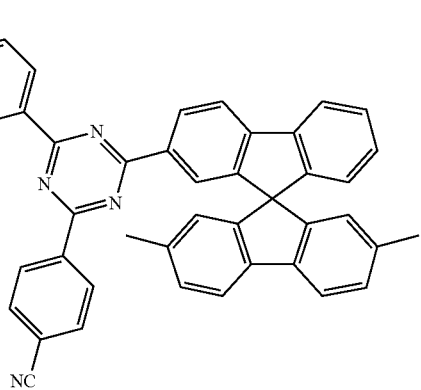

-continued
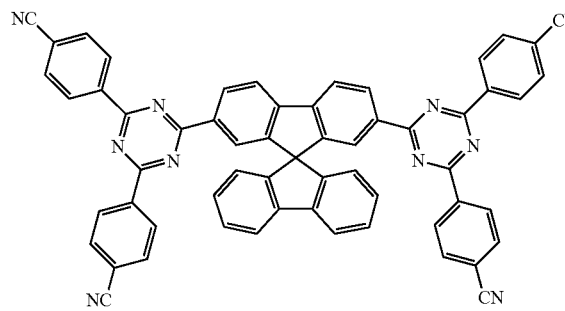
35
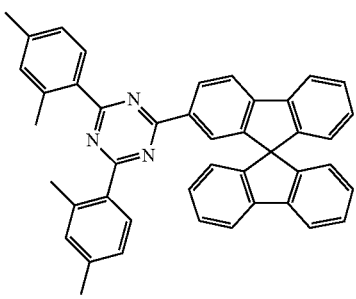
36
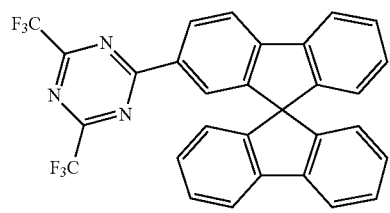
37
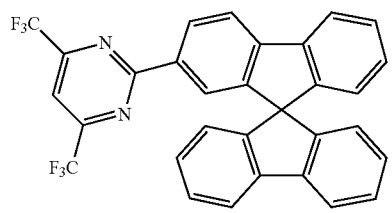
38
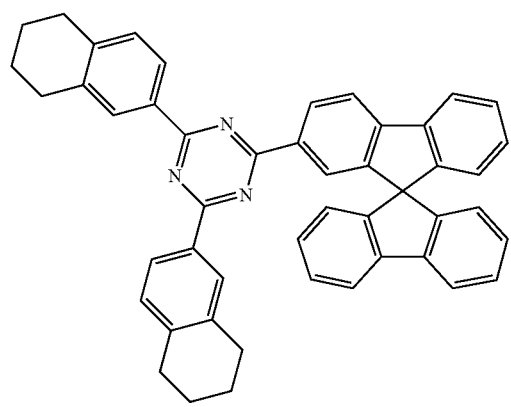
39
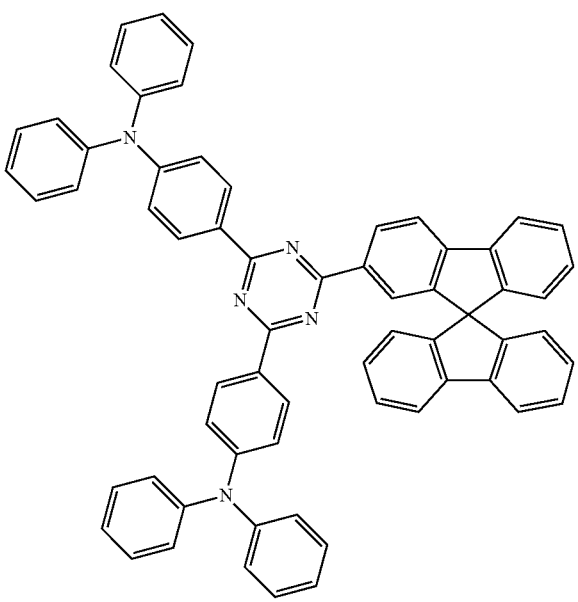
40
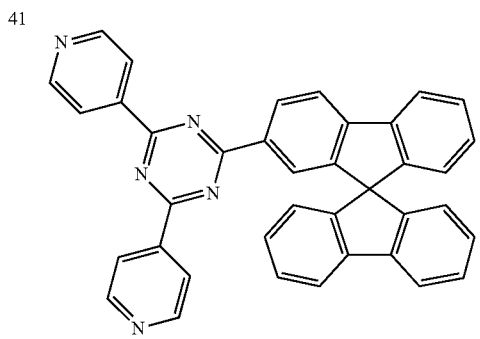
41
42

-continued
43
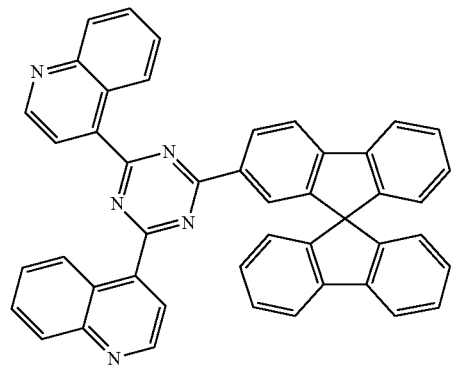
44
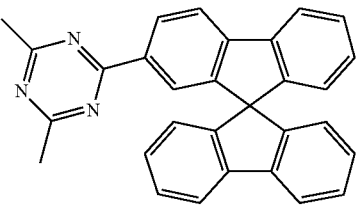
45
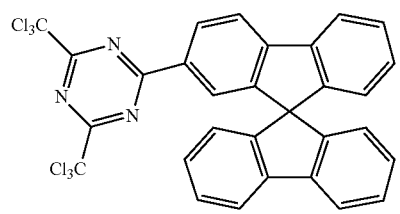
46
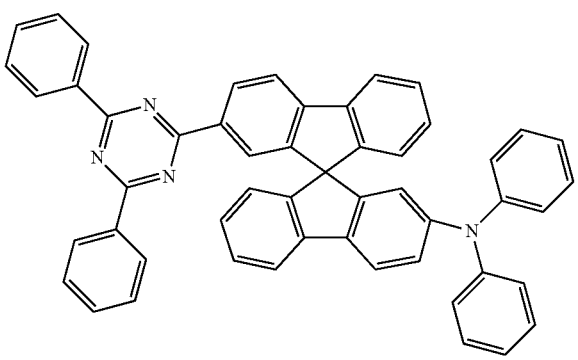
47
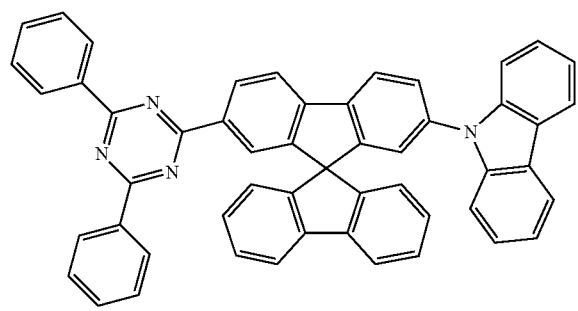
48
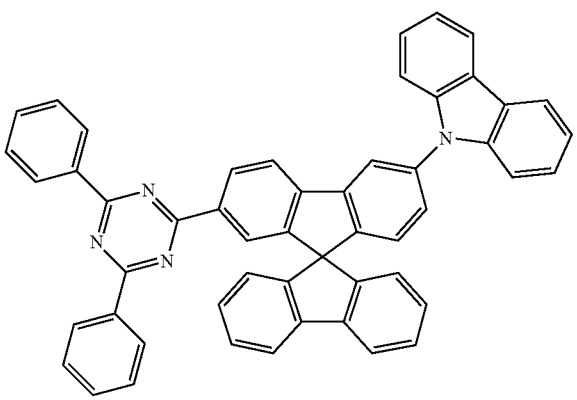
49
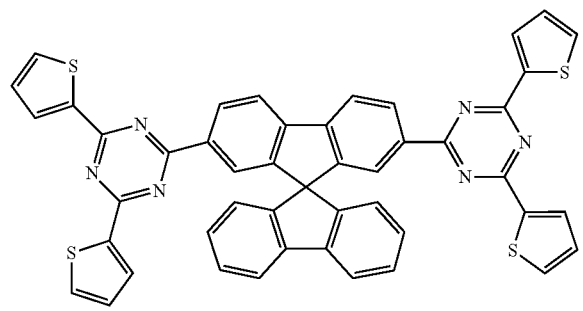
50
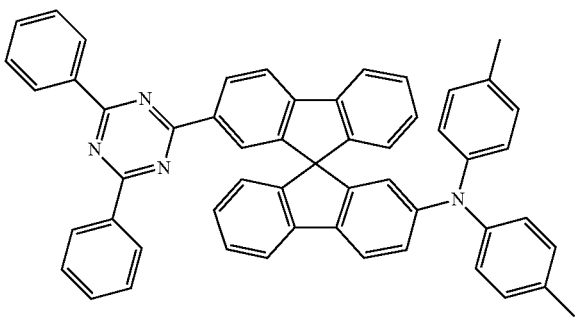

-continued
51
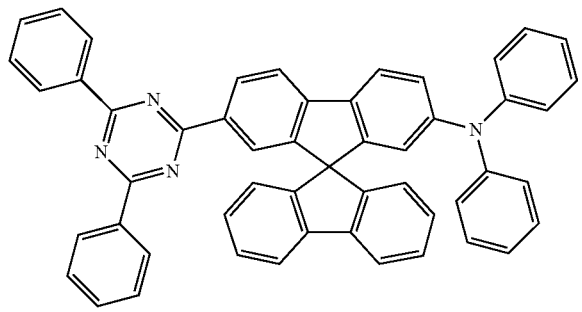
52
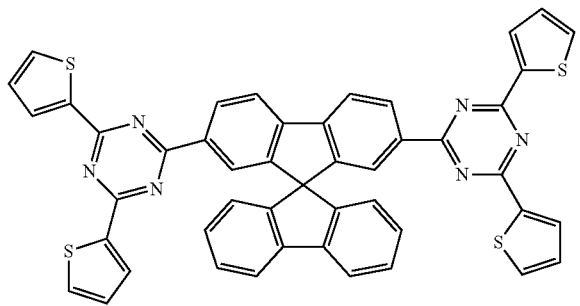
53
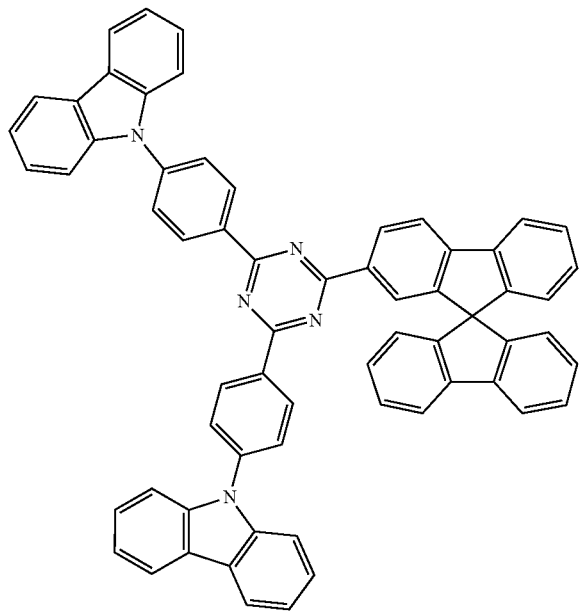
54
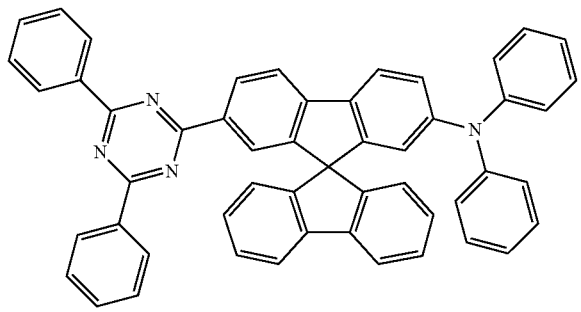
55
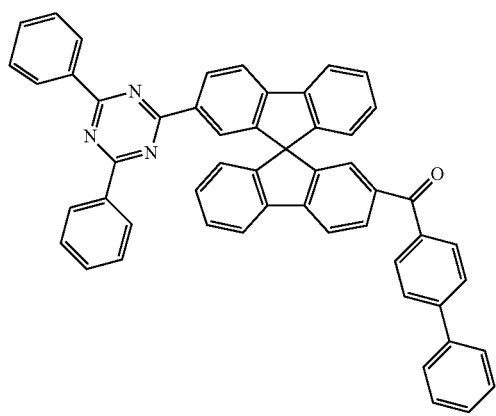
56
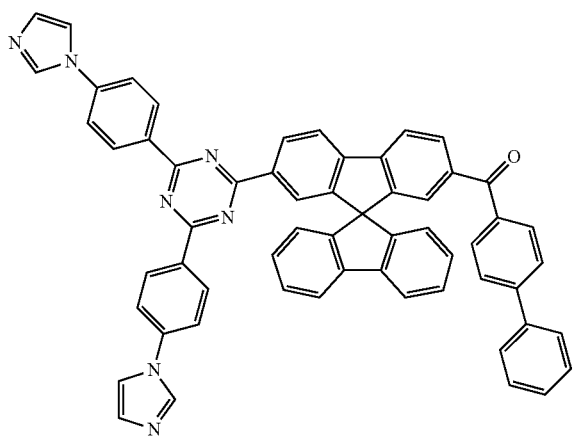

57
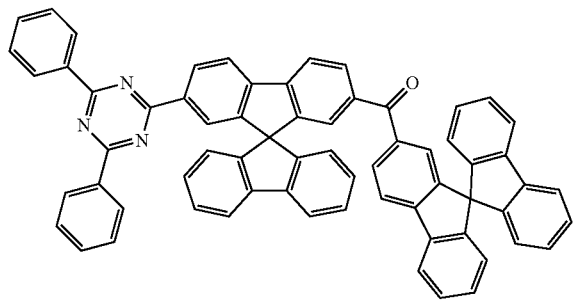
58
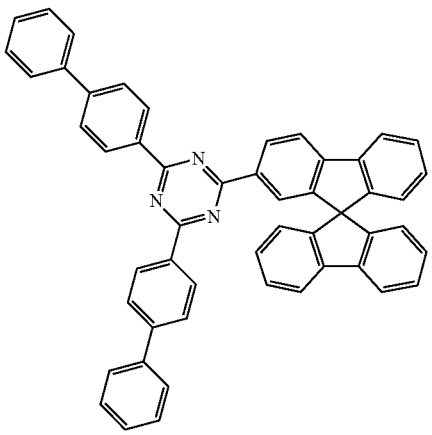
59
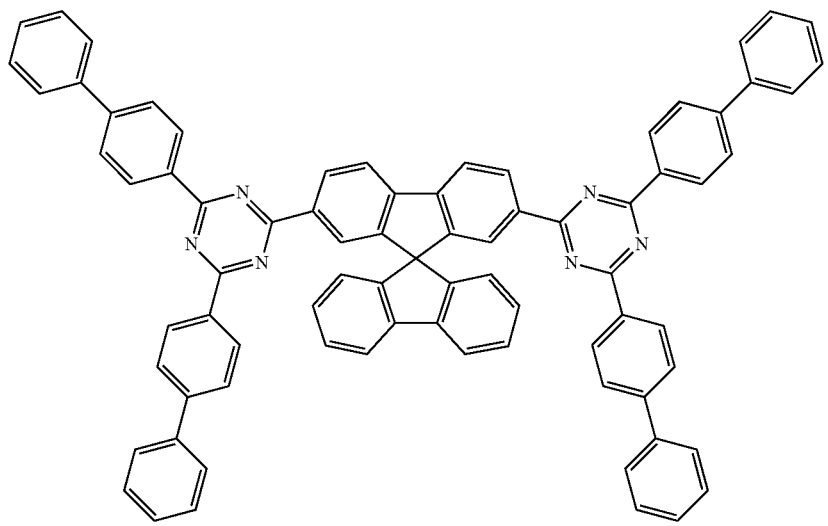
60
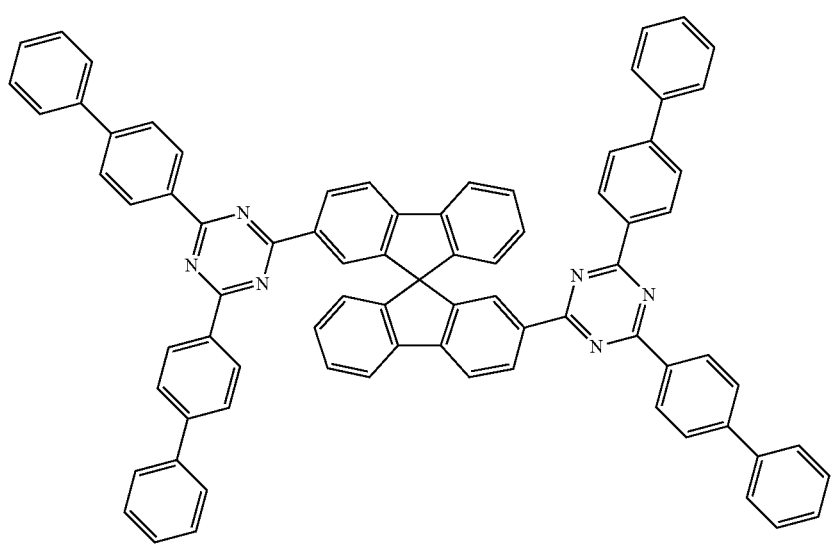

61
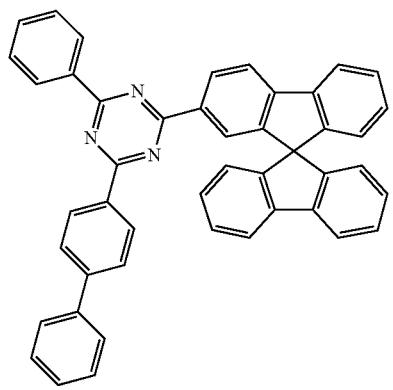
62
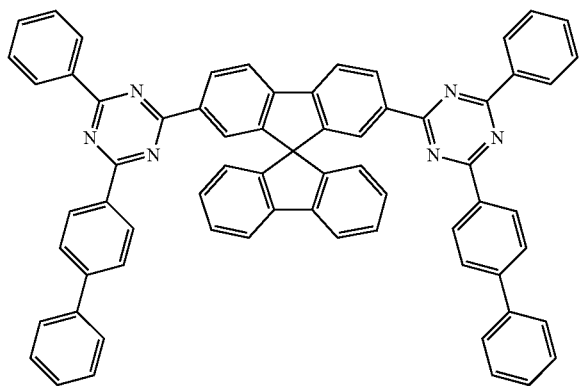
63
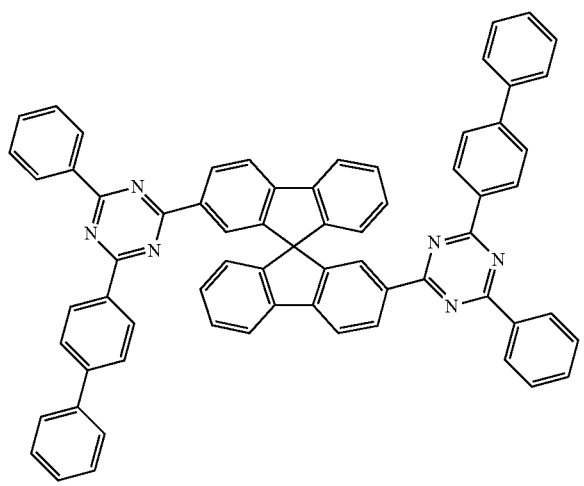
64
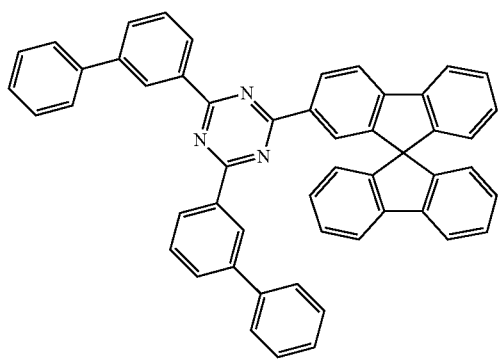
65
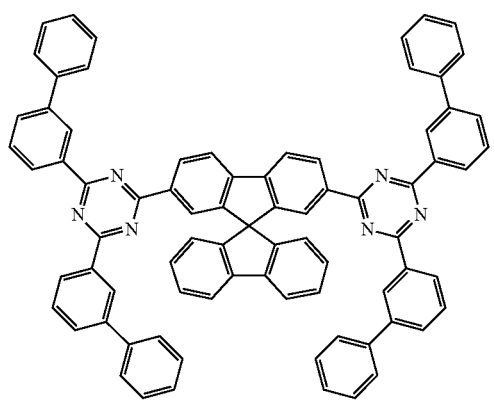
66
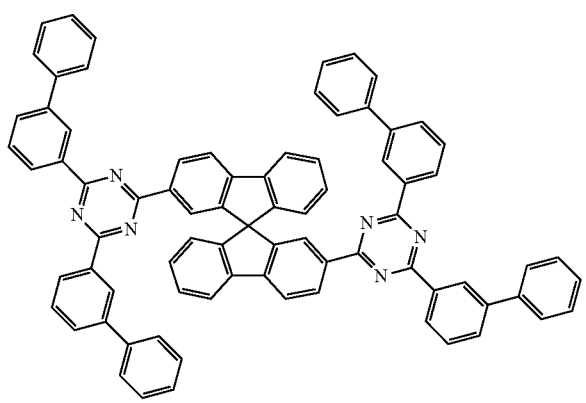

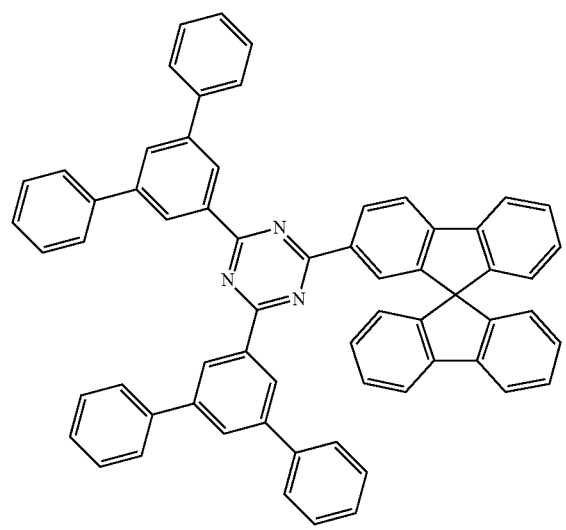
67
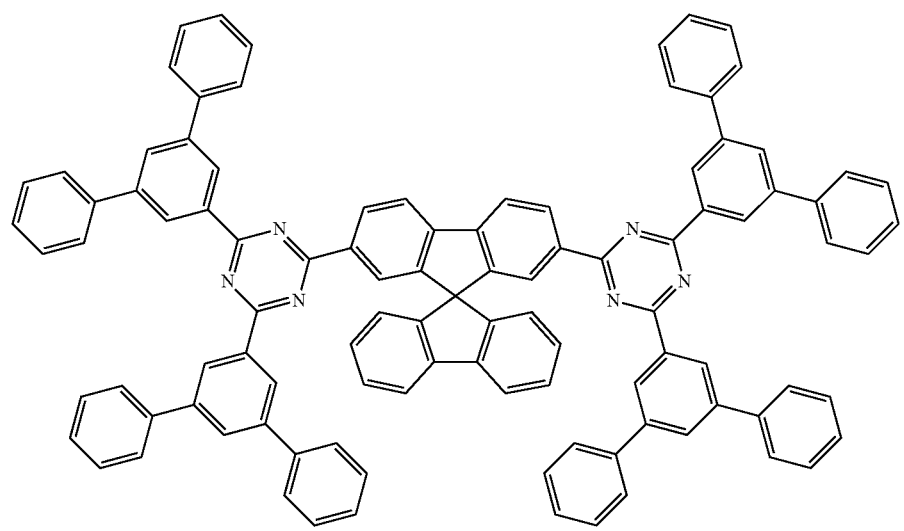
68
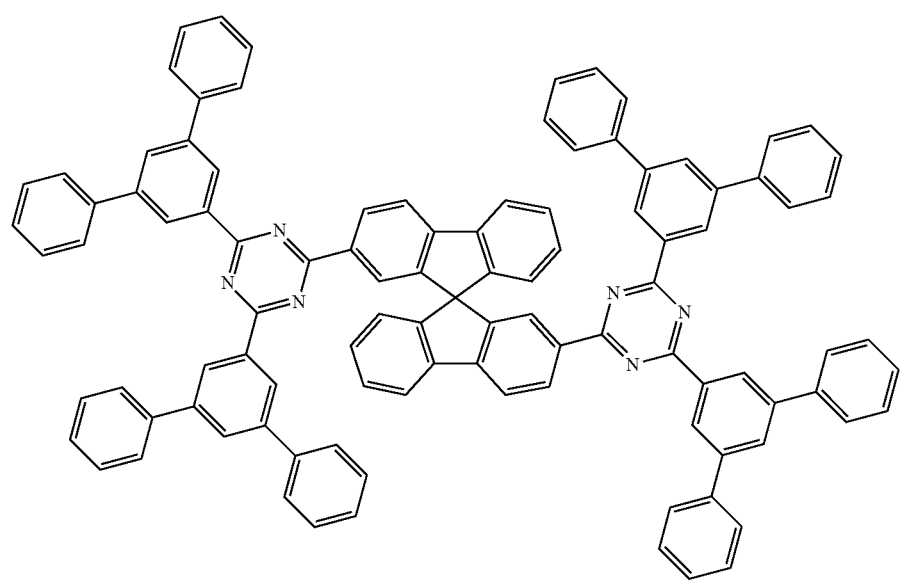
69

-continued
70 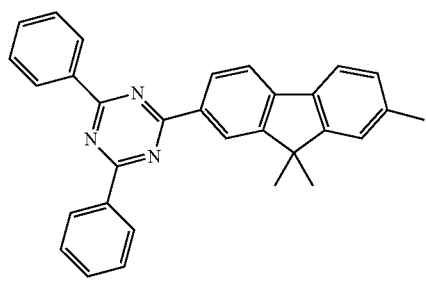
71 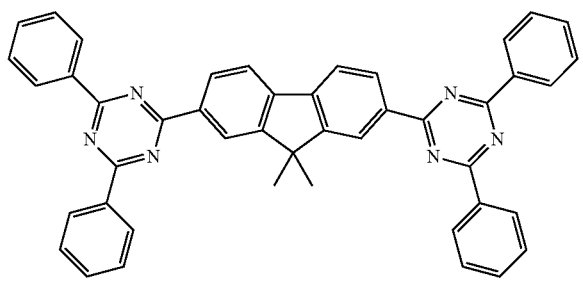
72 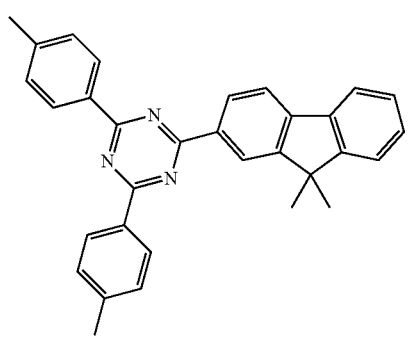
73 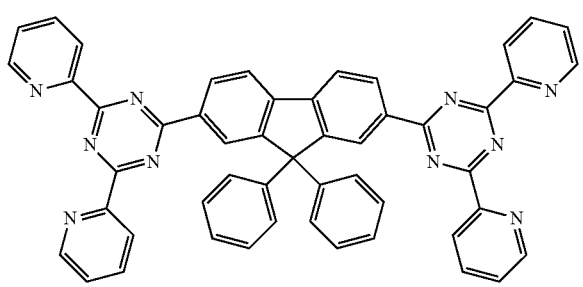
74 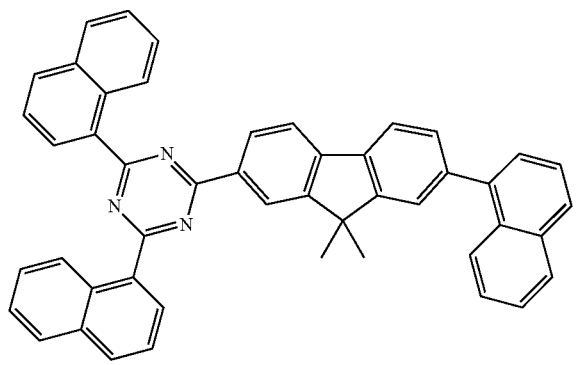
75 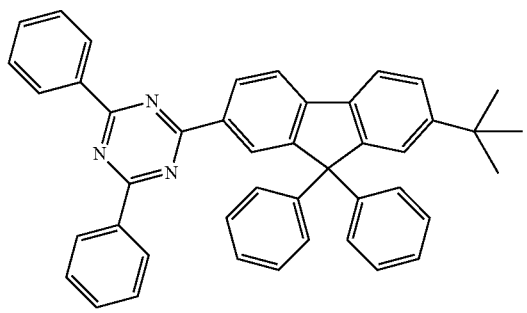
76 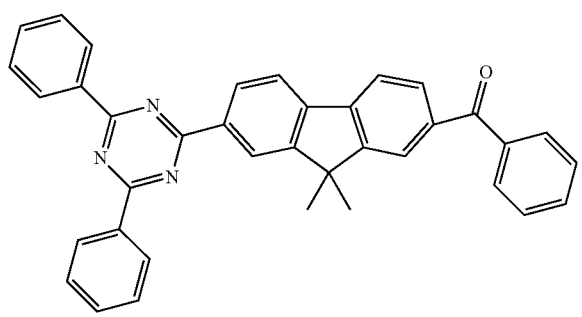
77 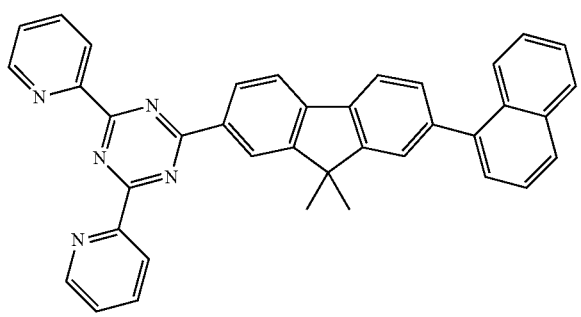

78
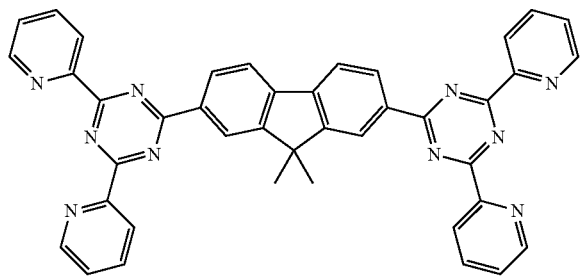
79
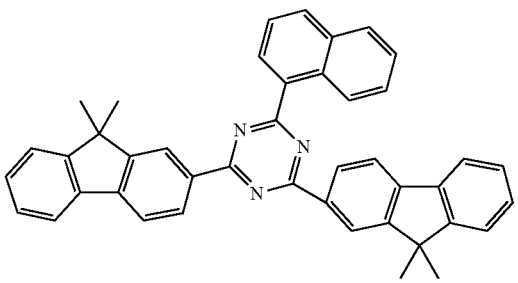
80
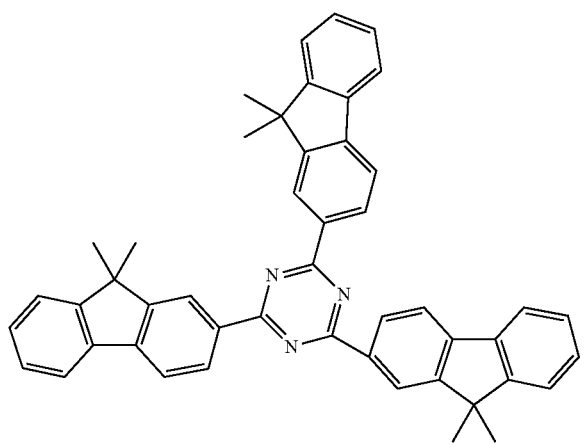
81
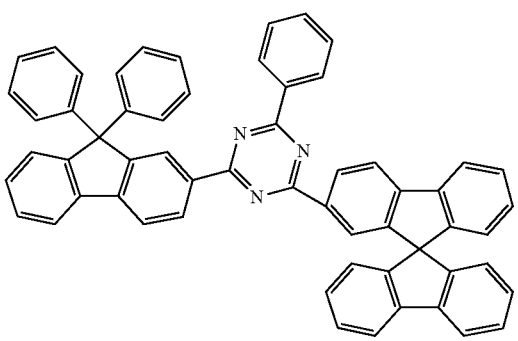
82
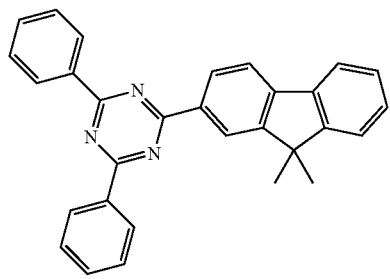
83
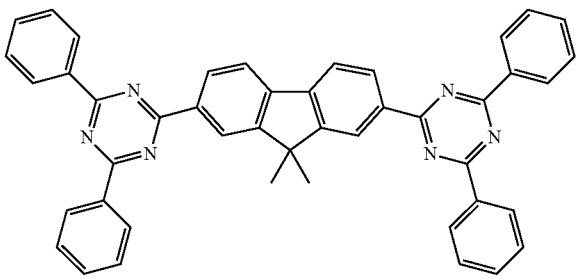
84
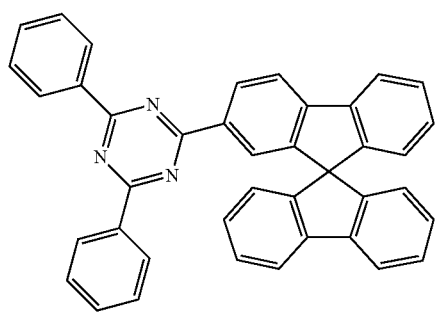
85
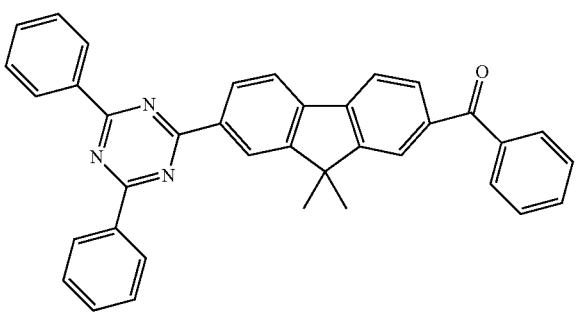

-continued
86 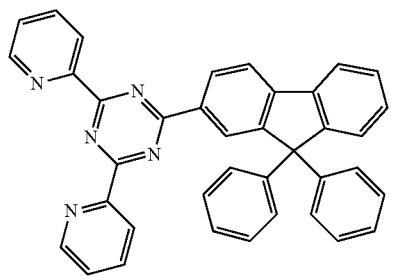
87 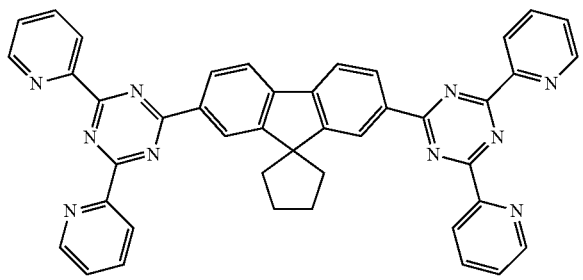
88 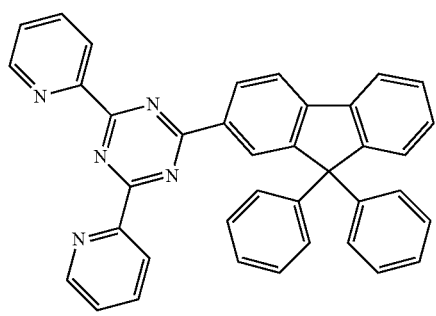
89 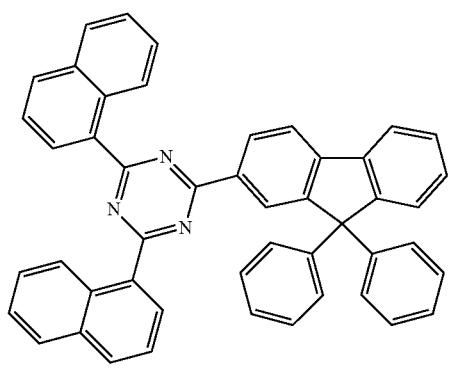
90 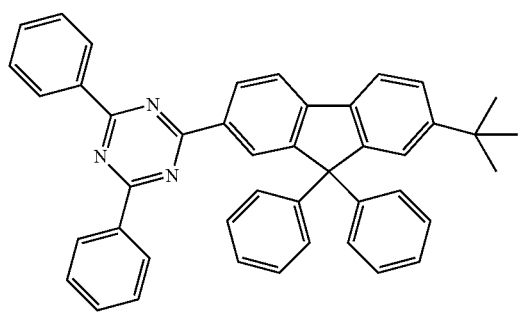
91 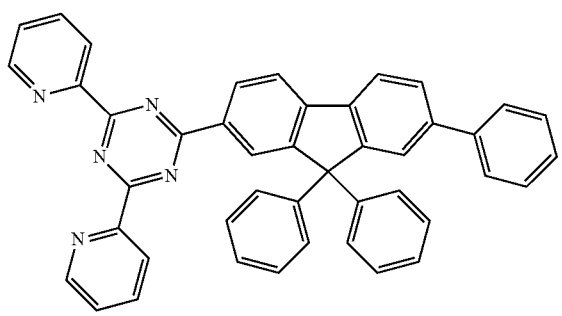
92 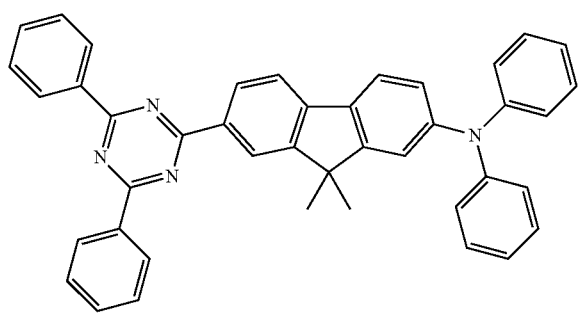
93 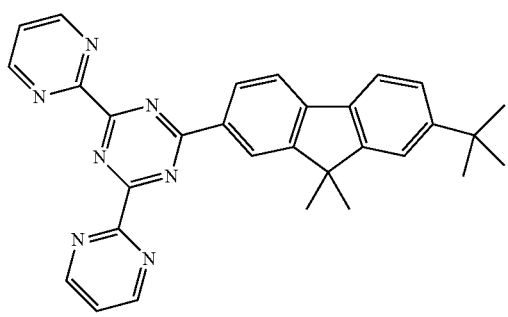

-continued
94
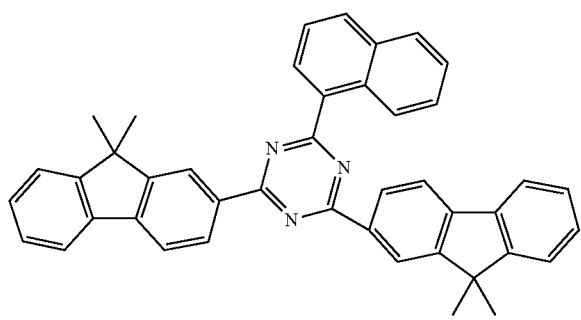
95
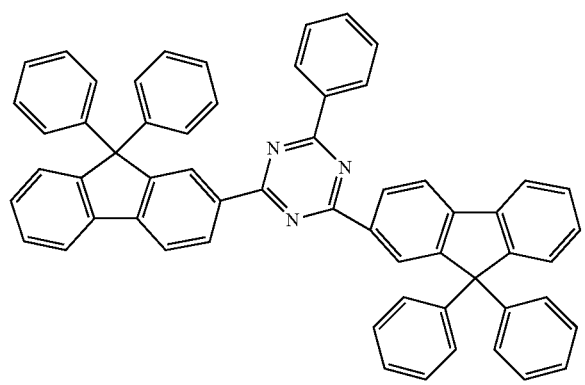
96
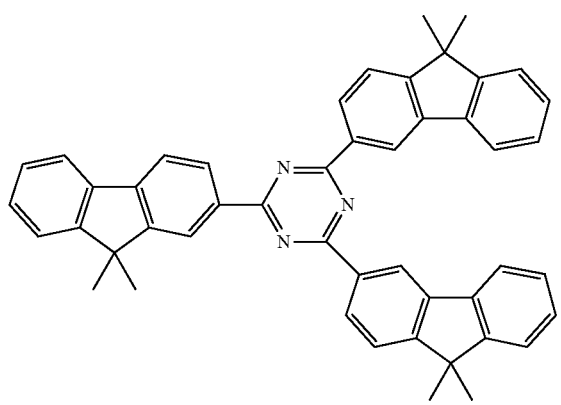
97
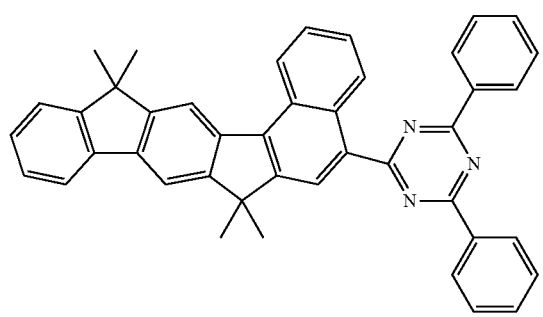
98
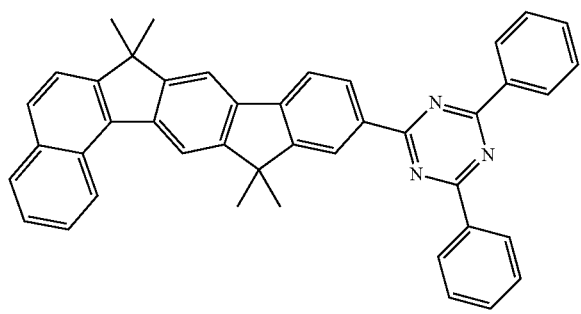
99
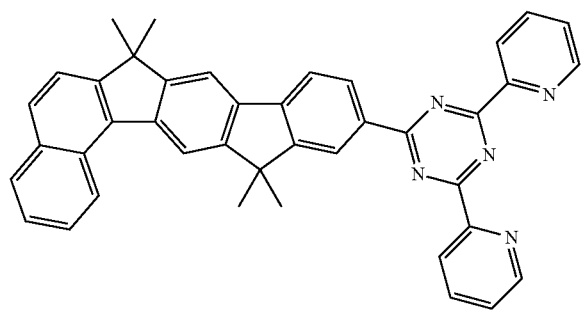
100
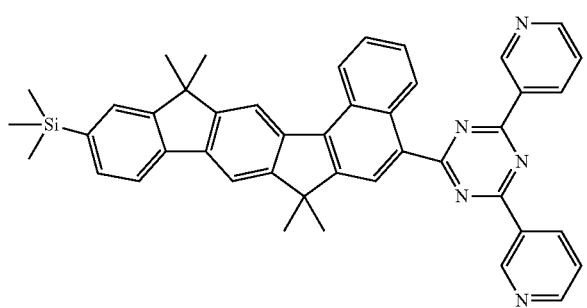
101
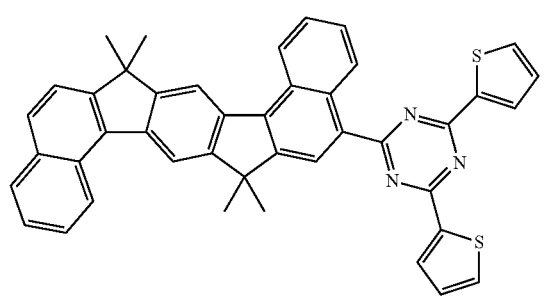

-continued
102
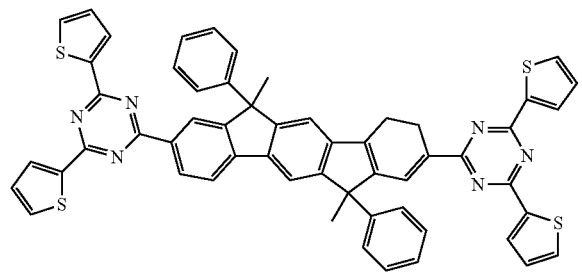
103
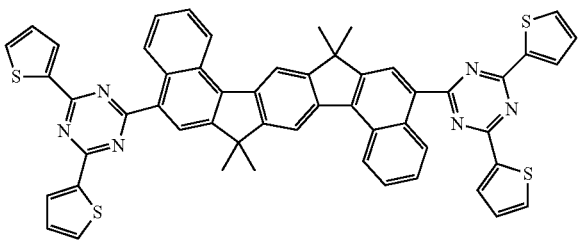
104
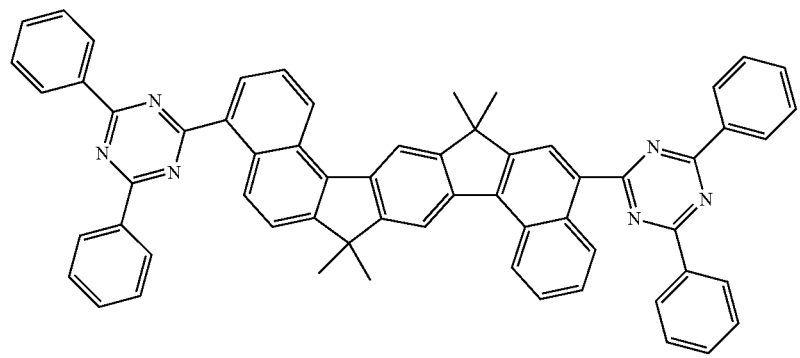
105
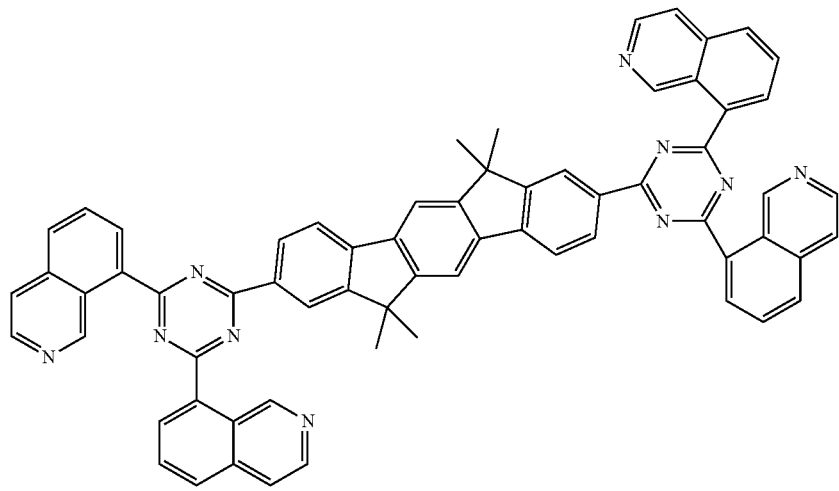
106
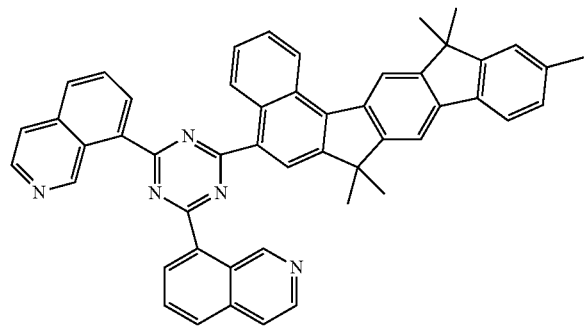
107
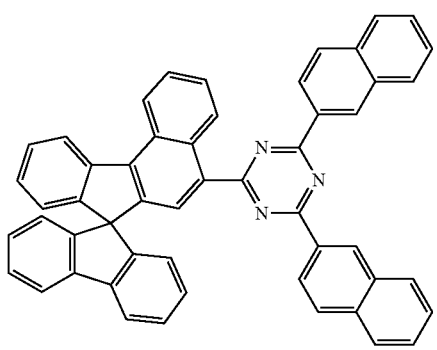

-continued
108 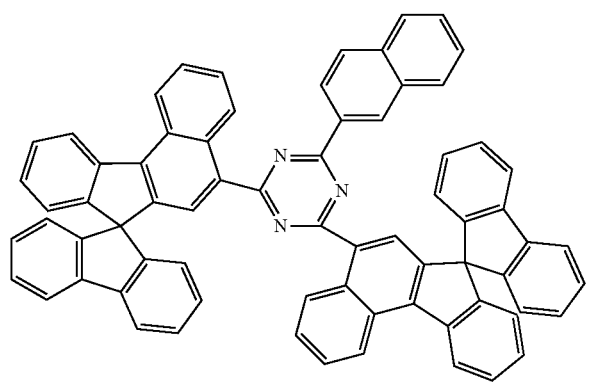
109 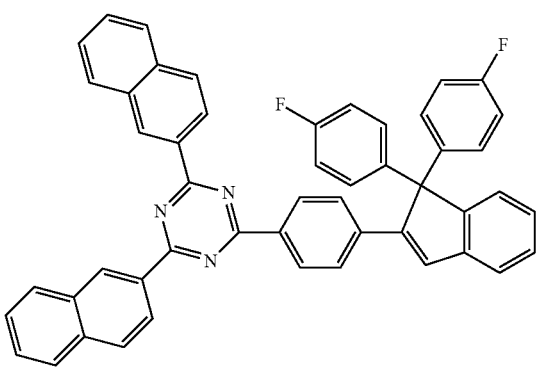
110 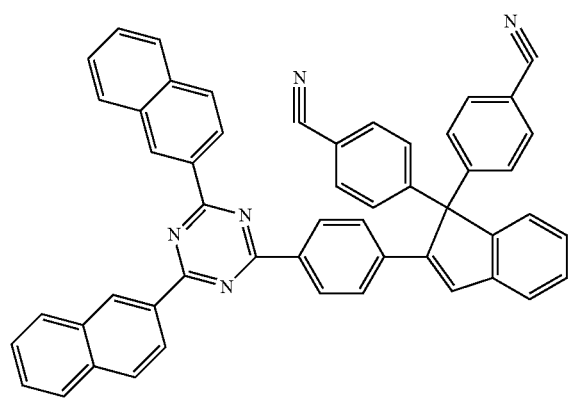
111 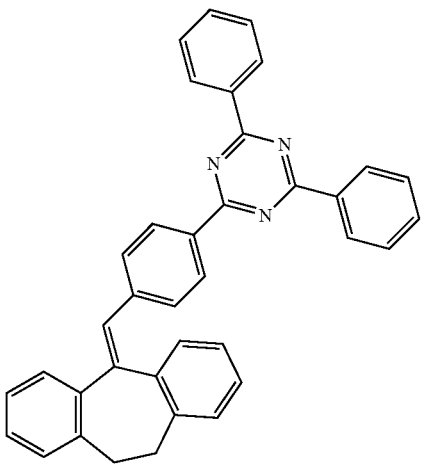
112 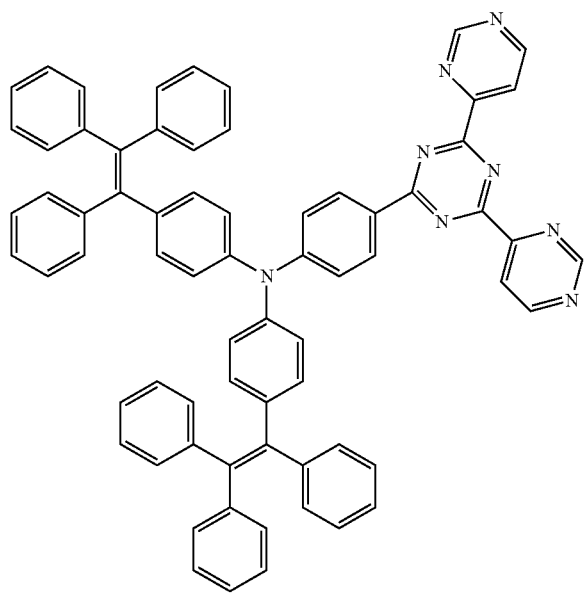

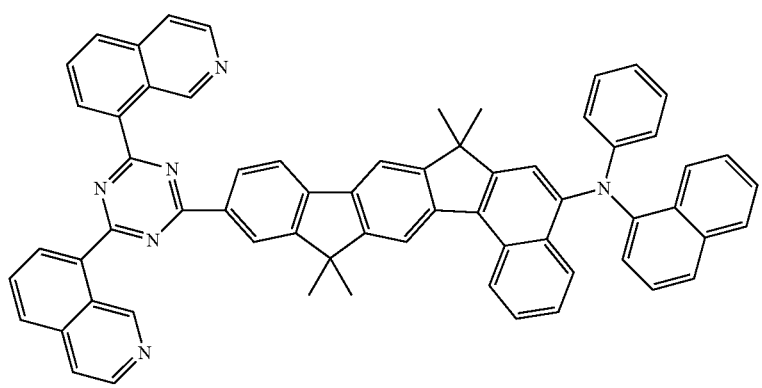
113
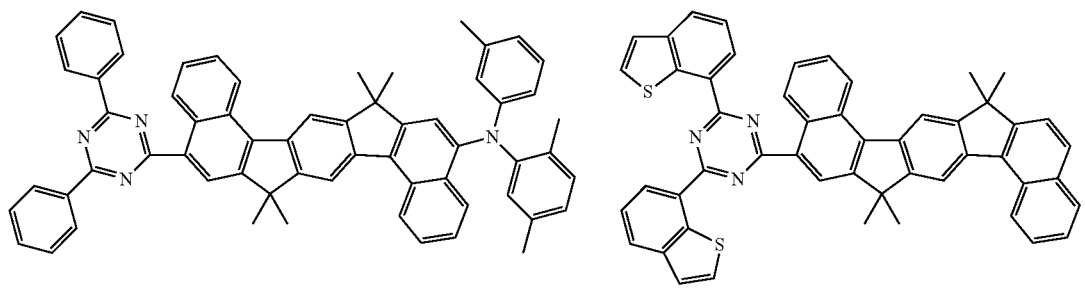
114 115
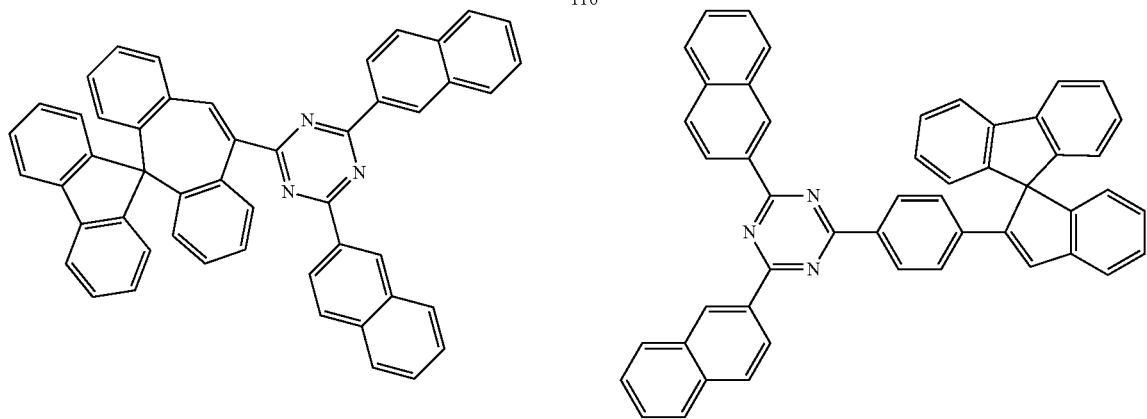
116 117

-continued
118
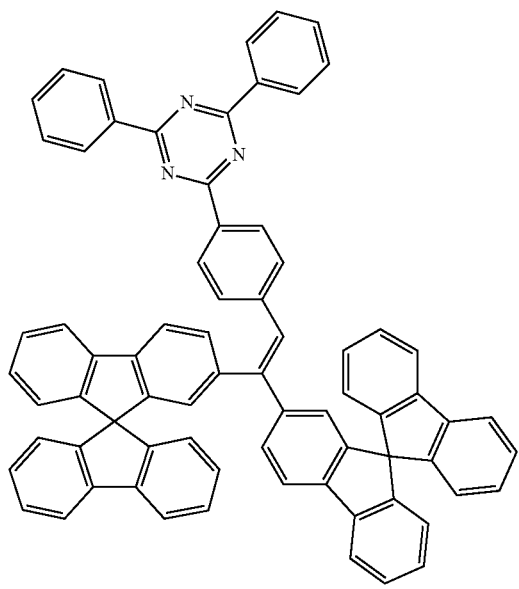
119
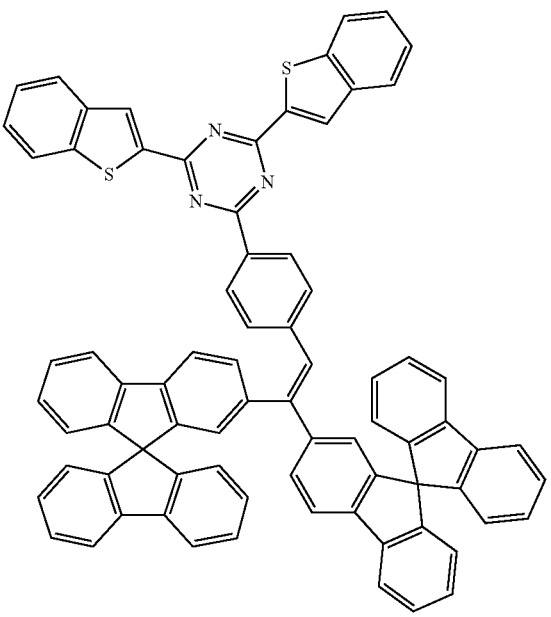
120
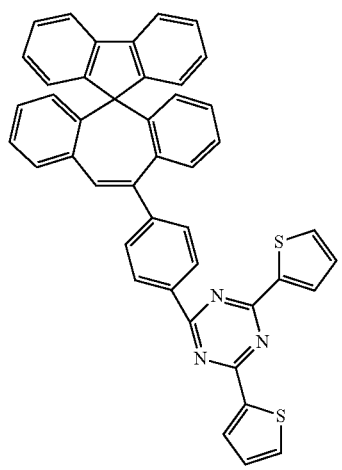
121
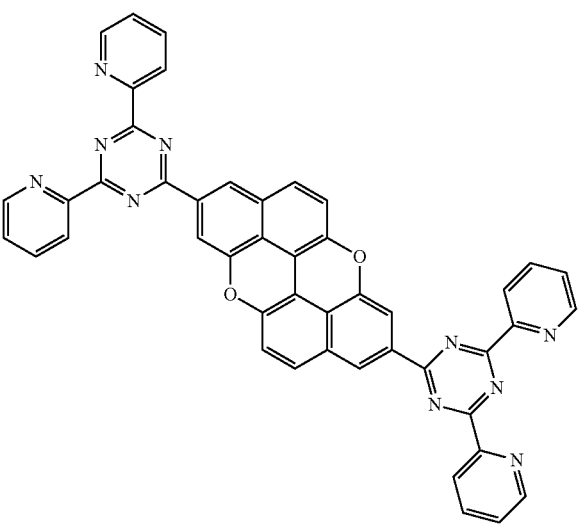
122
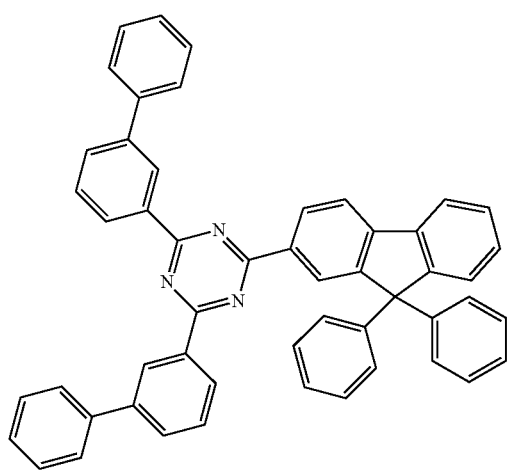

-continued
123
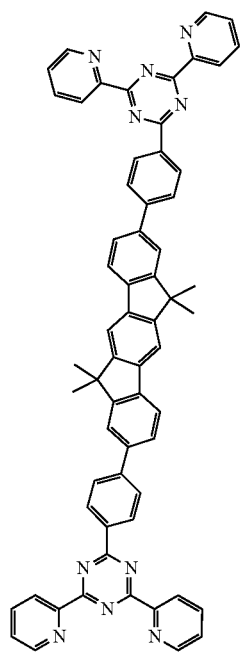
124
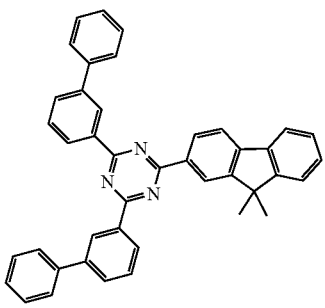
125
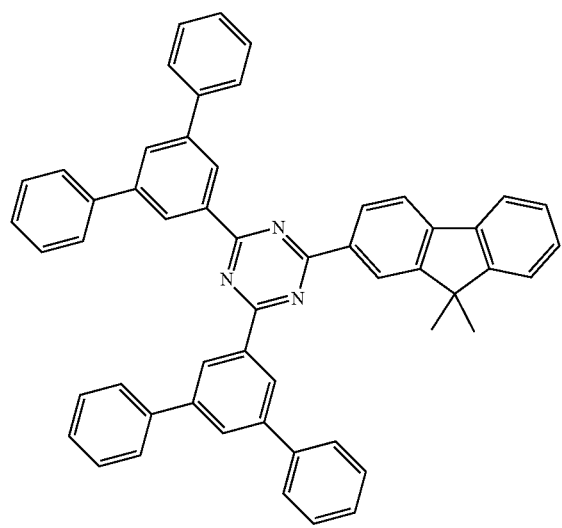
126
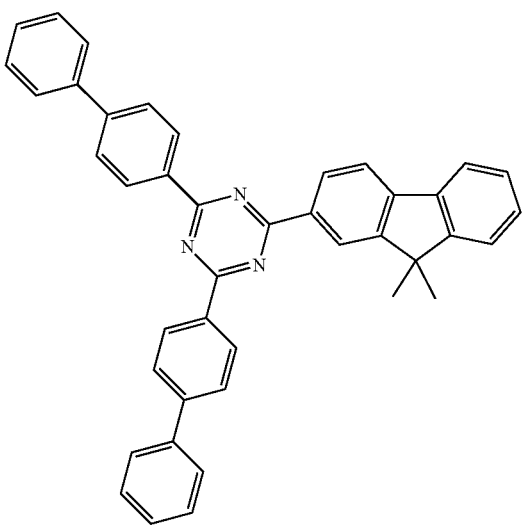

-continued
127
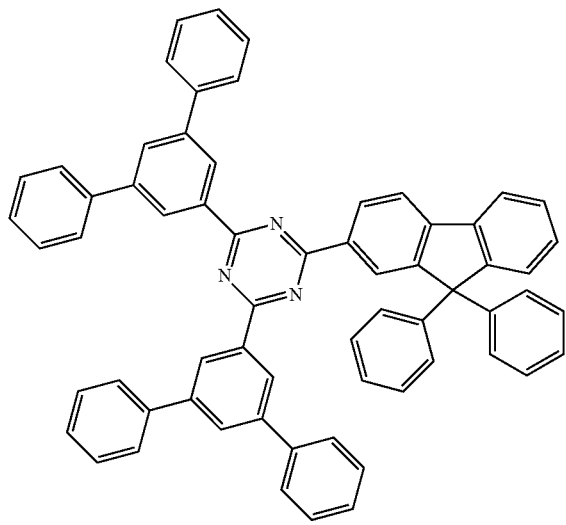
128
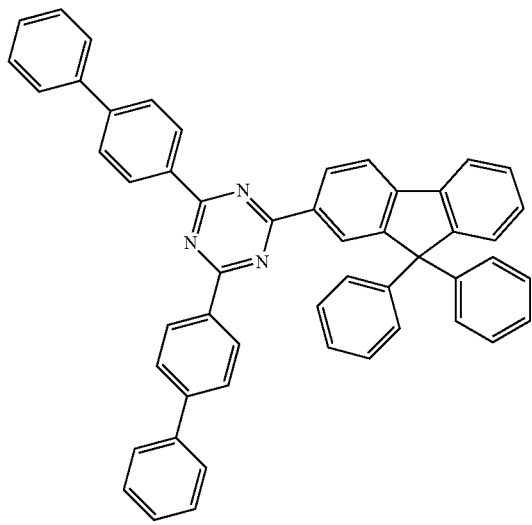
129
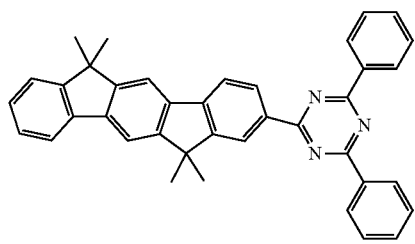
130
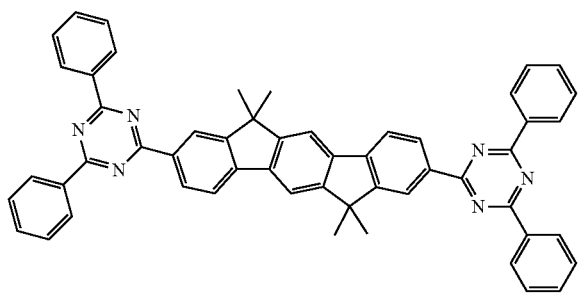
131
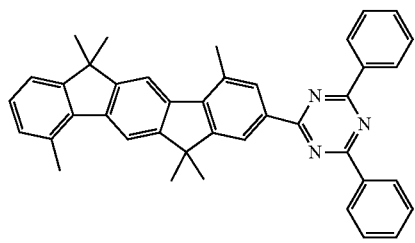
132
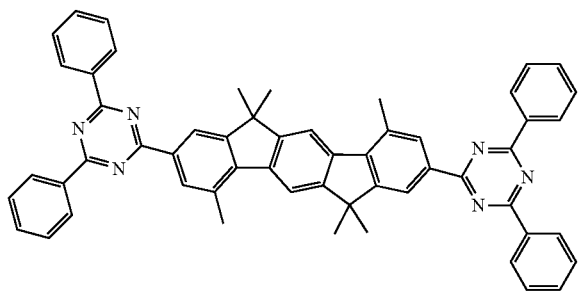
133
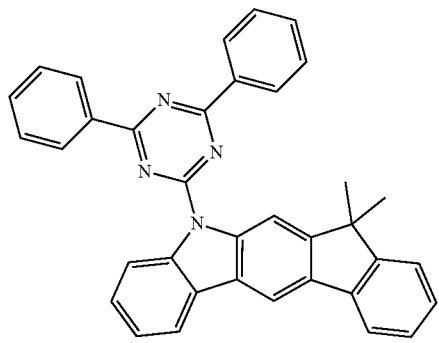
134
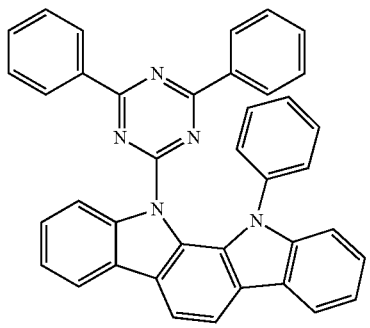

-continued
135
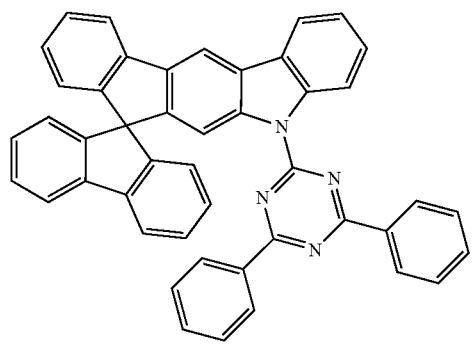
136
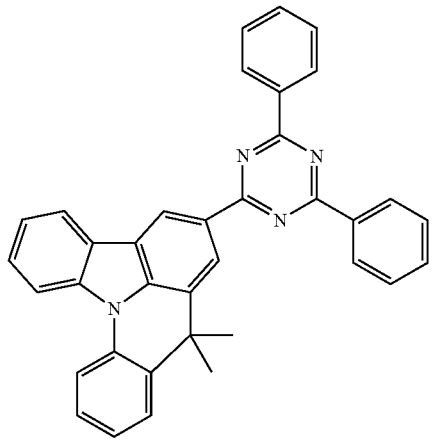
137
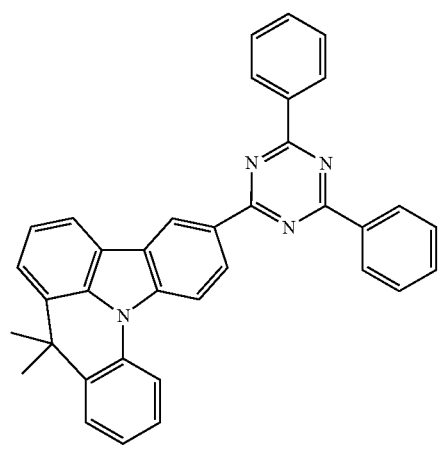
138
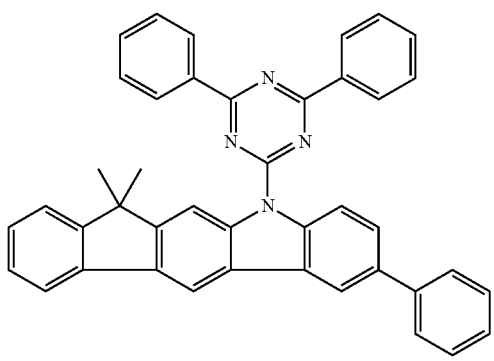
139
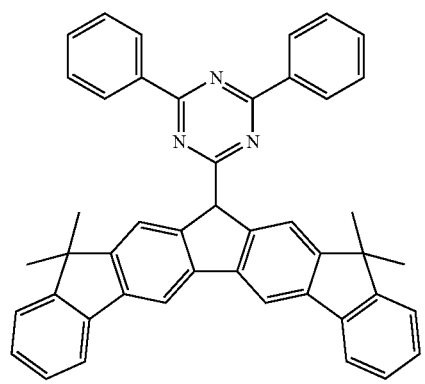
140
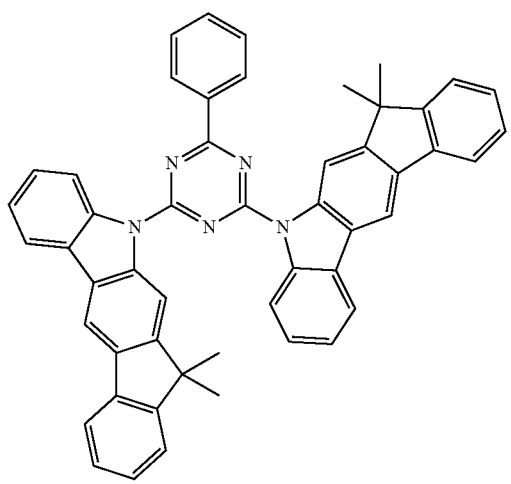

-continued
141
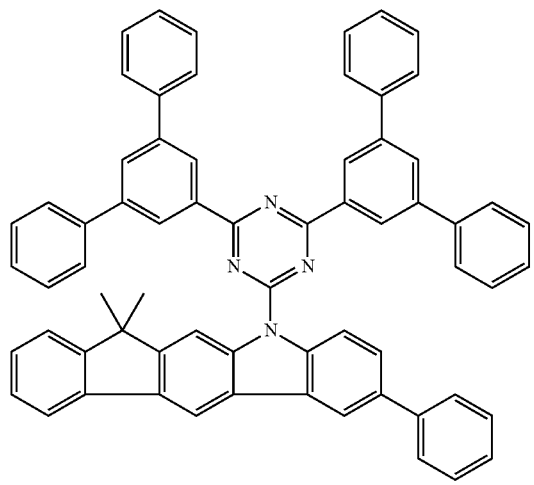
142
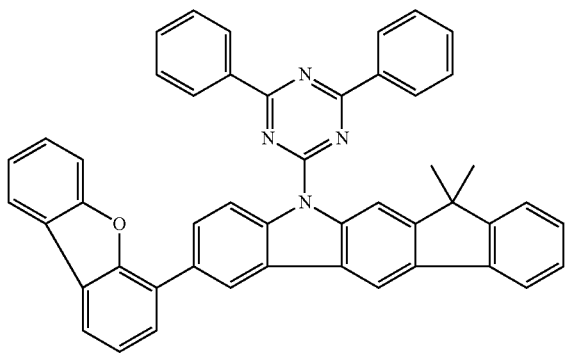
143
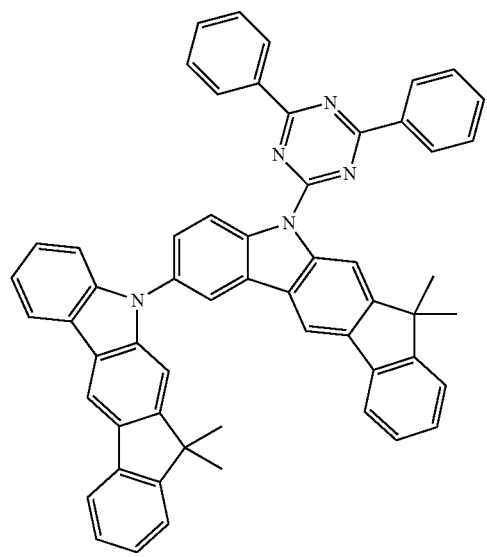
144
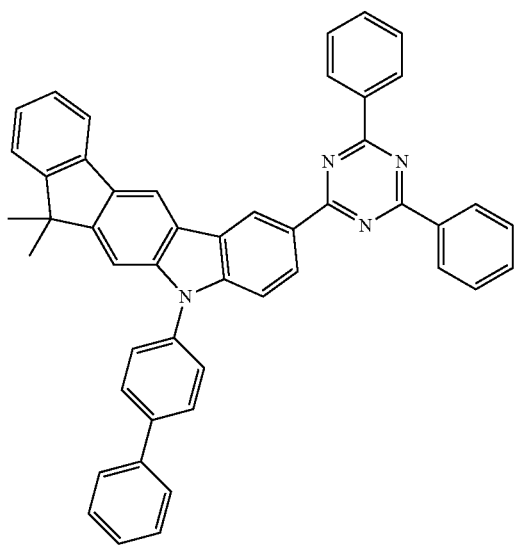
145
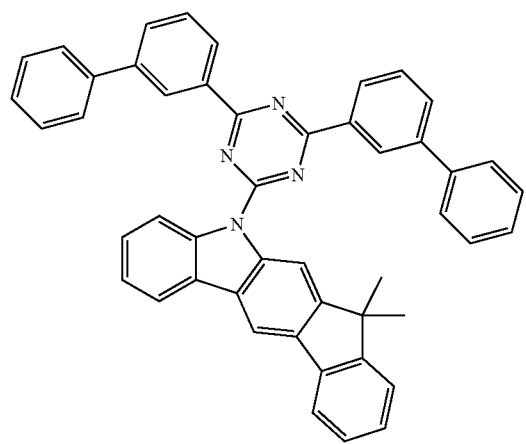
146
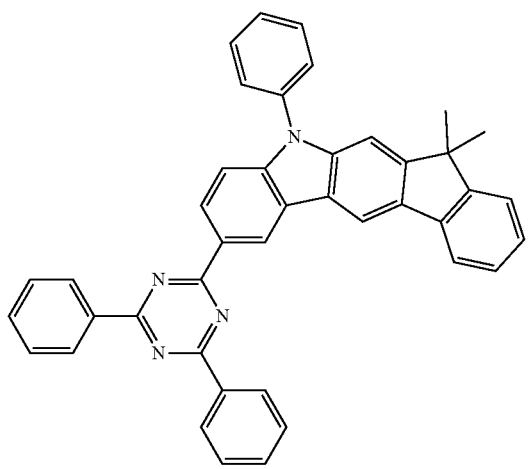

147

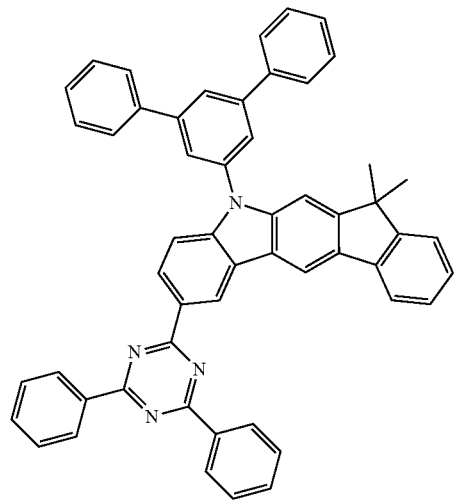

148

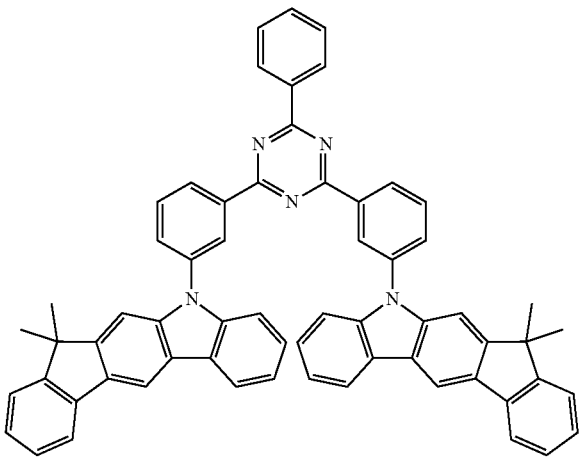

149

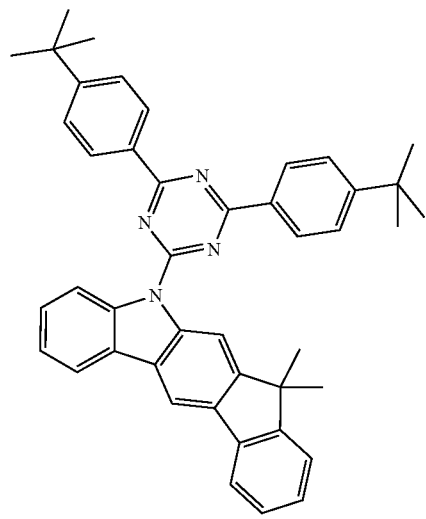

150

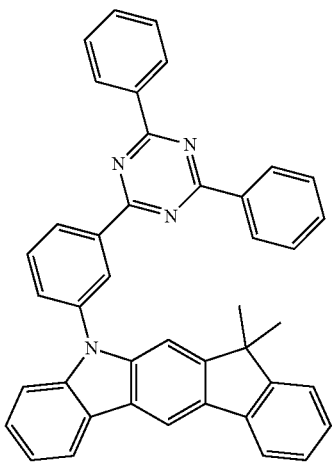

Derivatives of the above-mentioned compounds which contain a pyrazine group instead of the triazine group, where these groups may likewise be substituted, are likewise suitable.

In a further preferred embodiment of the invention, the electron-conducting matrix material is an aromatic ketone.

An aromatic ketone in the sense of this application is taken to mean a carbonyl group to which two aryl or heteroaryl groups or aromatic or heteroaromatic ring systems are bonded directly.

In a preferred embodiment of the invention, the aromatic ketone is a compound of the following formula (21),

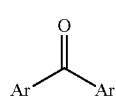

formula (21)

where $R^1$ has the above-mentioned meaning, and Ar represents on each occurrence, identically or differently, an aromatic or heteroaromatic ring system having 5 to 60 aromatic ring atoms, which may in each case be substituted by one or more groups $R^1$.

Suitable compounds of the formula (21) are, in particular, the ketones disclosed in WO 2004/093207 and WO 2010/006680. These are incorporated into the present invention by way of reference.

It is evident from the definition of the compound of the formula (21) that it does not have to contain just one carbonyl group, but instead may also contain a plurality of carbonyl groups.

The group Ar in compounds of the formula (21) is preferably an aromatic ring system having 6 to 40 aromatic ring atoms, i.e. it does not contain any heteroaryl groups. As defined above, the aromatic ring system does not necessarily have to contain only aromatic groups, but instead two aryl groups may also be interrupted by a non-aromatic group, for example by a further carbonyl group.

In a further preferred embodiment of the invention, the group Ar contains not more than two condensed rings. It is thus preferably built up only from phenyl and/or naphthyl groups, particularly preferably only from phenyl groups, but does not contain any larger condensed aromatic groups, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tertbutylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3, 3'-bipyridyl), 2- or 3-(4,4'-bipyridyl), and combinations of one or more of these radicals.

The groups Ar may be substituted by one or more radicals $R^1$. These radicals $R^1$ are preferably selected, identically or differently on each occurrence, from the group consisting of H, D, F, C(=O)Ar$^3$, P(=O)(Ar$^3$)$_2$, S(=O)Ar$^3$, S(=O)$_2$Ar$^3$, a straight-chain alkyl group having 1 to 4 C atoms or a branched or cyclic alkyl group having 3 to 5 C atoms, each of which may be substituted by one or more radicals $R^2$, where one or more H atoms may be replaced by D or F, or an aromatic ring system having 6 to 24 aromatic ring atoms, which may be substituted by one or more radicals $R^2$, or a combination of these systems; two or more adjacent substituents $R^1$ here may also form a mono- or polycyclic, aliphatic or aromatic ring system with one another. If the organic electroluminescent device is applied from solution, straight-chain, branched or cyclic alkyl groups having up to 10 C atoms are also preferred as substituents $R^1$. The radicals $R^1$ are particularly preferably selected, identically or differently on each occurrence, from the group consisting of H, C(=O) Ar$^3$ or an aromatic ring system having 6 to 24 aromatic ring atoms, which may be substituted by one or more radicals $R^2$, but is preferably unsubstituted.

In a further preferred embodiment of the invention, the group Ar$^3$ is, identically or differently on each occurrence, an aromatic ring system having 6 to 24 aromatic ring atoms, which may be substituted by one or more radicals $R^2$. Ar$^3$ is particularly preferably, identically or differently on each occurrence, an aromatic ring system having 6 to 12 aromatic ring atoms.

Particular preference is given to benzophenone derivatives which are substituted in each of the 3,5,3',5'-positions by an aromatic or heteroaromatic ring system having 5 to 30 aromatic ring atoms, which may in turn be substituted by one or more radicals $R^1$ as defined above. Preference is furthermore given to ketones which are substituted by at least one spirobifluorene group.

Preferred aromatic ketones are therefore furthermore the compounds of the following formula (22) to (25),

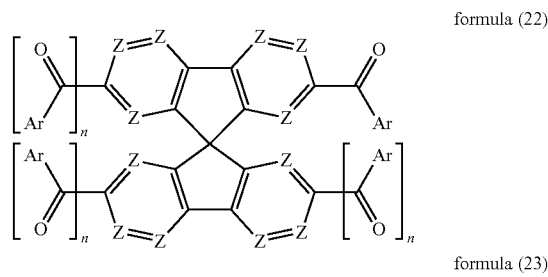

formula (22)

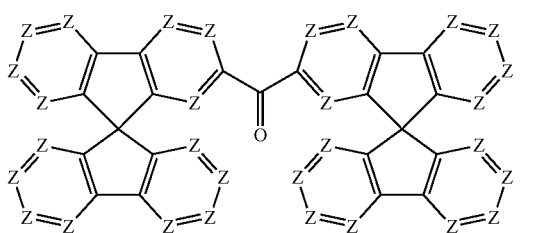

formula (23)

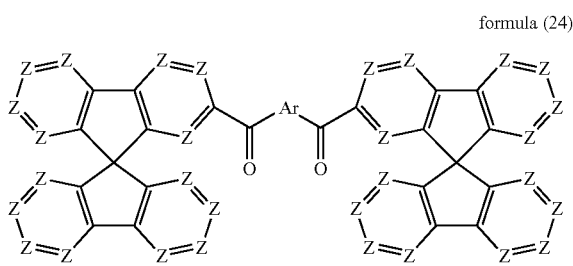

formula (24)

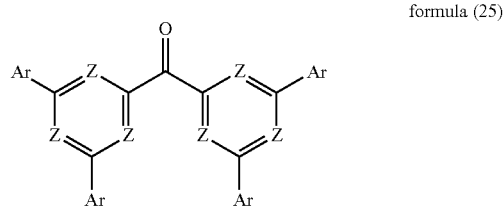

formula (25)

where Ar and $R^1$ have the same meaning as described above for formula (21), and furthermore:

Z is, identically or differently on each occurrence, CR$^1$ or N;

n is, identically or differently on each occurrence, 0 or 1.

Ar in the formulae (22), (24) and (25) preferably stands for an aromatic or heteroaromatic ring system having 5 to 30 aromatic ring atoms, which contains no condensed aryl groups having more than 10 aromatic ring atoms, preferably no condensed aryl groups at all, and which may be substituted by one or more radicals $R^1$. Particular preference is given to the groups Ar mentioned as preferred above. Particular preference is likewise given to the groups $R^1$ mentioned as preferred above.

Examples of suitable compounds of the formula (21) to (25) which can be employed as electron-conducting material in the interlayer are compounds (1) to (59) depicted below.

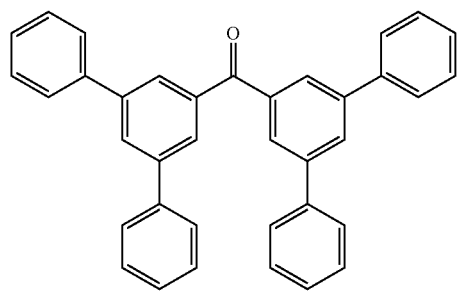
(1)
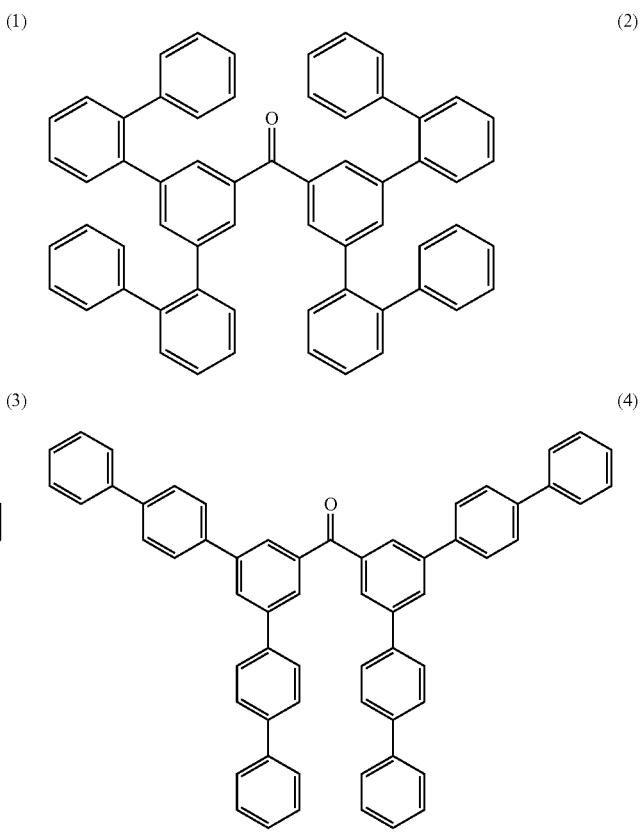
(2)
(3)
(4)
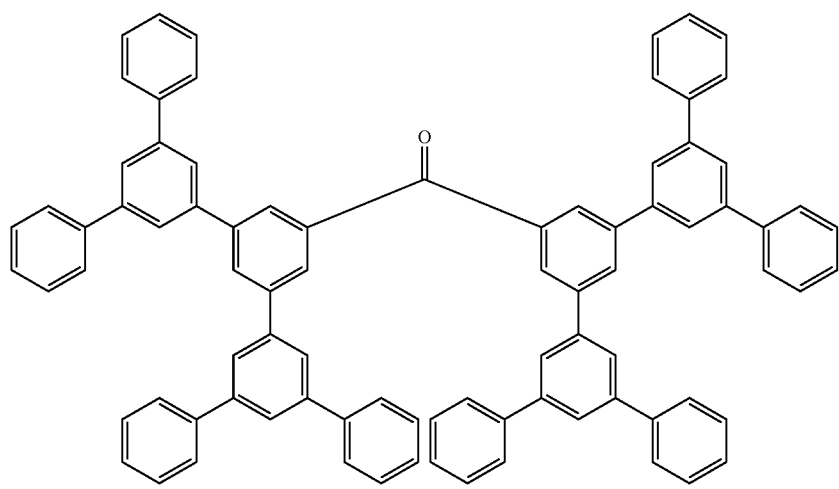
(5)
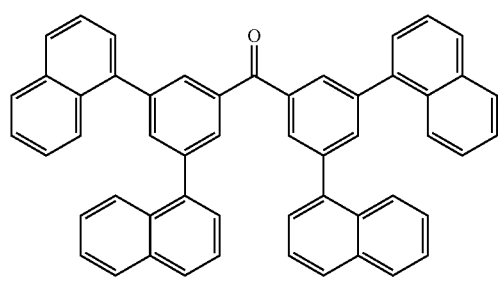
(6)
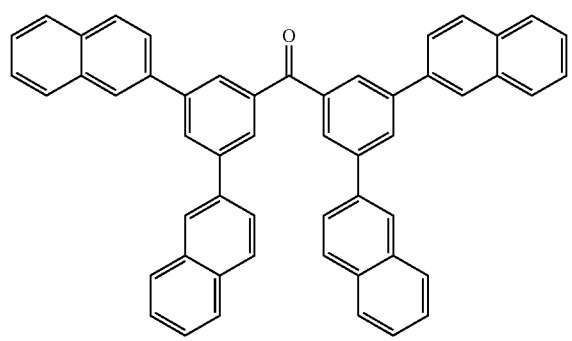
(7)

-continued
(8)
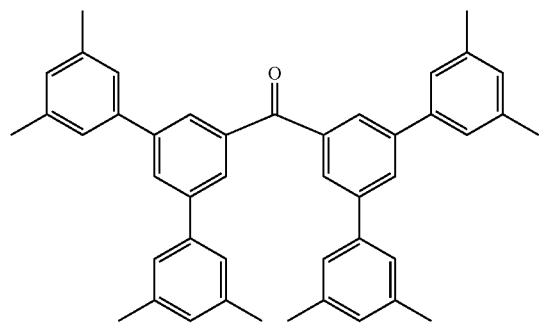
(9)
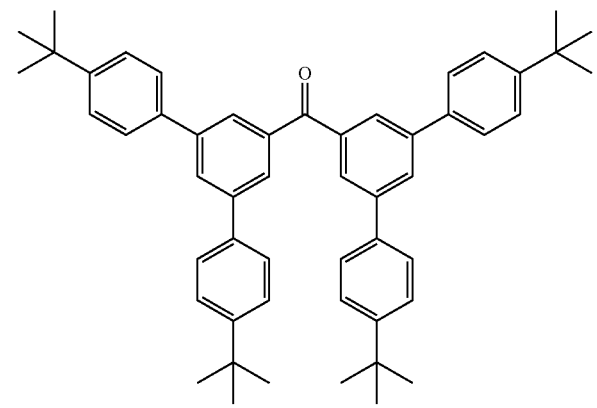
(10)
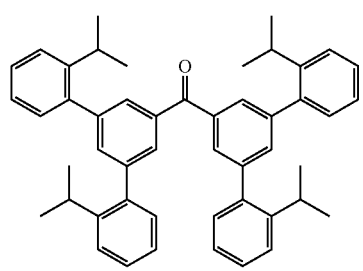
(11)
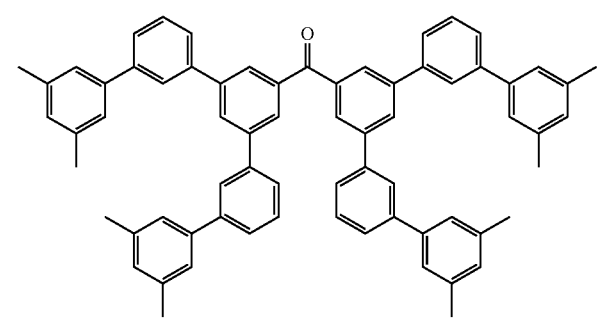
(12)
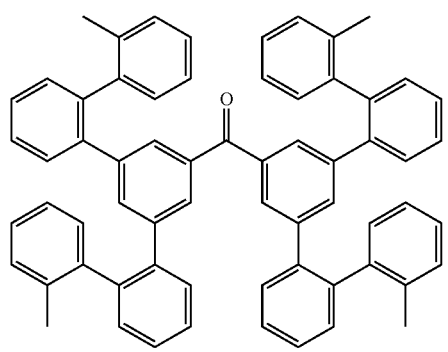
(13)
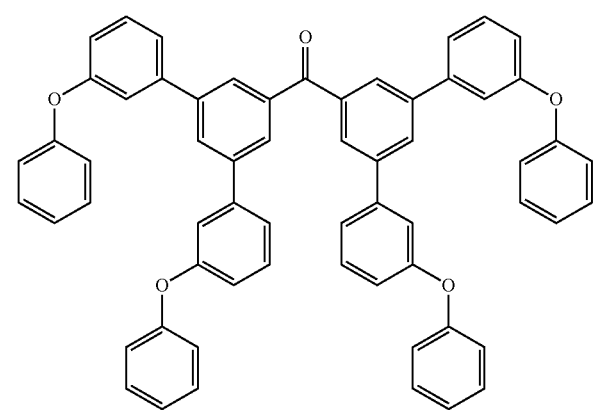
(14)
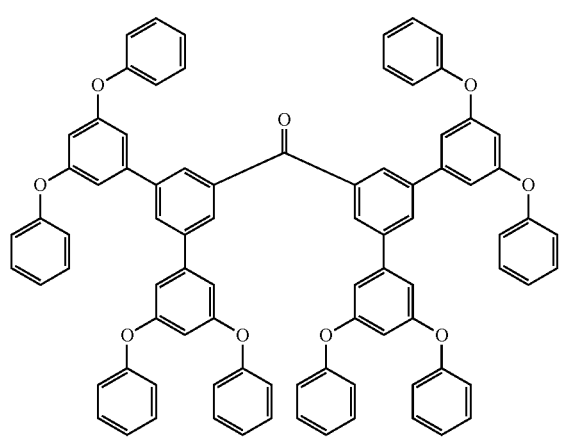
(15)
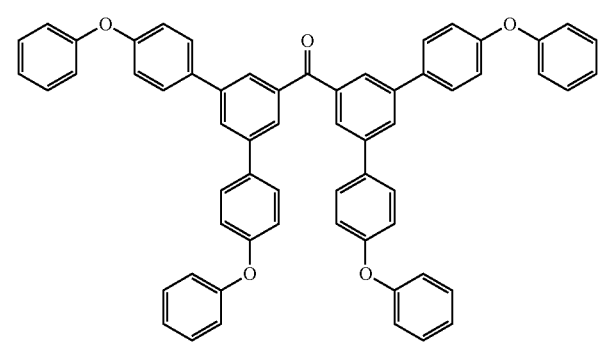

-continued
(16)
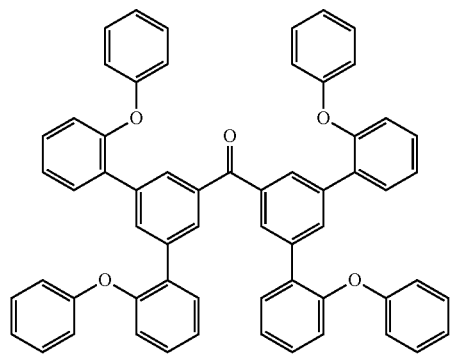
(17)
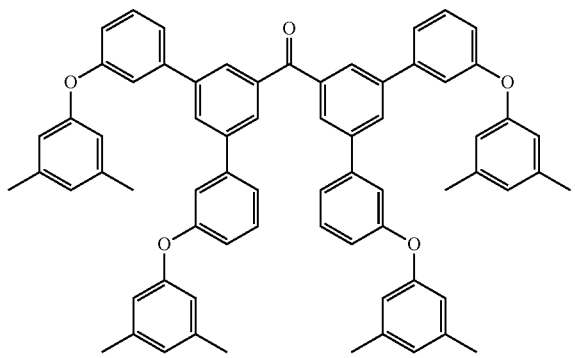
(18)
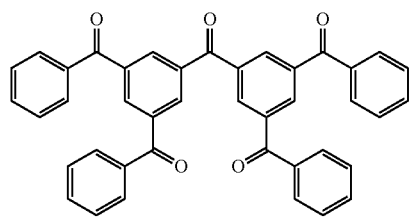
(19)
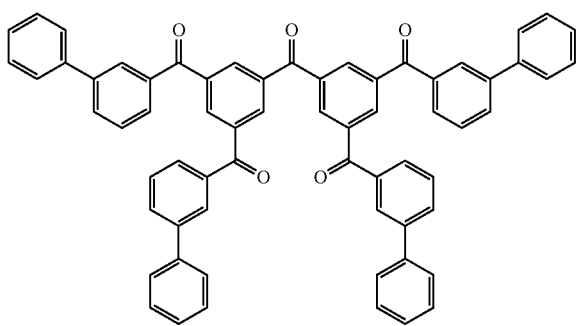
(20)
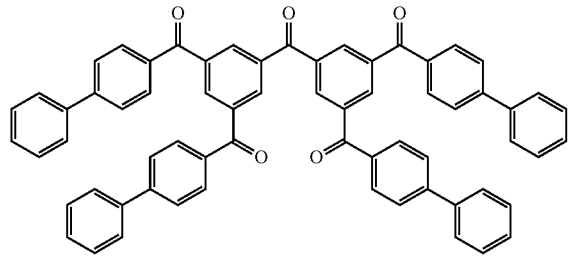
(21)
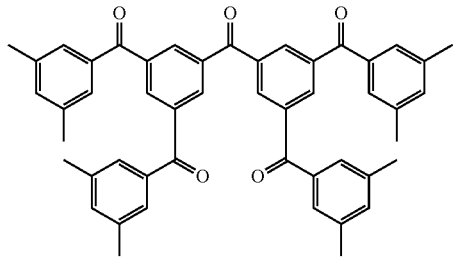
(22)
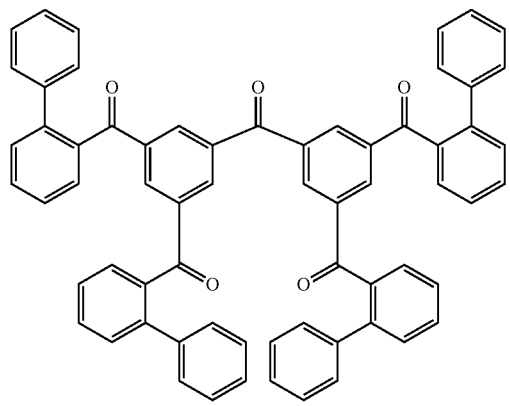
(23)
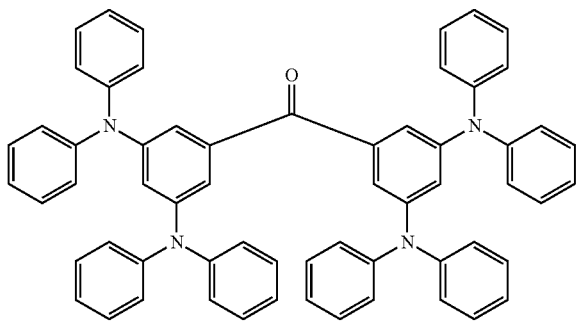

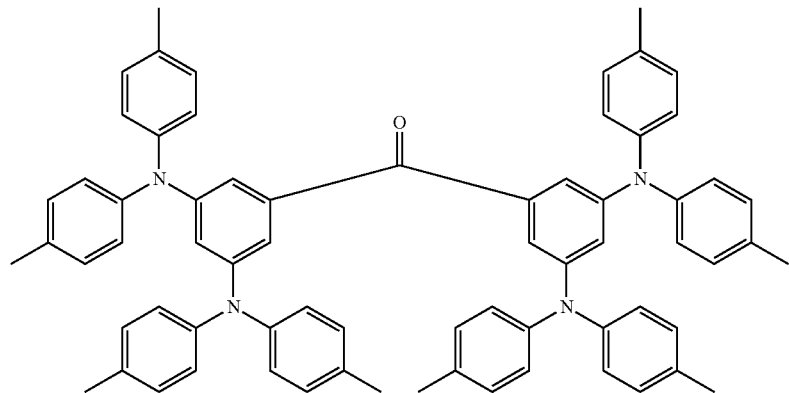
(24)
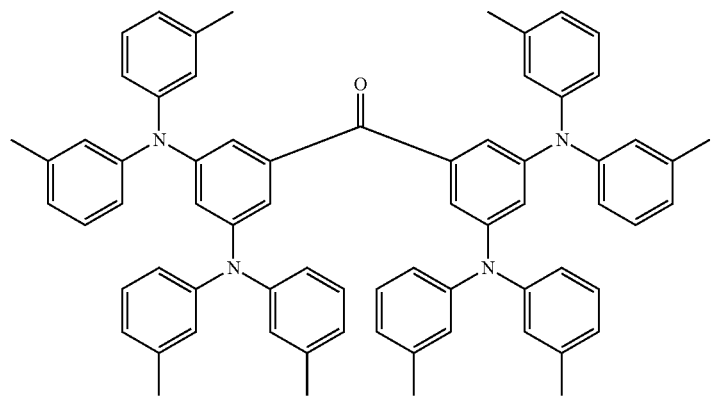
(25)
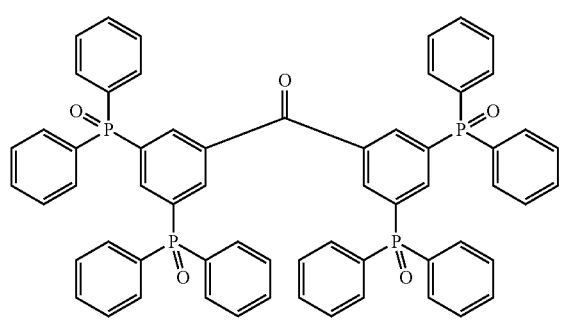
(26)
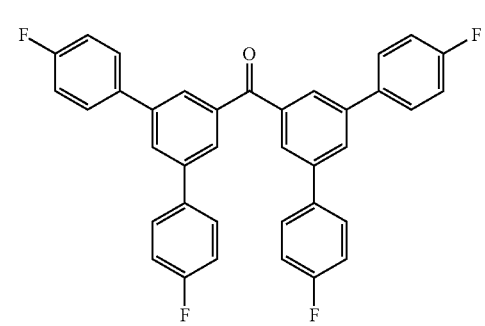
(27)
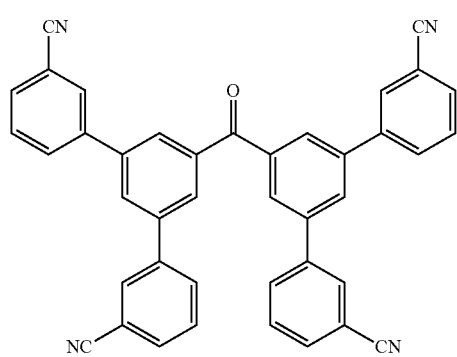
(28)
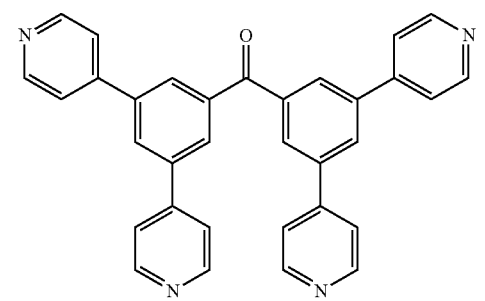
(29)

-continued
(30)
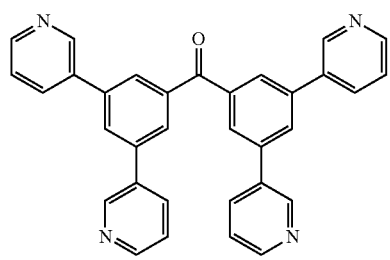
(31)
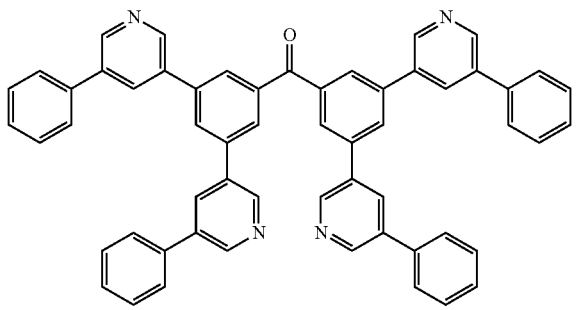
(32)
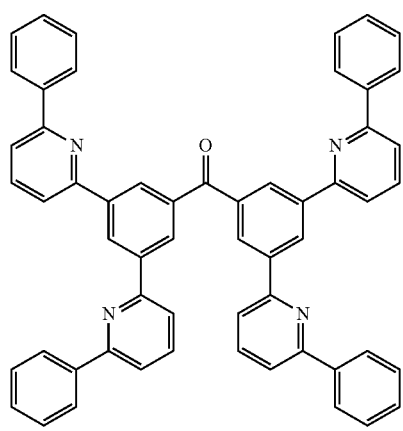
(33)
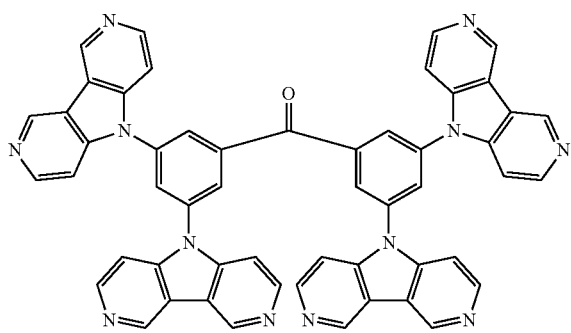
(34)
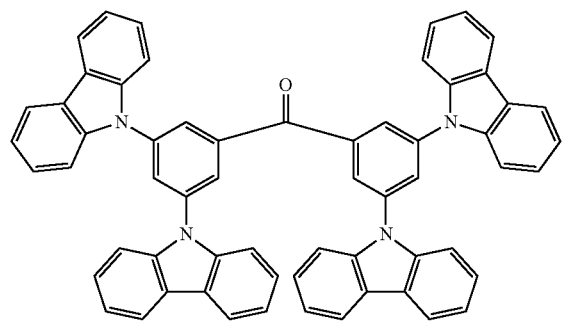
(35)
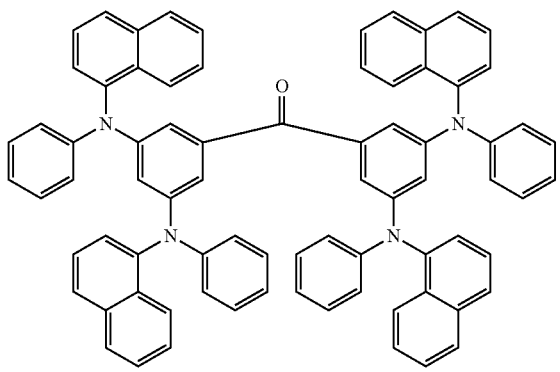
(36)
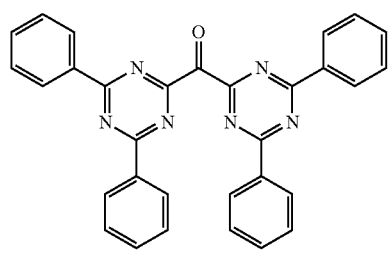
(37)
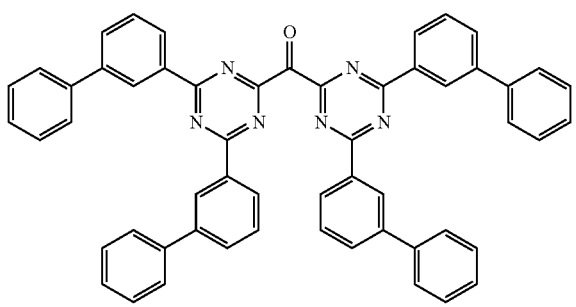

-continued
(38)
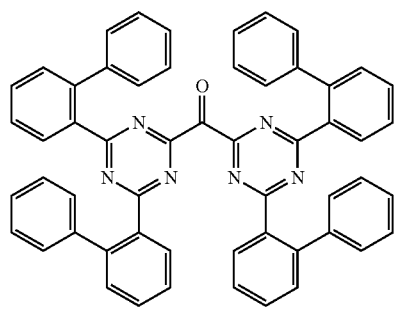
(39)
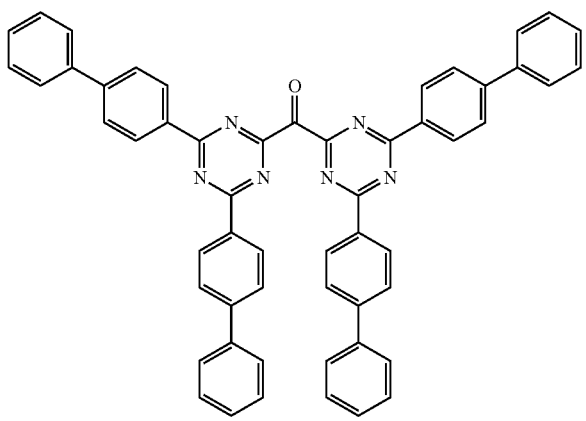
(40)
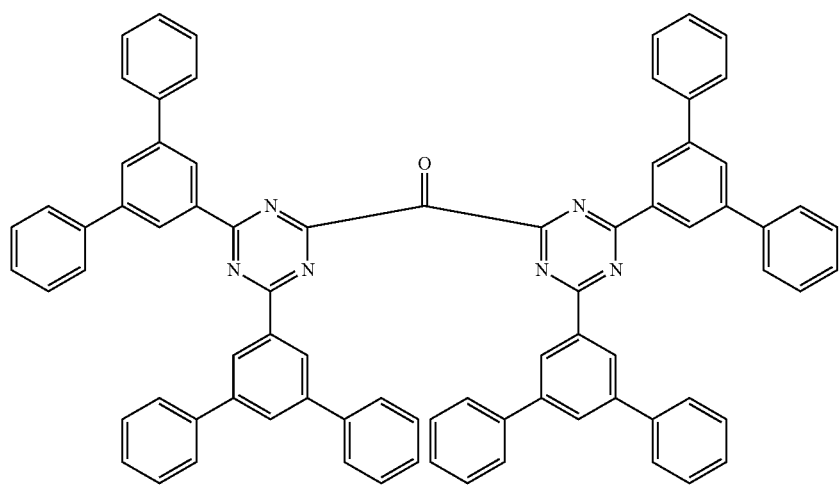
(41)
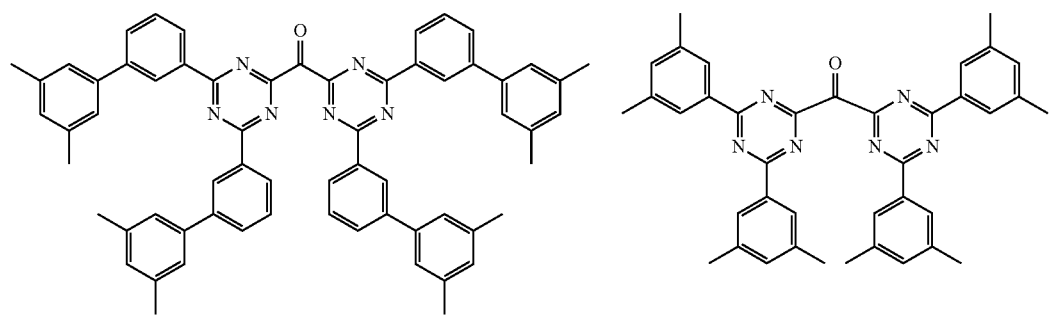
(42)
(43)
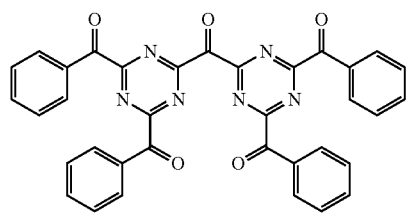
(44)
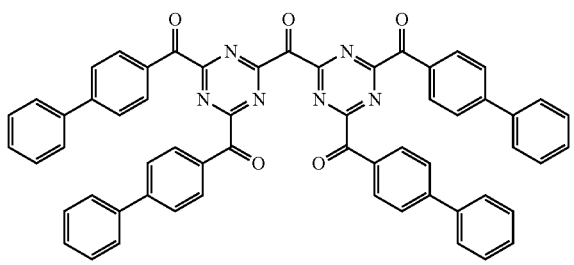

-continued
(45)
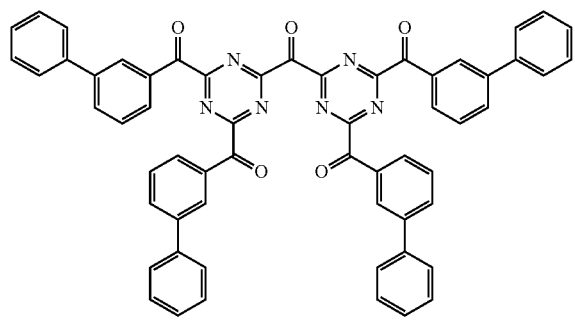
(46)
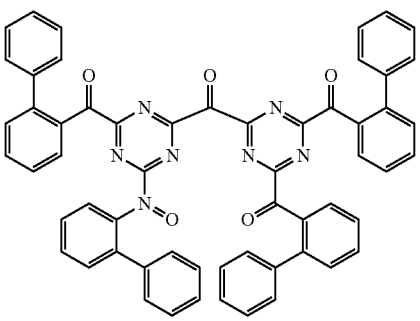
(47)
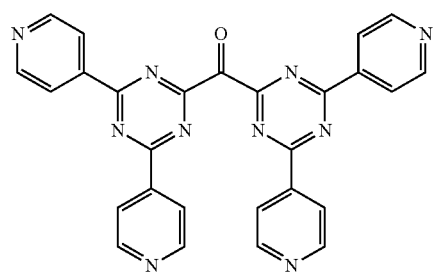
(48)
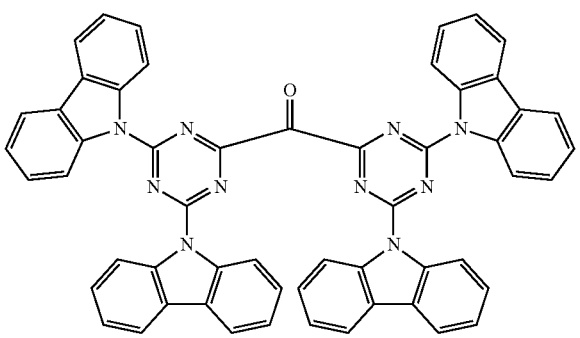
(49)
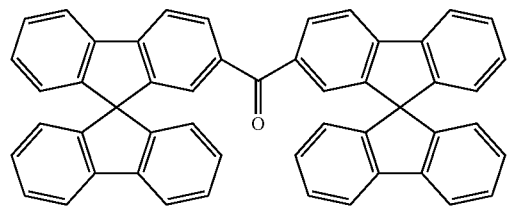
(50)
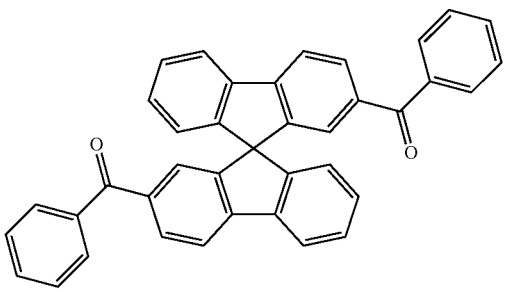
(51)
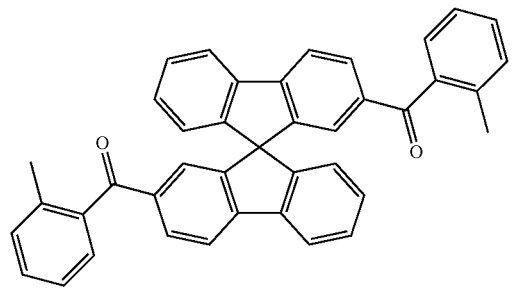
(52)
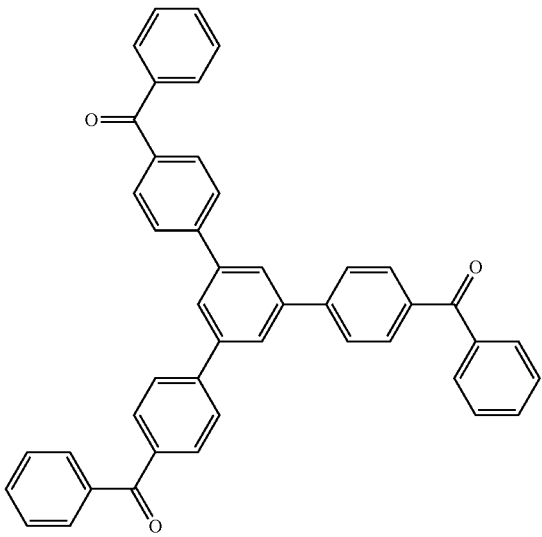

-continued
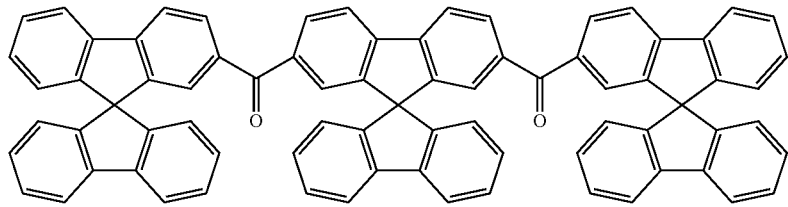
(53)
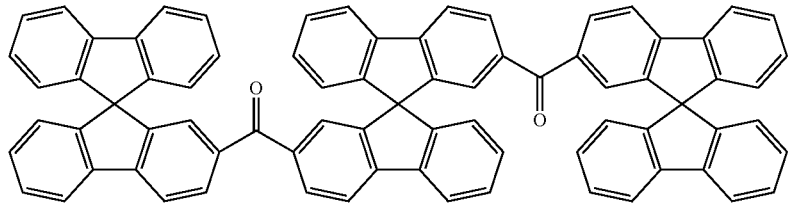
(54)
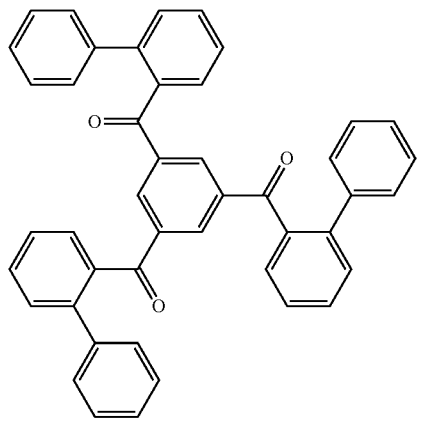
(55)
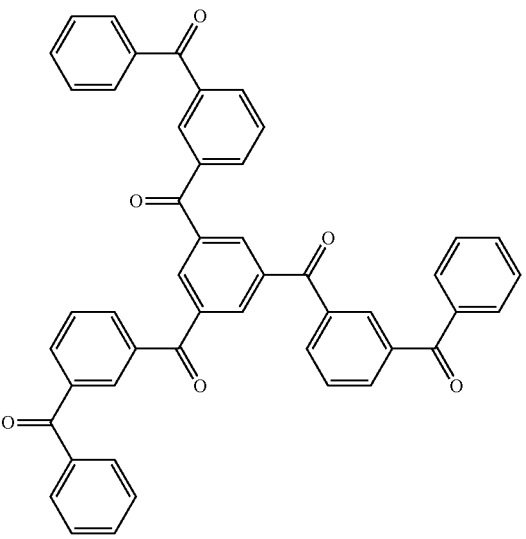
(56)
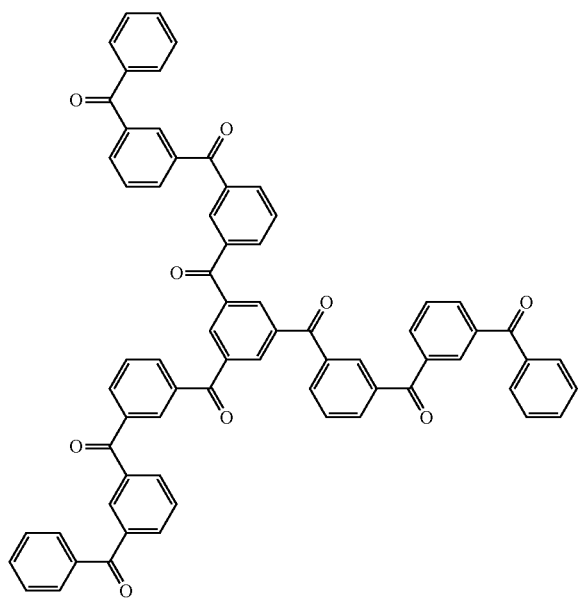
(57)
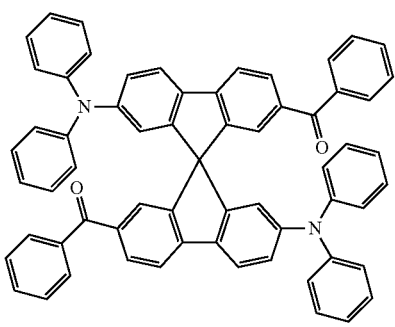
(58)

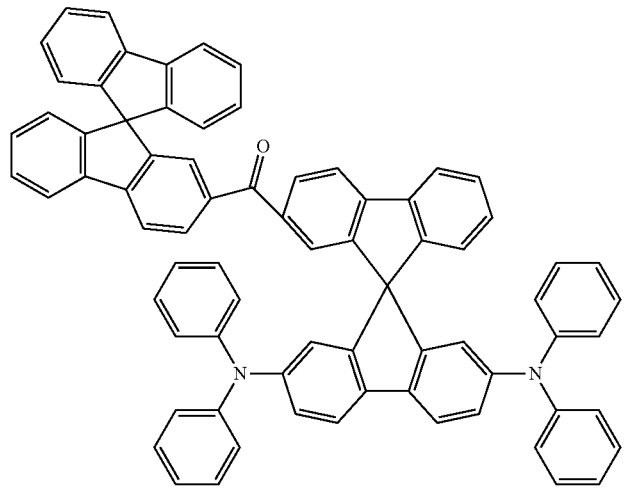

(59)

The hole-conducting matrix material in emitter layer 1 is preferably an aromatic monoamine, diamine, triamine or tetramine, where the amine may also be present in the form of a carbazole or another bridged compound.

Preferred aromatic amines are the compounds of the following formulae (26) to (32),

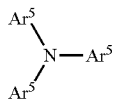

formula (26)

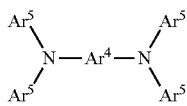

formula (27)

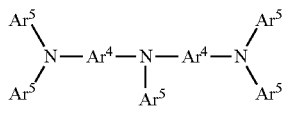

formula (28)

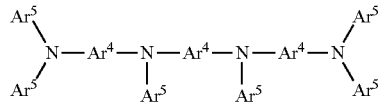

formula (29)

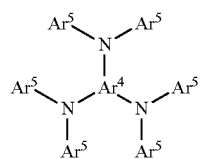

formula (30)

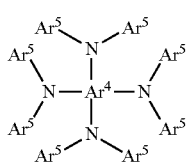

formula (31)

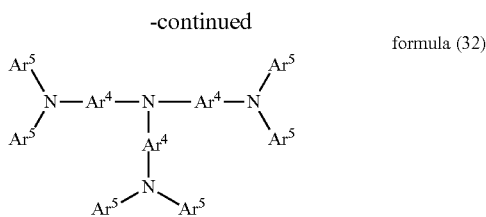

formula (32)

where $R^1$ has the above-mentioned meaning, and the following applies to the other symbols used:

$Ar^4$ is on each occurrence, identically or differently, a divalent, trivalent or tetravalent aromatic or heteroaromatic ring system having 5 to 60 aromatic ring atoms, which may be substituted by one or more radicals $R^1$;

$Ar^5$ is on each occurrence, identically or differently, a monovalent aromatic or heteroaromatic ring system having 5 to 60 aromatic ring atoms, which may be substituted by one or more radicals $R^1$, two groups $Ar^5$ which are bonded to the same nitrogen atom or a group $Ar^4$ with a group $Ar^5$ which are bonded to the same nitrogen atom may be linked to one another here by a single bond or a bridge selected from the group consisting of $B(R^1)$, $C(R^1)_2$, $Si(R^1)_2$, $C=O$, $C=NR^1$, $C=C(R^1)_2$, $O$, $S$, $S=O$, $SO_2$, $N(R^1)$, $P(R^1)$ and $P(=O)R^1$.

If two groups $Ar^5$ or a group $Ar^4$ with a group $Ar^5$ which are in each case bonded to the same nitrogen atom are linked to one another by a single bond, a carbazole is thereby formed.

$Ar^4$ in the compounds of the formulae (27), (28), (29) and (32) is a divalent group and $Ar^4$ in the compounds of the formula (30) is a trivalent group and $Ar^4$ in the compounds of the formula (31) is a tetravalent group.

It is preferred here for $Ar^4$ and $Ar^5$ to contain no condensed aryl or heteroaryl groups having more than two aromatic or heteroaromatic six-membered rings condensed directly onto one another. $Ar^4$ and $Ar^5$ particularly preferably contain absolutely no aromatic or heteroaromatic six-membered rings condensed directly onto one another.

Further compounds which can preferably be employed as the hole-conducting matrix material in emitter layer 1 are the compounds of the following formulae (33) and (34), formula (33)
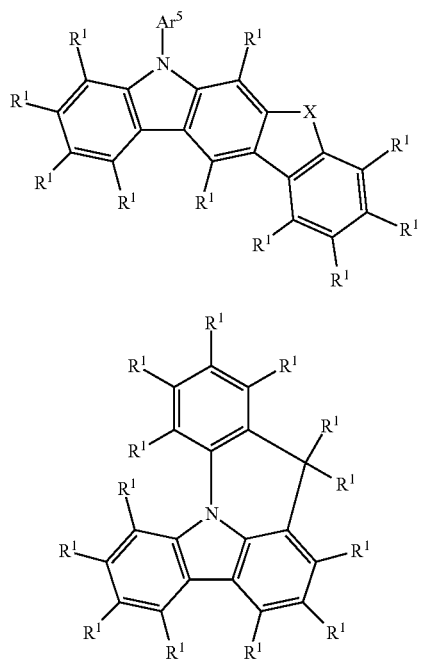
formula (34)
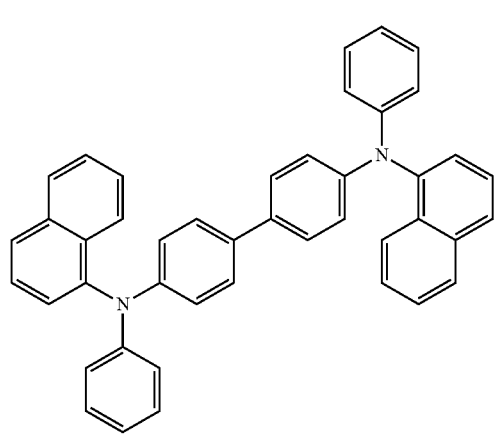
where the symbols used have the above-mentioned meanings.
Preferred embodiments are the compounds of the following formulae (33a) and (34a),
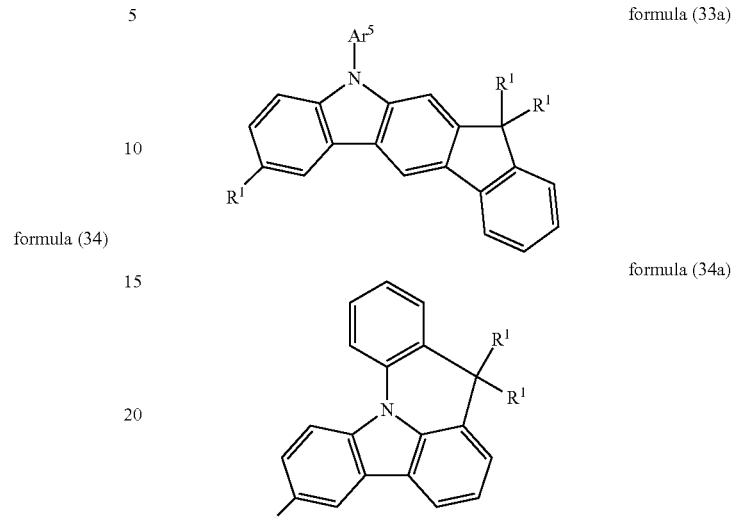
formula (33a)
formula (34a)
where the symbols used have the above-mentioned meanings.
Examples of suitable hole-conducting compounds in the interlayer are the aromatic amines depicted below.
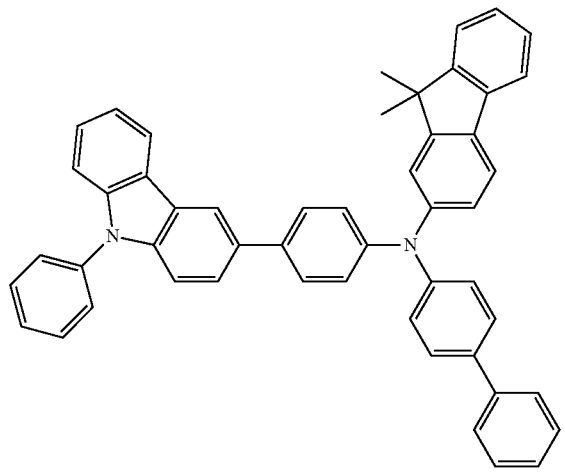
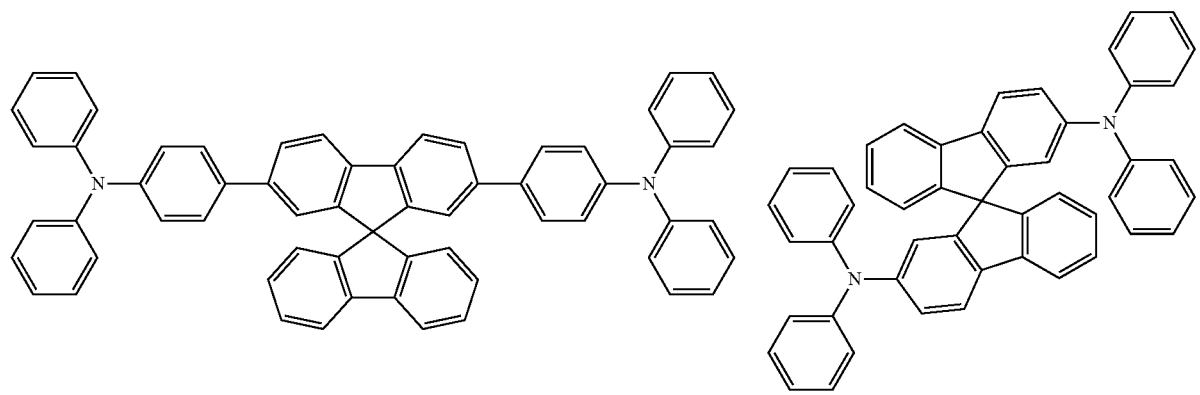

-continued
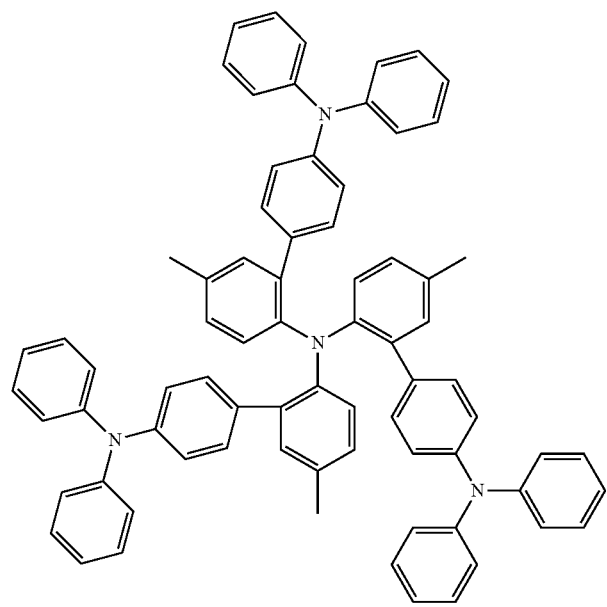
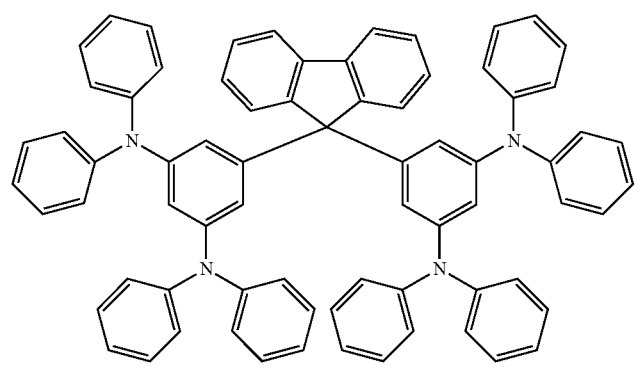
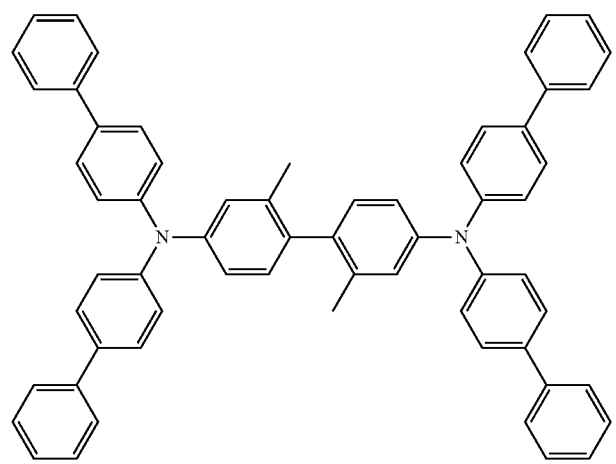

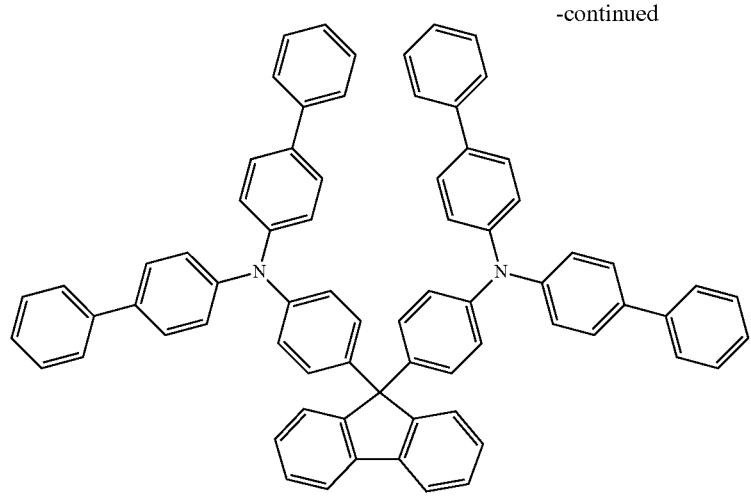
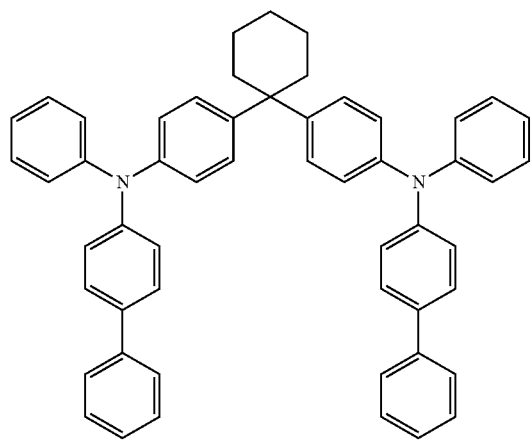
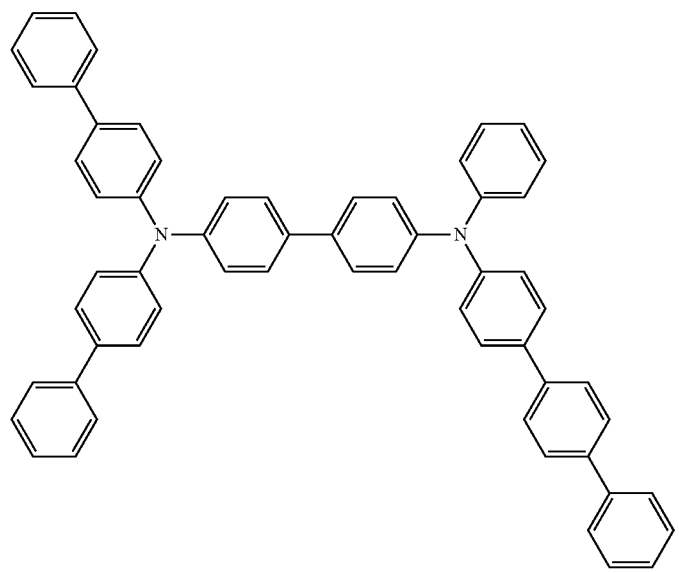

-continued
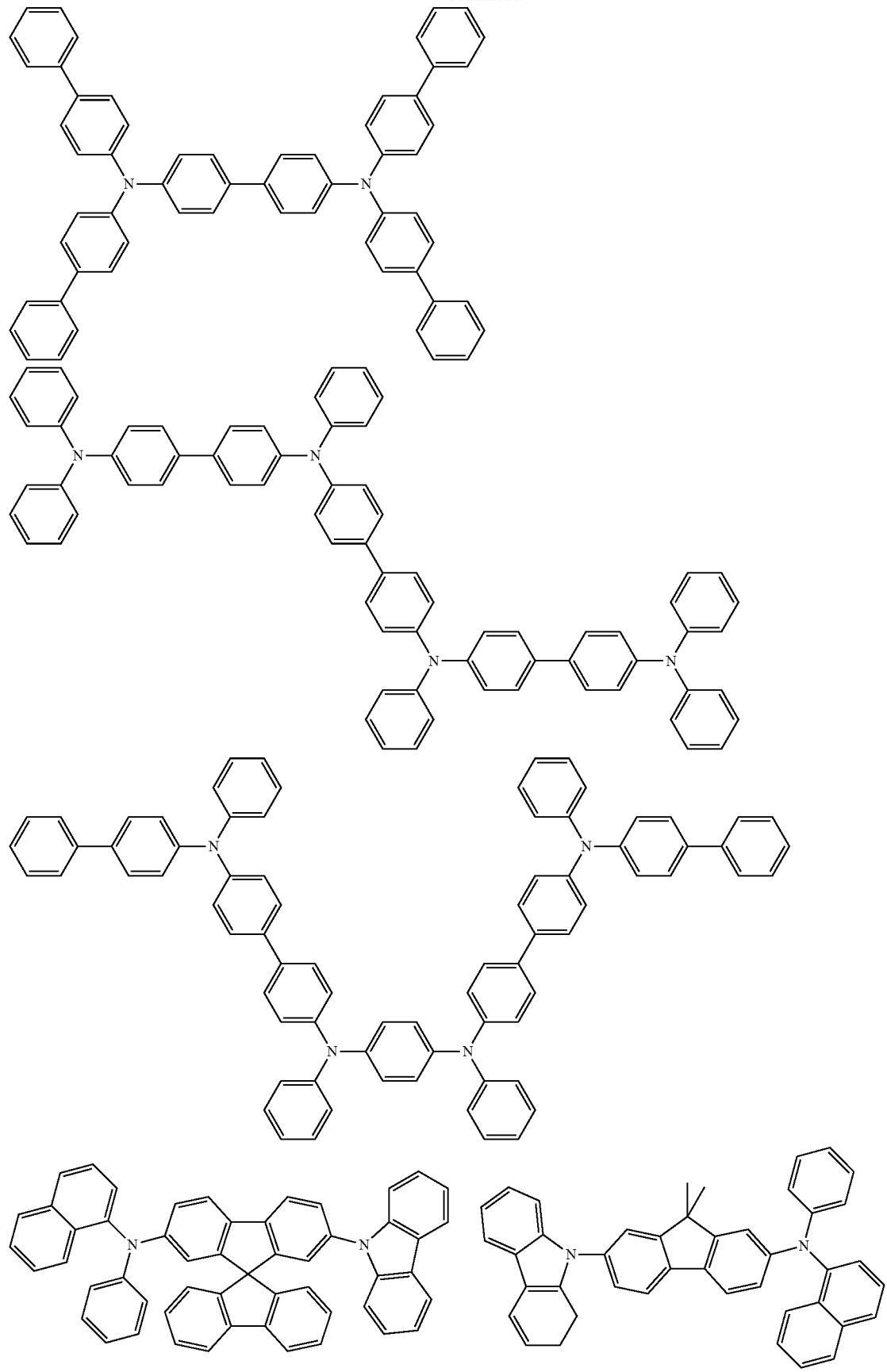

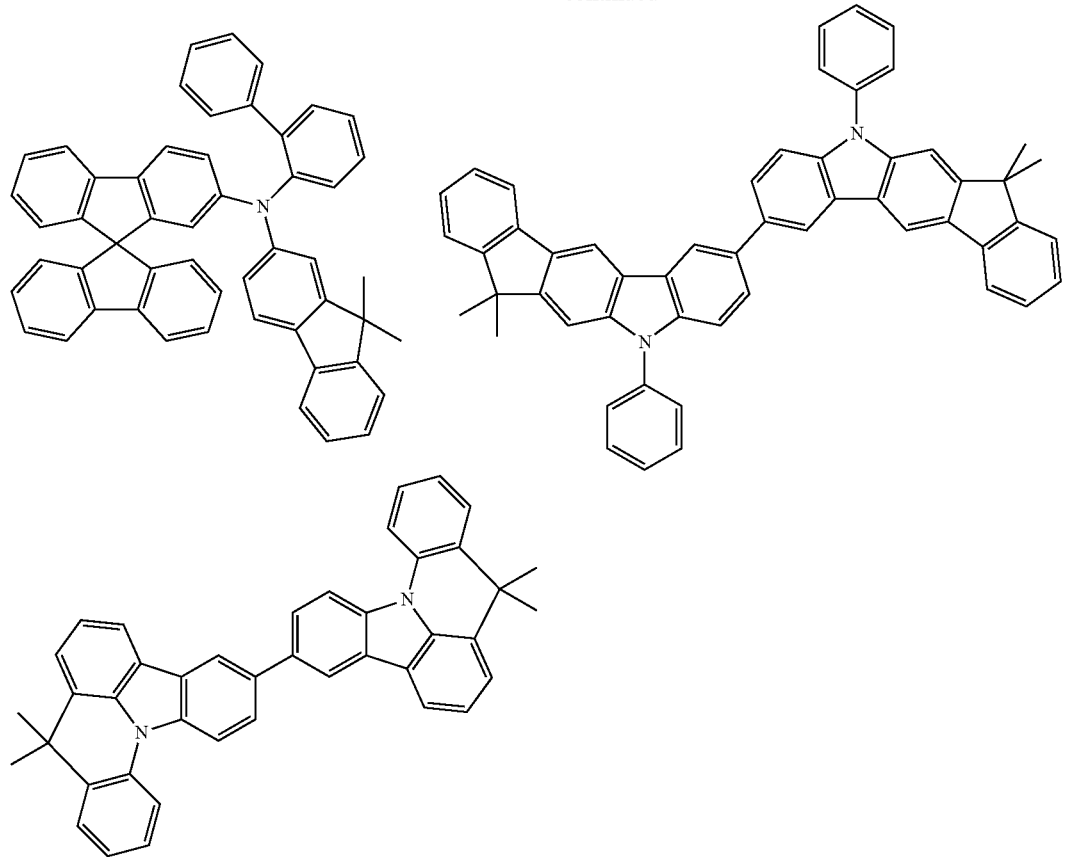

Suitable phosphorescent compounds, as are employed in emitter layer 1 or emitter layer 2, are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably transition-metal compounds, in particular compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (35) to (38),

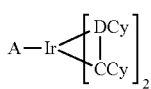
formula (35)

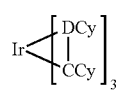
formula (36)

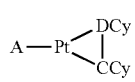
formula (37)

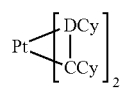
formula (38)

where $R^1$ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate-chelating ligand, preferably a diketonate ligand.

Due to formation of ring systems between a plurality of radicals $R^1$, a bridge may also be present between the groups DCy and CCy. Furthermore, due to formation of ring systems between a plurality of radicals $R^1$, a bridge may also be present between two or three ligands CCy-DCy or between one or two ligands CCy-DCy and the ligand A, giving a polydentate or polypodal ligand system. This is particularly preferred in the case of the Pt complexes of the formula (38), where the bridge between the two CCy-DCy ligands is preferably selected from $NR^1$ or $C(R^1)_2$.

Examples of the emitters described above are revealed by the applications WO 2000/70655, WO 2001/41512, WO 2002/02714, WO 2002/15645, EP 1191613, EP 1191612, EP 1191614, WO 2004/081017, WO 2005/033244, WO 2005/042550, WO 2005/113563, WO 2006/008069, WO 2006/061182, WO 2006/081973 and WO 2009/146770. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with what emission colour.

Examples of suitable phosphorescent emitters are shown in the following table.

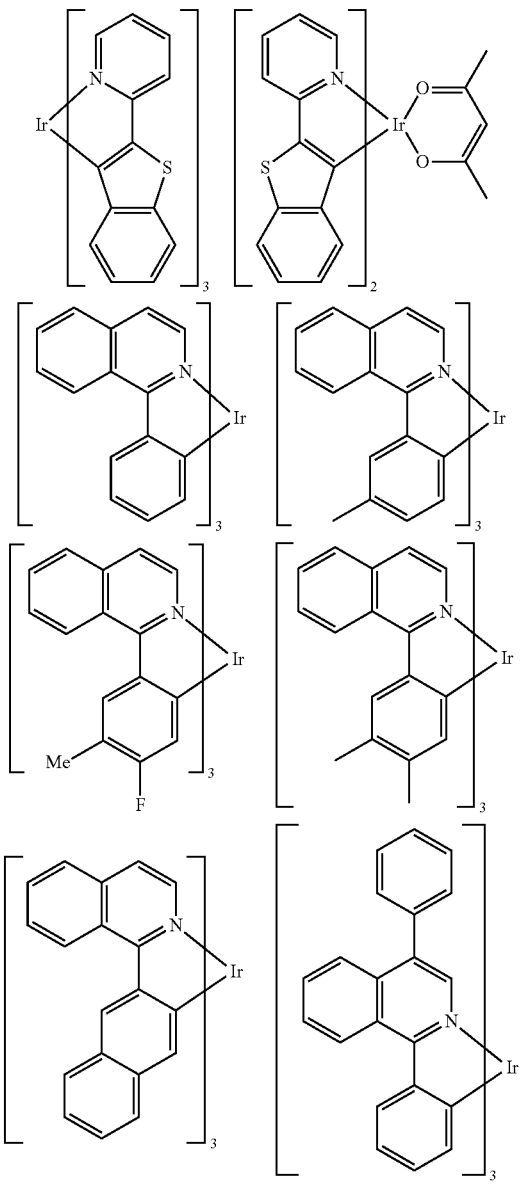

-continued

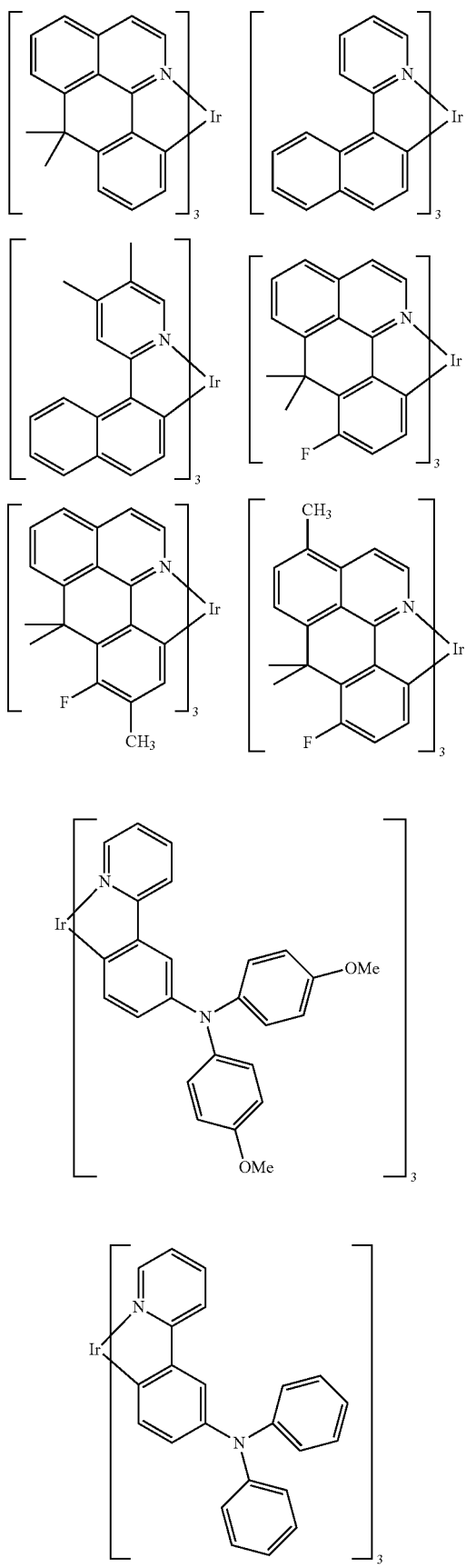

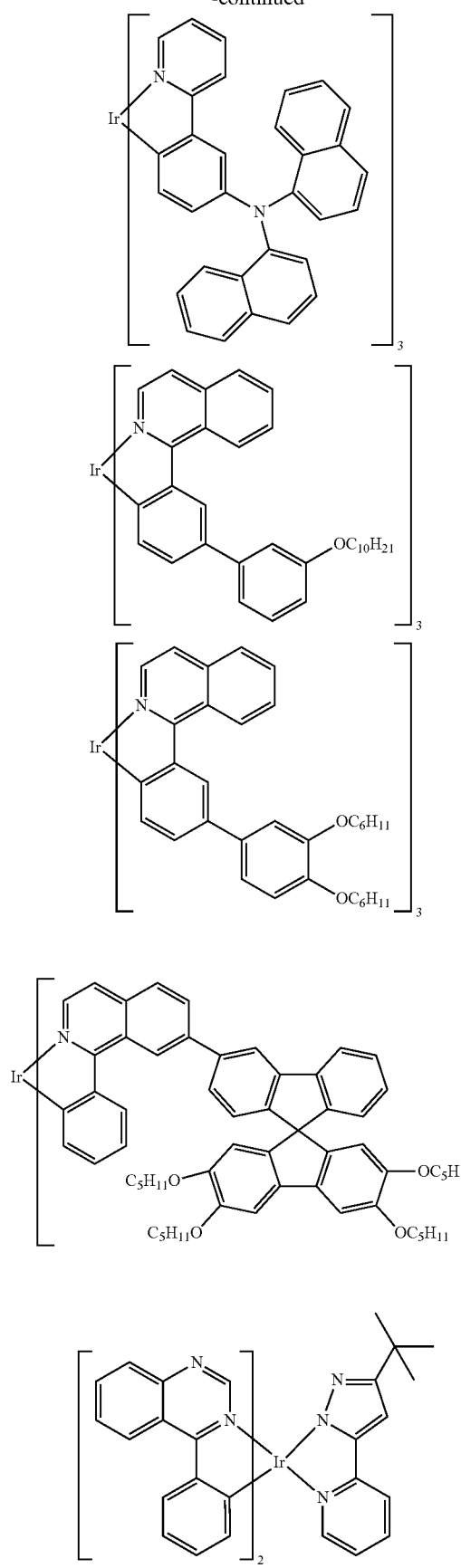

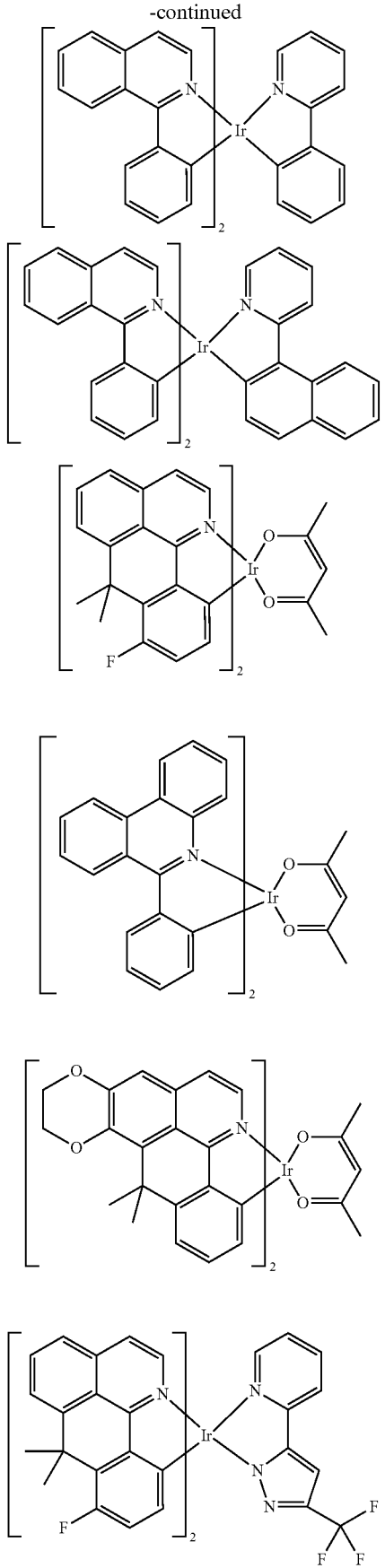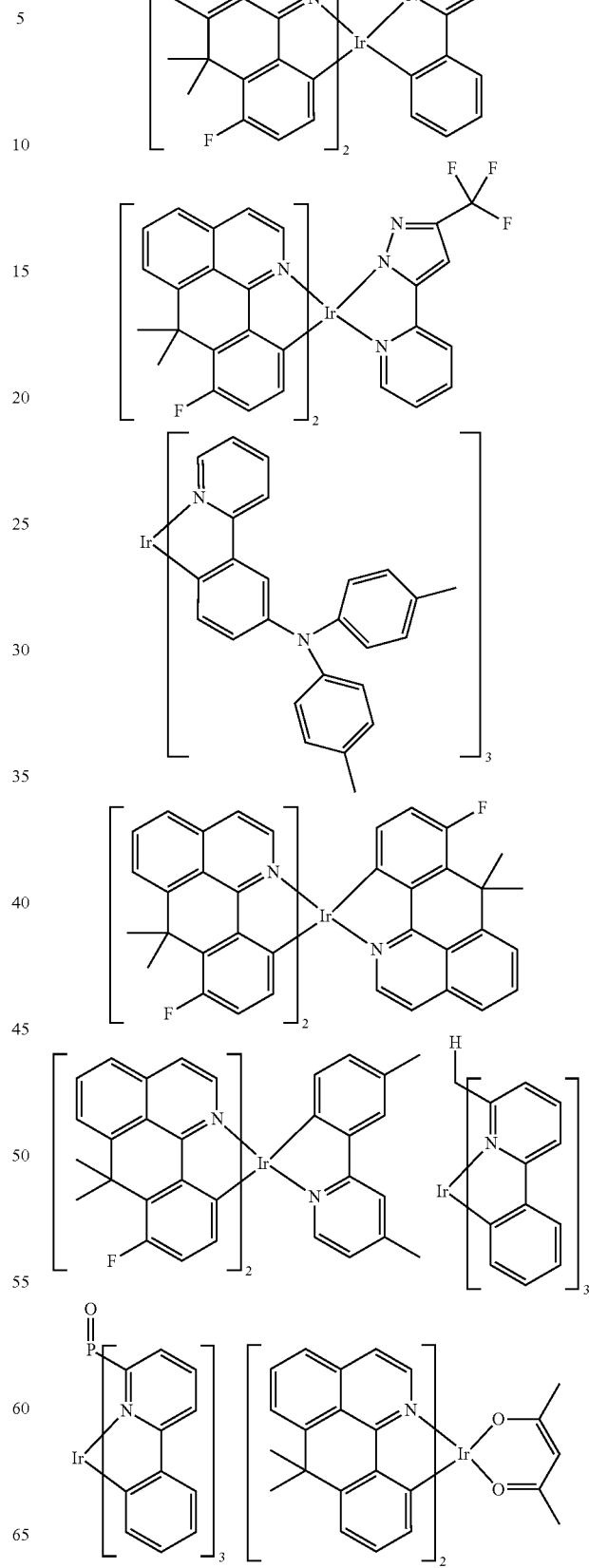

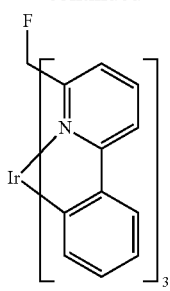
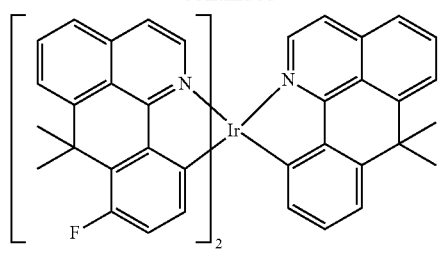
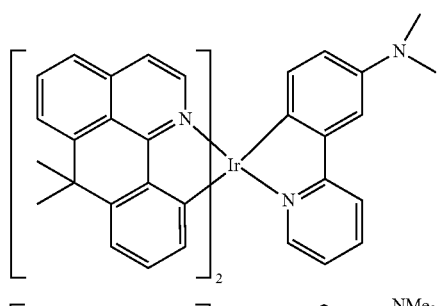
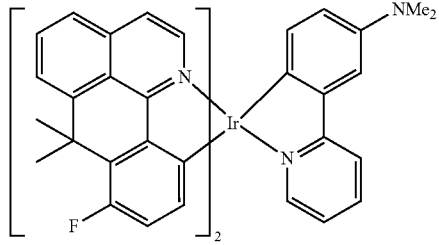
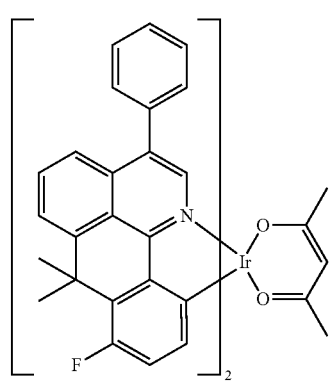
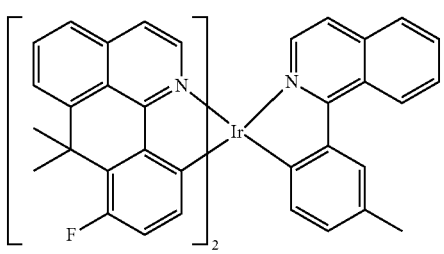
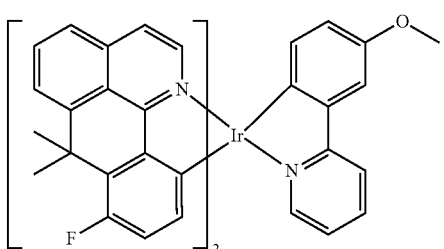
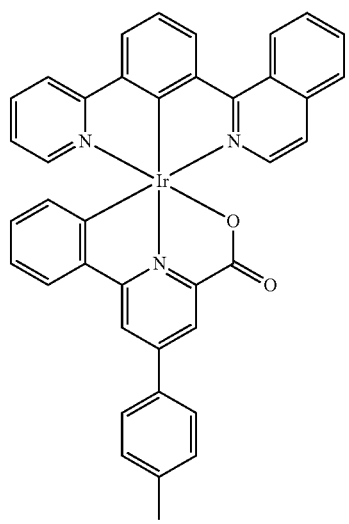
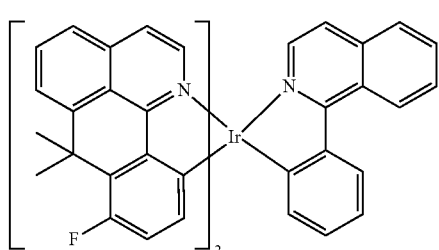

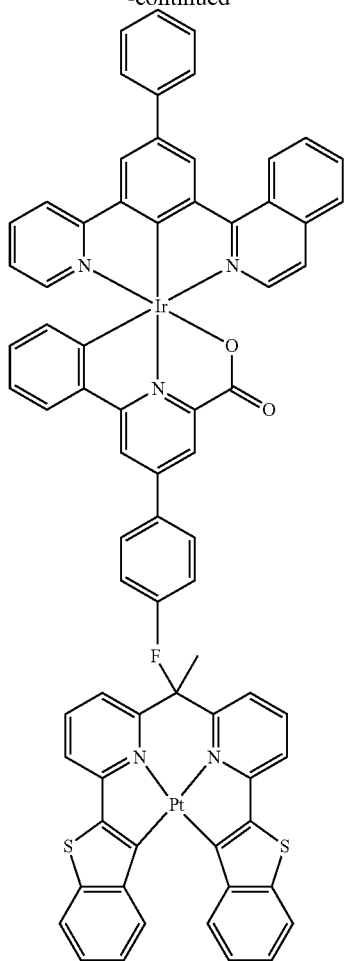
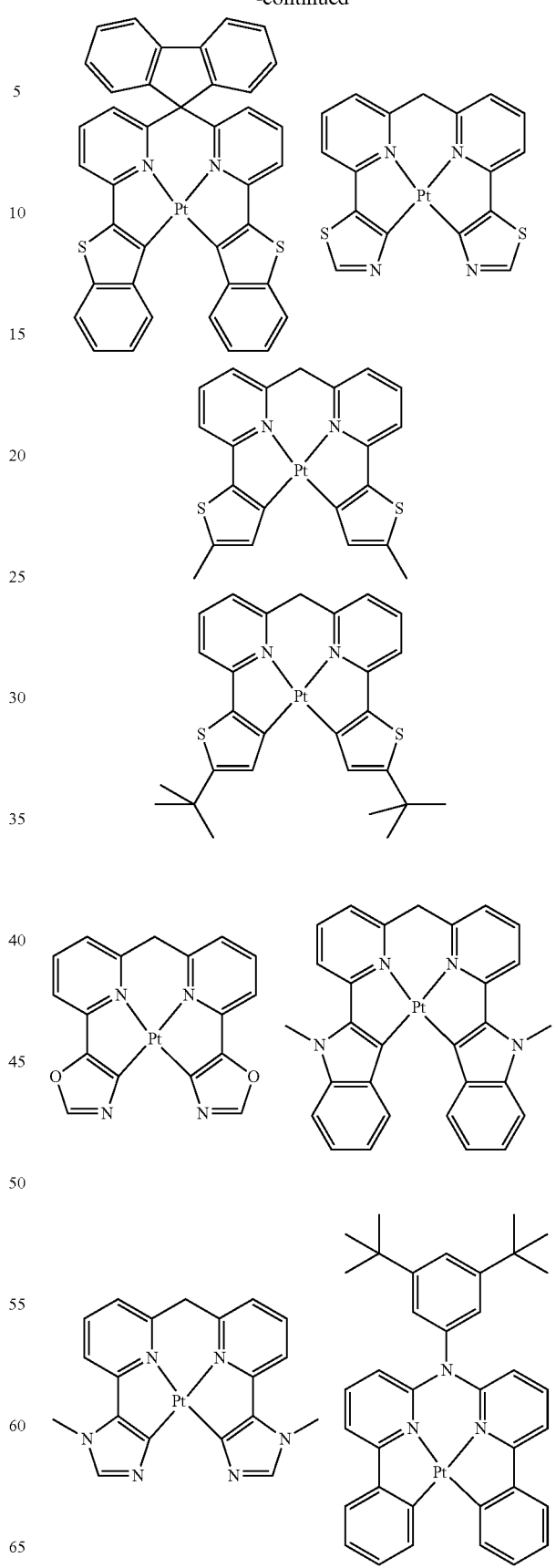

101
-continued
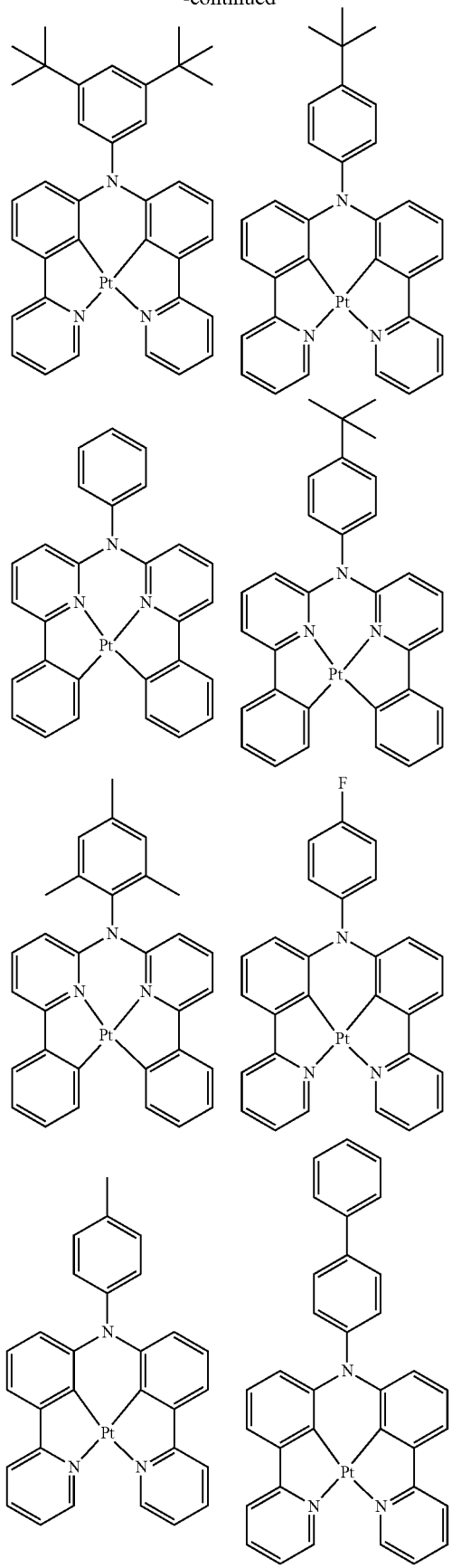
102
-continued
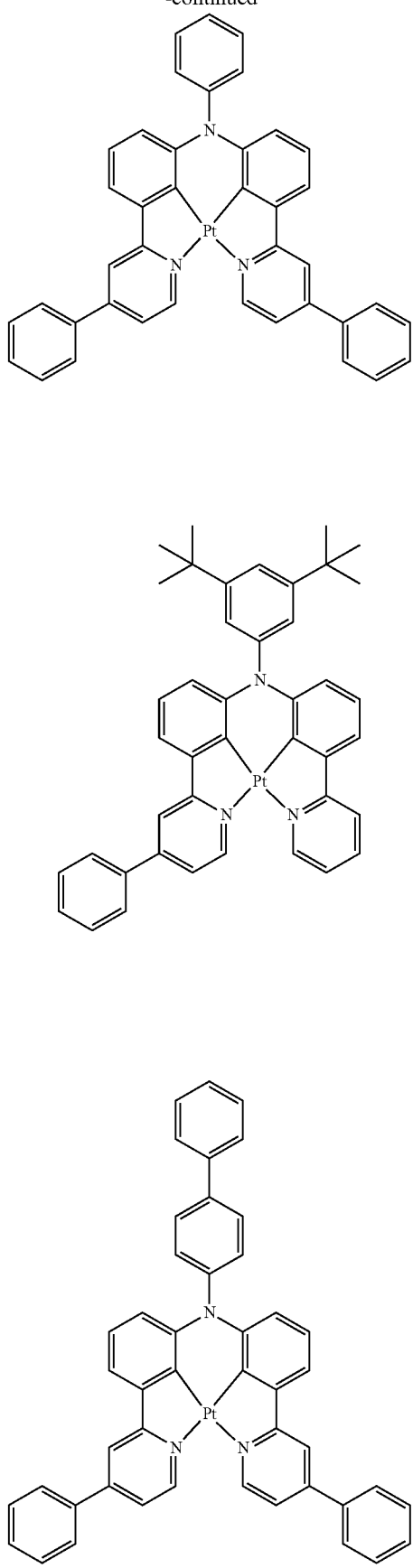

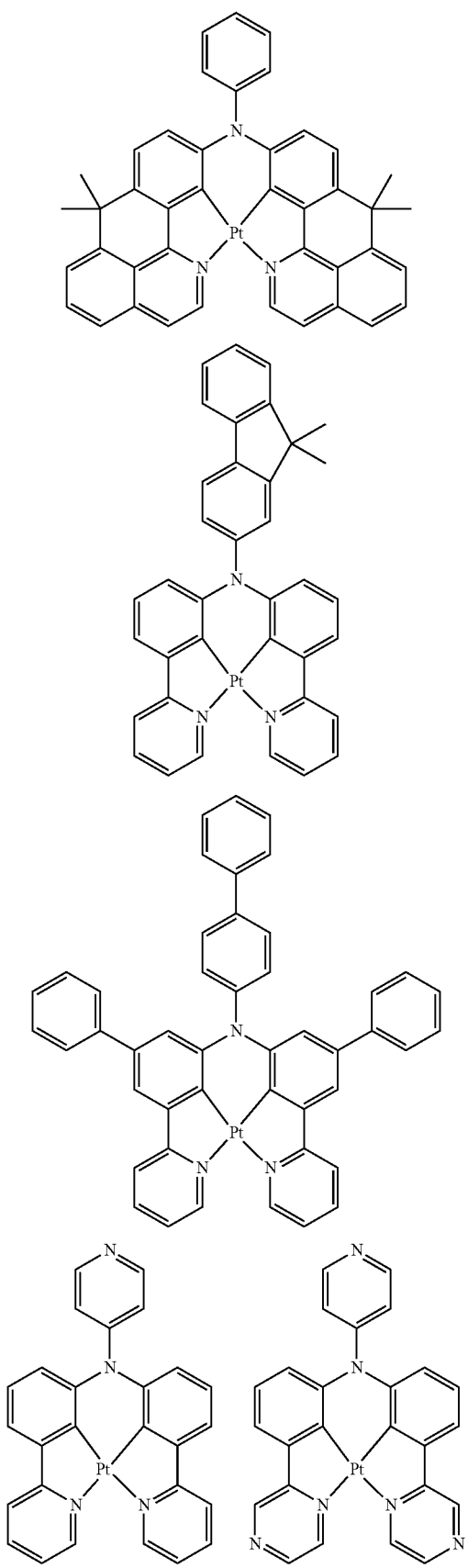
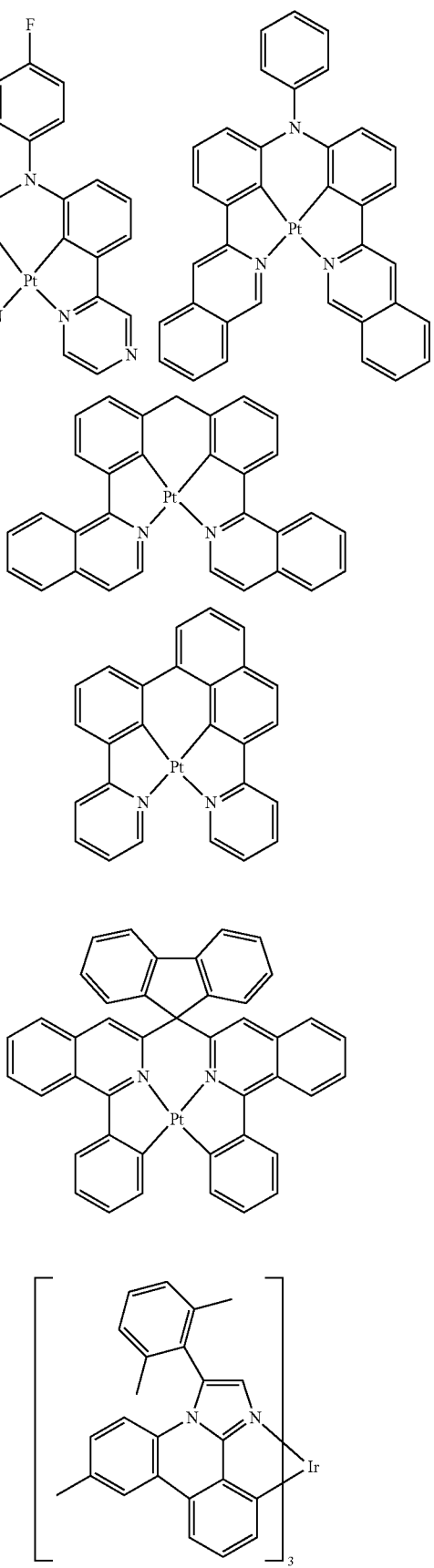

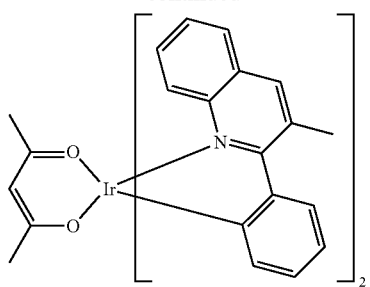
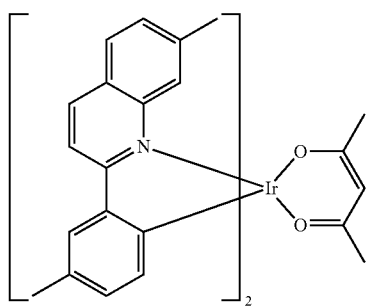
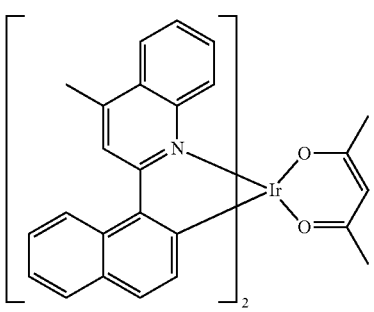
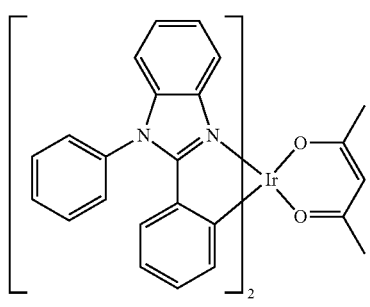
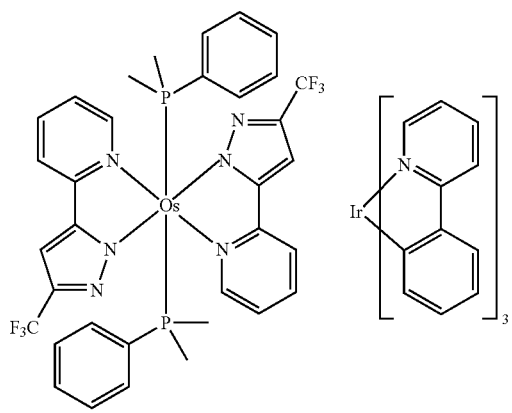
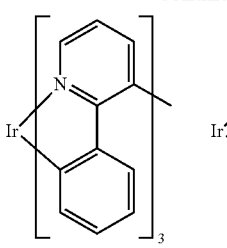
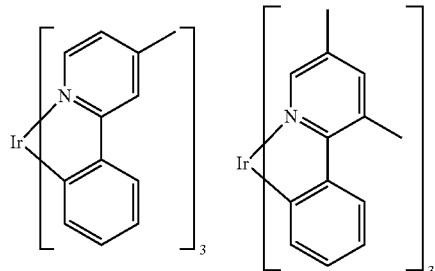
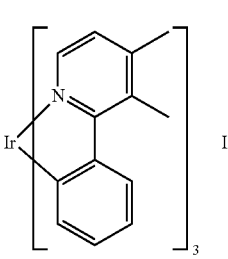
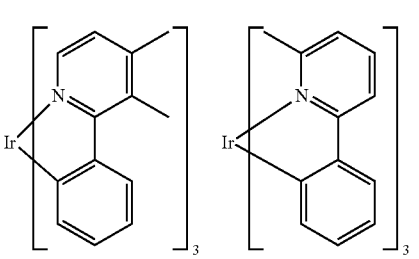
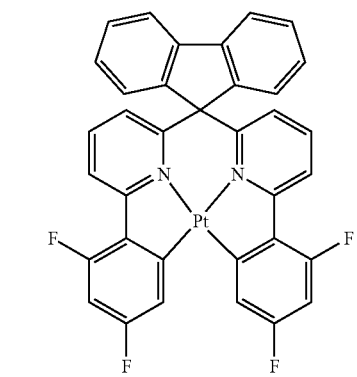
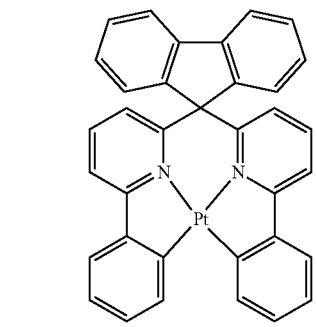

107
-continued
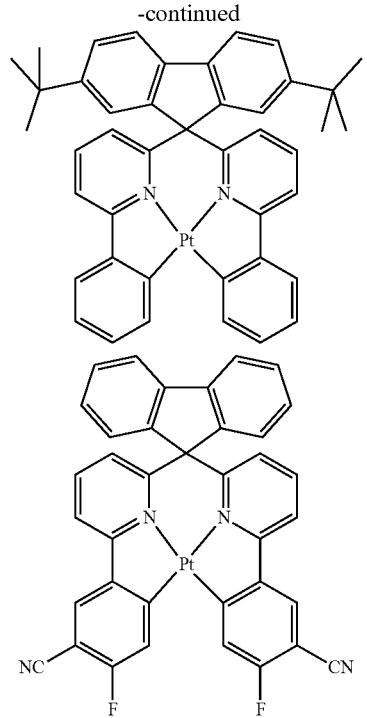
108
-continued
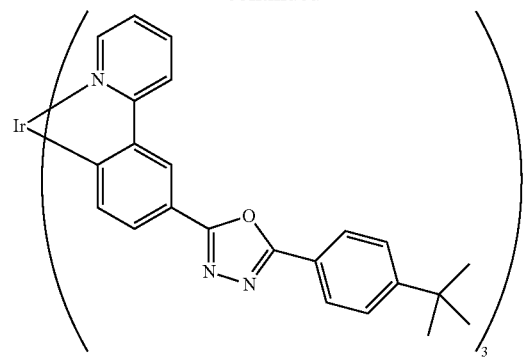
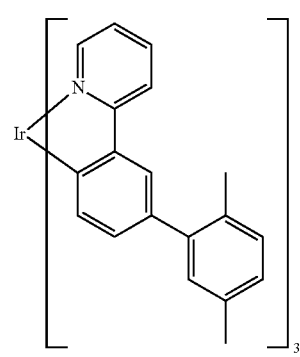
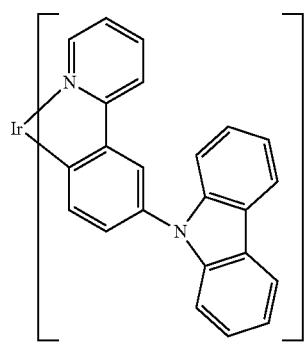
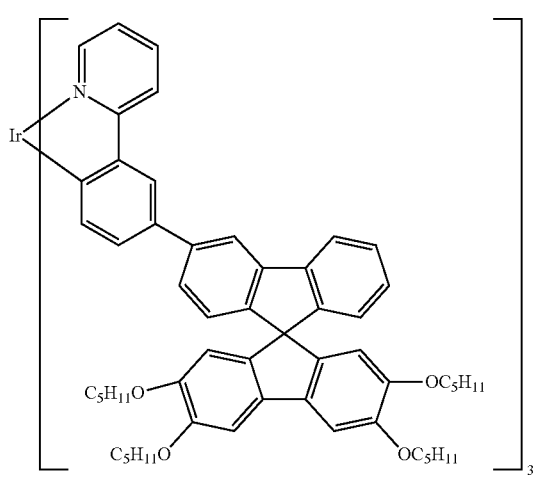
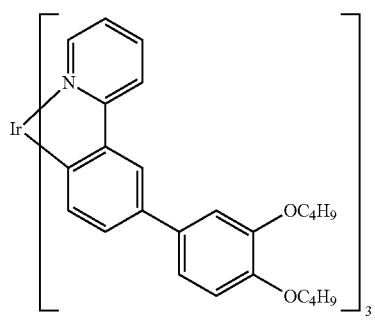
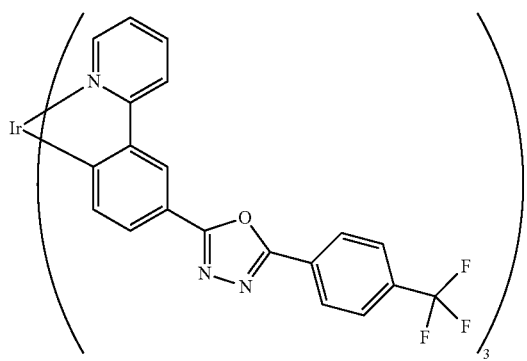
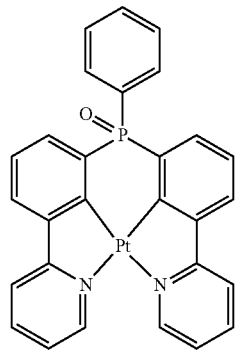

109
-continued
110
-continued
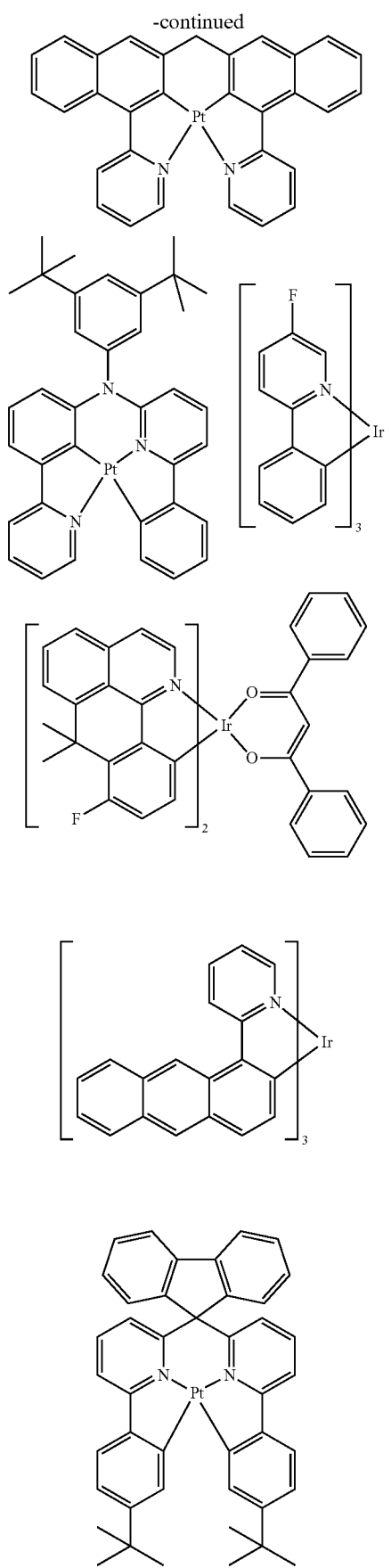
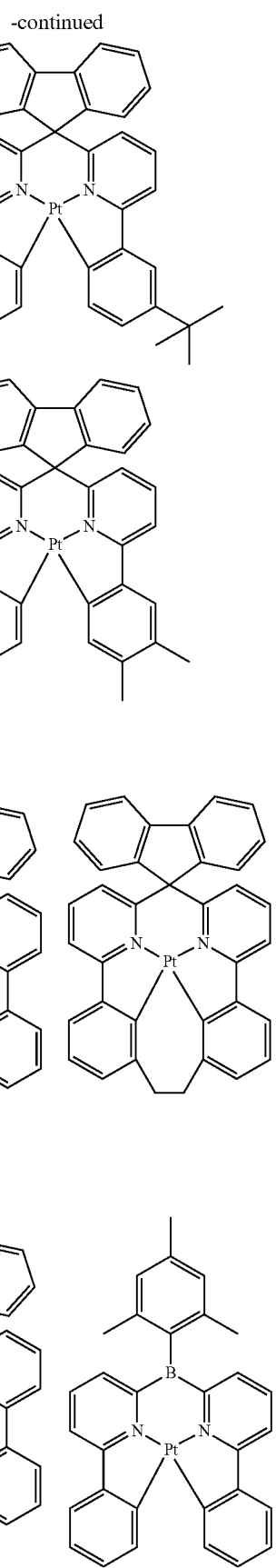

111
-continued
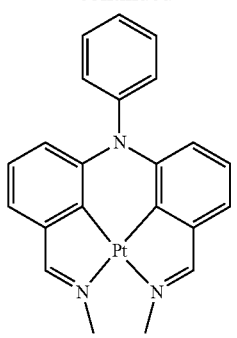
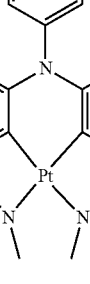
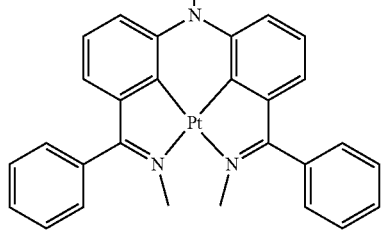
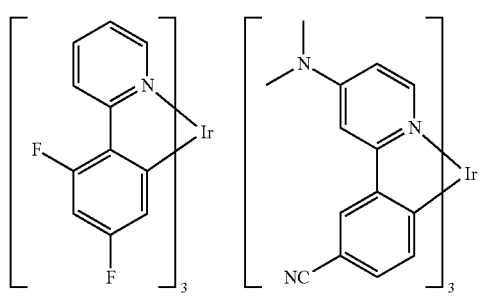
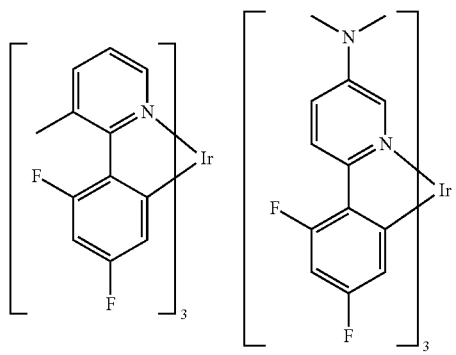
112
-continued
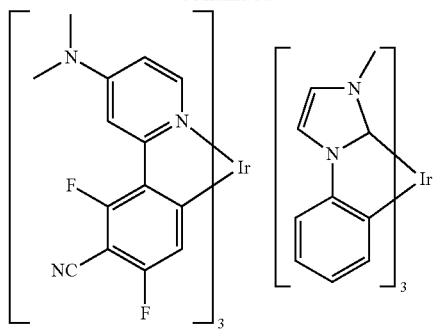
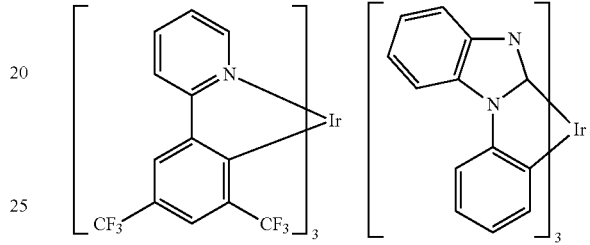
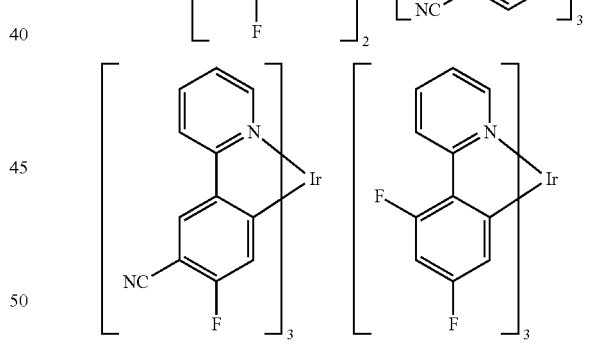
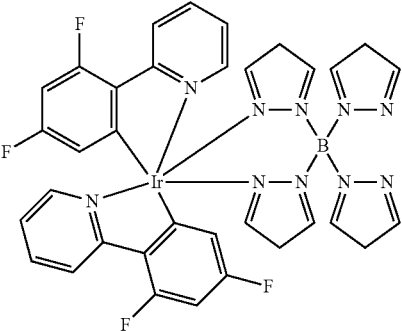

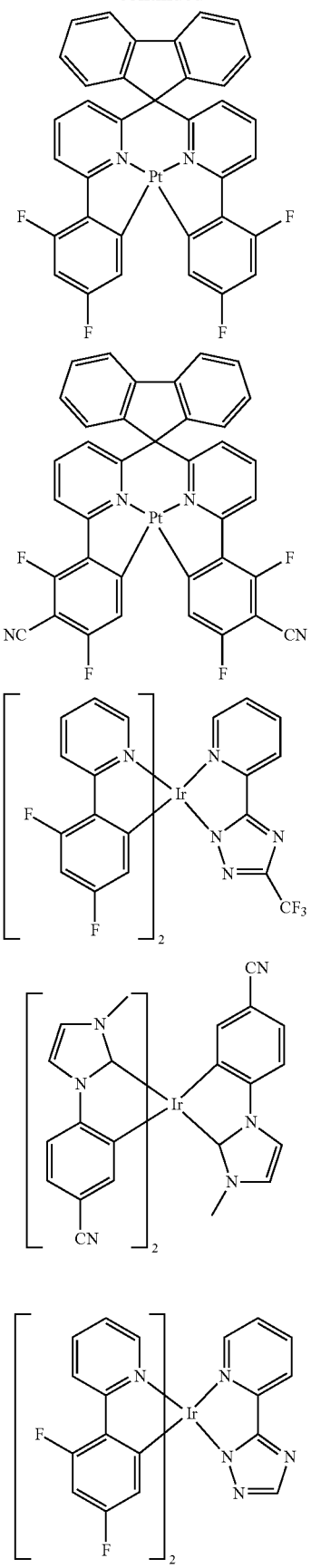
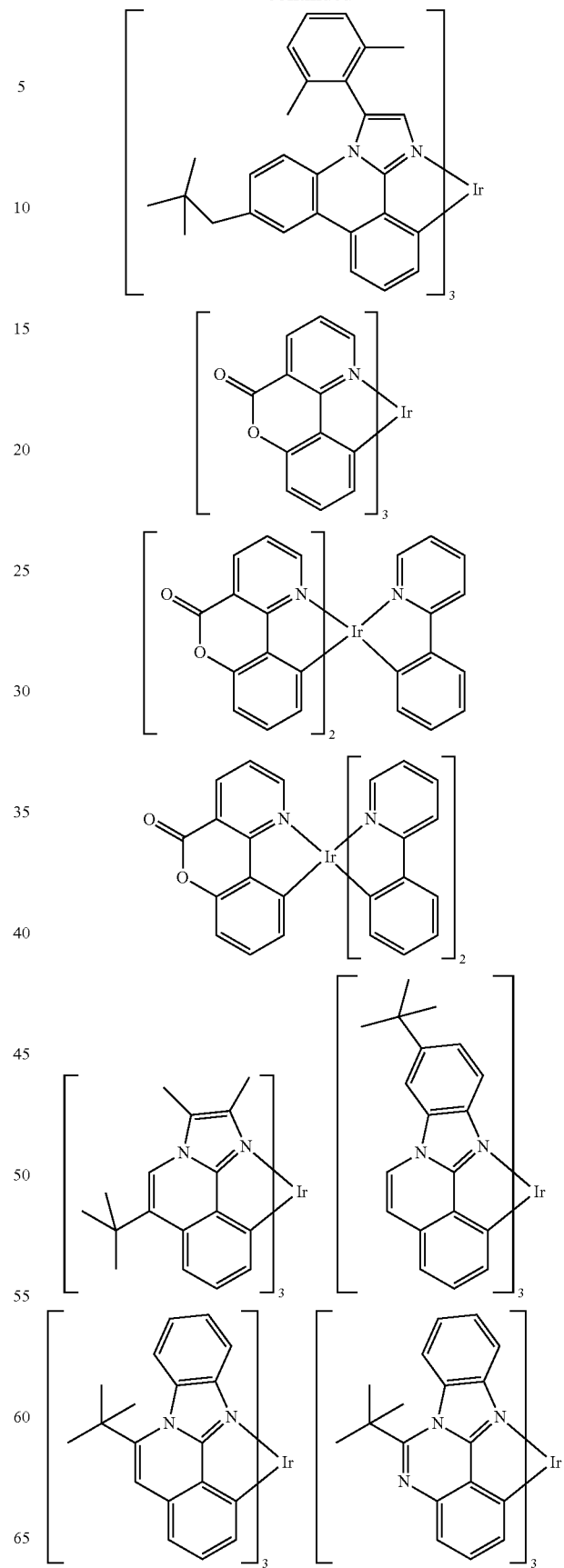

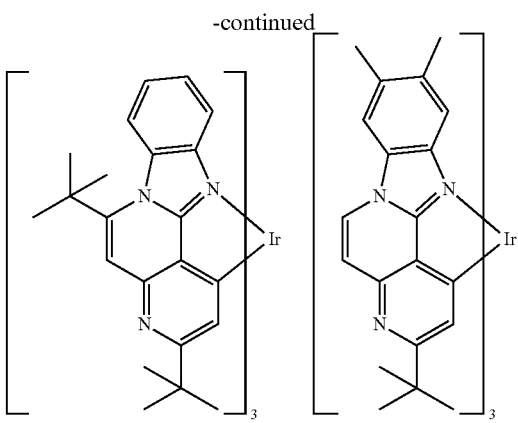

The preferred embodiments of the other layers of the OLED are described below.

In a preferred embodiment of the invention, the organic electroluminescent device according to the invention additionally comprises a blue-emitting, in particular a blue-fluorescent, emitter layer, and the device is a white-emitting organic electroluminescent device. This is characterised in that it emits in total light having CIE colour coordinates in the range from 0.25<CIE x<0.45 and 0.25<CIE y<0.48, preferably 0.28<CIE x<0.38 and 0.29<CIE y<0.38 and particularly preferably 0.30<CIE x<0.35 and 0.31<CIE y<0.35. Alternatively, preference is also given to CIE colour coordinates in the range from 0.38<CIE x<0.47 and 0.38<CIE y<0.44 and particularly preferably 0.41<CIE x<0.46 and 0.40<CIE y<0.43.

In a preferred embodiment of the invention, the blue-fluorescent emitter layer is arranged on the cathode side of emitter layer 2 and is separated from emitter layer 2 by at least one other layer, i.e. is not directly adjacent thereto.

In a further preferred embodiment of the invention, the blue-fluorescent emitter layer is arranged on the anode side of emitter layer 2 and is separated from emitter layer 2 by at least one other layer, i.e. is not directly adjacent thereto.

In a particularly preferred embodiment of the invention, at least one of the layers separating the blue-emitting emitter layer from the above-mentioned emitter layer 2 is a charge-generation layer, i.e. the organic electroluminescent device according to the invention is a tandem OLED.

In a preferred embodiment of the invention, the blue-fluorescent emitter layer comprises at least one blue-fluorescent dopant and at least one matrix material.

Suitable blue-fluorescent dopants are selected, for example, from the group of the monostyrylamines, the distyrylamines, the tristyrylamines, the tetrastyrylamines, the styrylphosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic pyrenamines, aromatic pyrenediamines, aromatic chrysenamines or aromatic chrysenediamines. An aromatic anthracenamine is taken to mean a compound in which a diarylamino group is bonded directly to an anthracene group, preferably in the 9-position or in the 2-position. Aromatic pyrenamines, pyrenediamines, chrysenamines and chrysenediamines are defined analogously thereto, where the diarylamino groups on the pyrene are preferably bonded in the 1-position or in the 1,6-position. Further preferred dopants are selected from indenofluorenamines or indenofluorenediamines, for example in accordance with WO 2006/108497 or WO 2006/122630, benzoindenofluorenamines or benzoindenofluorenediamines, for example in accordance with WO 2008/006449, and dibenzoindenofluorenamines or dibenzoindenofluorenediamines, for example in accordance with WO 2007/140847. Examples of dopants from the class of the styrylamines are substituted or unsubstituted tristilbenamines or the dopants described in WO 2006/000388, WO 2006/058737, WO 2006/000389, WO 2007/065549 and WO 2007/115610. Furthermore, suitable fluorescent dopants are the condensed hydrocarbons disclosed in WO 2010/012328.

Suitable host materials (matrix materials) for the fluorescent dopants, in particular for the above-mentioned dopants, are selected, for example, from the classes of the oligoarylenes (for example 2,2',7,7'-tetraphenylspirobifluorene in accordance with EP 676461 or dinaphthylanthracene), in particular the oligoarylenes containing condensed aromatic groups, in particular anthracenes, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052), the benzanthracene derivatives (for example benz[a]anthracene derivatives in accordance with WO 2008/145239 or WO 2011/012212) and the benzophenanthrene derivatives (for example benz[c]phenanthrene derivatives in accordance with WO 2010/083869). Particularly preferred host materials are selected from the classes of the oligoarylenes, containing naphthalene, anthracene, benzanthracene, in particular benz[a]anthracene, benzophenanthrene, in particular benz[c]phenanthrene, and/or pyrene, or atropisomers of these compounds. Very particularly preferred matrix materials for the fluorescent emitter are anthracene derivatives. An oligoarylene in the sense of this invention is intended to be taken to mean a compound in which at least three aryl or arylene groups are bonded to one another.

Apart from cathode, anode and the emitting layers, which were described above, the organic electroluminescent device may also comprise further layers which are not depicted in FIG. 1 or FIG. 2. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. Furthermore, the layers, in particular the charge-transport layers, may also be doped. The doping of the layers may be advantageous for improved charge transport. However, it should be pointed out that each of these layers does not necessarily have to be present, and the choice of the layers is always dependent on the compounds used.

The use of layers of this type is known to the person skilled in the art, and he will be able, without inventive step, to use all materials in accordance with the prior art which are known for layers of this type for this purpose.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multi-layered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali-metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.), likewise organic alkali-metal complexes, for example Liq (lithium quinolinate). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent or partially transparent in order to facilitate the coupling-out of light. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

As already described above, the organic electroluminescent device according to the invention is preferably a tandem OLED, where one of the electroluminescent units comprises emitter layers 1 and 2 according to the invention and the other electroluminescent unit is a blue-luminescent unit, i.e. comprises a blue-luminescent emitter layer. The two electroluminescent units are separated from one another by a charge-generation layer. The charge-generation layer here can be all layers as are used in accordance with the prior art for this purpose. The charge-generation layer here is usually formed by coupling an n-conducting layer (or a conducting electron-injection layer) and a p-conducting layer (or a conducting hole-injection layer) to one another. The p-conducting layers used in accordance with the prior art comprise, for example, p-doped organic hole-transport materials, where the dopant is, for example, $F_4$-TCNQ or $WO_3$, or inorganic materials, such as, for example, indium tin oxide (ITO), $V_2O_5$, $WO_3$ or $MoO_3$. The n-conducting layer is generally a doped organic electron-transport layer, where the dopant used comprises metals having a low work function, such as, for example, Cs, Li or Mg, or metal carbonates.

For the other layers of the organic electroluminescent device, it is generally possible to employ all other materials as are employed in accordance with the prior art in organic electroluminescent devices, also in combination with the interlayers according to the invention.

Suitable charge-transport materials, as can be used in the hole-injection or hole-transport layer or in the electron-transport layer of the organic electroluminescent device according to the invention, are, for example, the compounds disclosed in Y. Shirota et al., *Chem. Rev.* 2007, 107(4), 953-1010, and indenofluorenamines and derivatives (for example in accordance with WO 2006/122630 or WO 2006/100896), the amine derivatives disclosed in EP 1661888, hexaazatriphenylene derivatives (for example in accordance with WO 2001/049806), amine derivatives containing condensed aromatic groups (for example in accordance with U.S. Pat. No. 5,061,569), the amine derivatives disclosed in WO 95/09147, mono benzoindenofluorenamines (for example in accordance with WO 2008/006449) or dibenzoindenofluorenamines (for example in accordance with WO 2007/140847). Hole-transport and hole-injection materials which are furthermore suitable are derivatives of the compounds depicted above, as disclosed in JP 2001/226331, EP 676461, EP 650955, WO 2001/049806, U.S. Pat. No. 4,780,536, WO 98/30071, EP 891121, EP 1661888, JP 2006/253445, EP 650955, WO 2006/073054 and U.S. Pat. No. 5,061,569.

Materials which can be used for the electron-transport layer are all materials as are used in accordance with the prior art as electron-transport materials in the electron-transport layer. Particularly suitable are aluminium complexes, for example $Alq_3$, zirconium complexes, for example $Zrq_4$, benzimidazole derivatives, triazine derivatives, for example compounds of the above-mentioned formulae (1) or (2), pyrimidine derivatives, for example compounds of the above-mentioned formulae (3) to (5), or aromatic ketones, for example compounds of the above-mentioned formulae (21) to (25). Suitable materials are, for example, the materials listed in the following table. Suitable materials are furthermore derivatives of the compounds depicted above, as disclosed in JP 2000/053957, WO 2003/060956, WO 2004/028217 and WO 2004/080975.

It may also be preferred to employ two separate electron-transport layers. This may have advantages with respect to the luminance dependence of the colour location of the electroluminescent device (see, for example, WO 2010/102706).

It is furthermore possible for one or more electron-transport layers to be doped. Suitable dopants are alkali metals or alkali-metal compounds, such as, for example, Liq (lithium quinolinate). In a preferred embodiment of the invention, the electron-transport layer is doped, in particular, when the electron-transport material is a benzimidazole derivative or a triazine derivative. The preferred dopant is then Liq.

Preference is furthermore given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are coated by means of the OVPD (organic vapour-phase deposition) process or with the aid of carrier-gas sublimation, in which the materials are applied at a pressure between 10⁻⁵ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

These processes are generally known to the person skilled in the art and can be applied by him without inventive step to the organic electroluminescent devices according to the invention.

The organic electroluminescent device according to the invention has the following surprising advantages over the prior art:

1. The organic electroluminescent device according to the invention has a very good lifetime. Thus, the lifetime is comparable with the lifetime of an electroluminescent device which comprises two separate emitting layers.
2. The organic electroluminescent device according to the invention at the same time has a very small colour shift with the lifetime. The colour shift here is comparable with the colour shift obtained if the differently emitting emitters are introduced into the same emission layer.

It is particularly surprising that the two above-mentioned advantages occur simultaneously, since the prior art frequently describes either organic electroluminescent devices having two or more emitting layers having a good lifetime or those having a small colour shift, but not those in which these effects occur simultaneously.

The invention is described in greater detail by the following examples without wishing to restrict it thereby. The person skilled in the art will be able, without being inventive, to carry out the invention throughout the range disclosed and thus produce further organic electroluminescent devices according to the invention.

EXAMPLES

Production and Characterisation of Organic Electroluminescent Devices

Electroluminescent devices according to the invention can be produced as described in general terms, for example, in WO 2005/003253.

The structures of the materials used are depicted below for clarity.

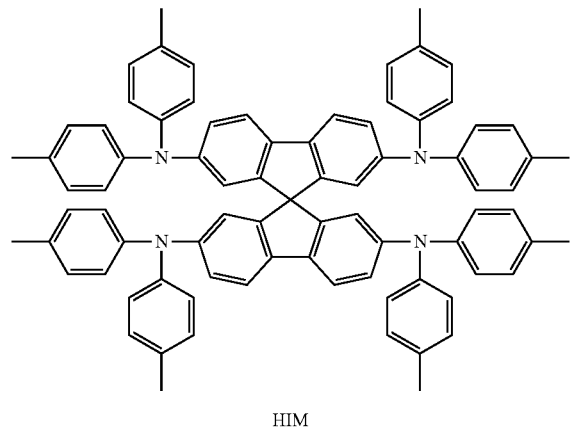

HIM

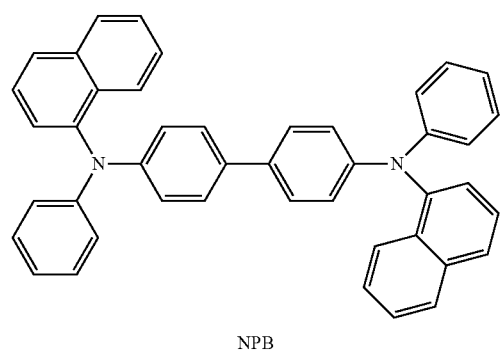

NPB

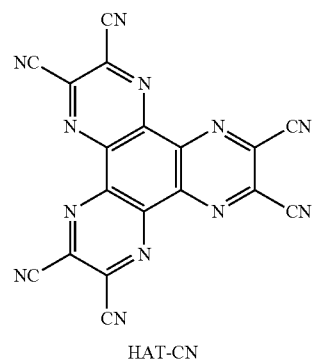

HAT-CN

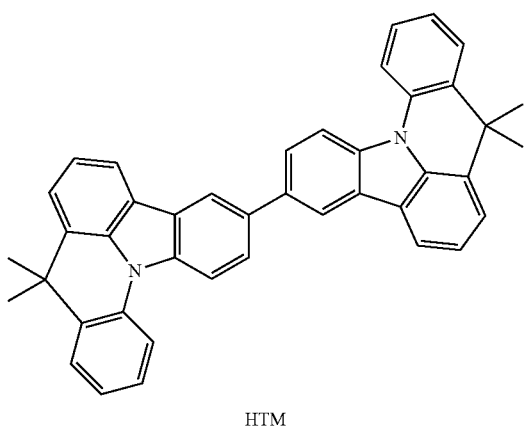

HTM

-continued
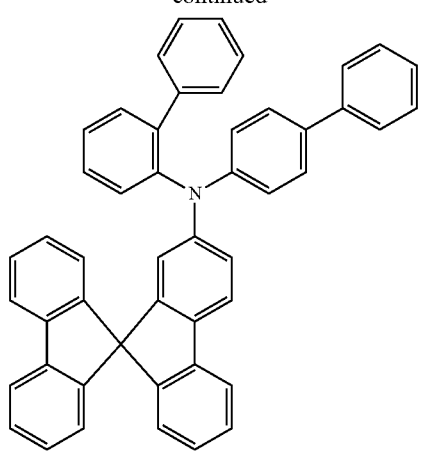
HTM2
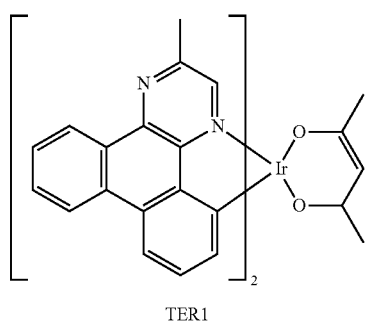
TER1
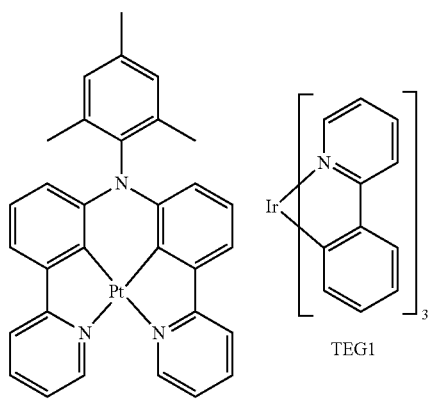
TER2
TEG1
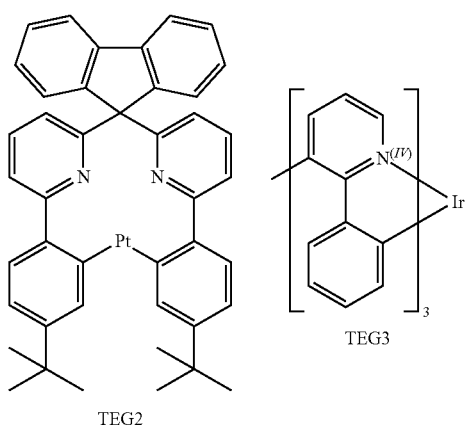
TEG2
TEG3
-continued
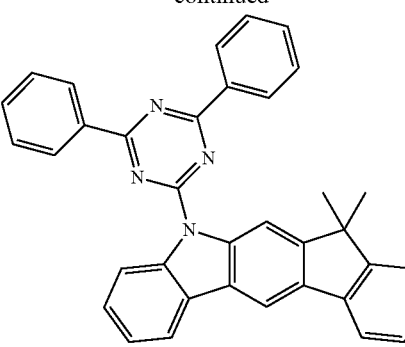
TMM1
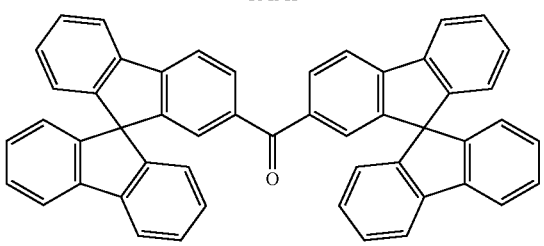
TMM2
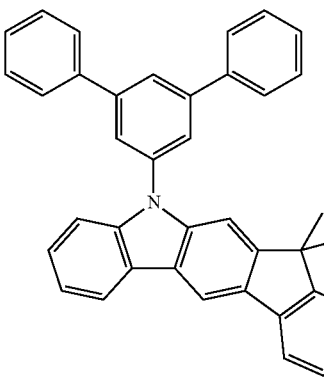
TMM3
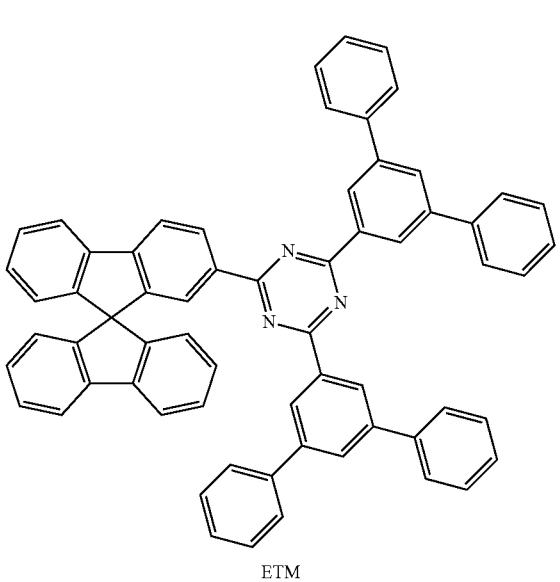
ETM -continued

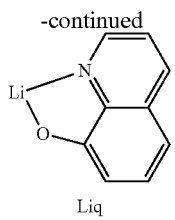

Liq

These OLEDs are characterised by standard methods; for this purpose, the electroluminescence spectra and colour coordinates (in accordance with CIE 1931), the efficiency (measured in cd/A) as a function of the luminance, the operating voltage, calculated from current/voltage/luminous density characteristic lines (IUL characteristic lines), and the lifetime (LT70% at an initial luminance of 4000 cd/m$^2$) are determined. In addition, the drift in the colour coordinates over the lifetime measurement is followed, and the difference between the initial colour and the colour at time LT70% is determined. The results obtained are summarised in Table 1.

The results for various OLEDs are compared below. These are in each case OLEDs which comprise two differently coloured phosphorescent emitters in different layer architectures (in accordance with the invention or as comparison).

Example 1

Examples 1 a-c according to the invention are achieved by the following layer structure: 50 nm HIM/10 nm HAT-CN/50 nm HIM/20 nm NPB/20 nm mixed layer consisting of (in the case of 1a) HTM (90%), TEG1 (5%), TER1 (5%); (in the case of 1b) HTM (80%), TEG1 (10%), TER1 (10%); (in the case of 1c) HTM (75%), TEG1 (15%), TER1 (10%)/20 nm mixed layer consisting of TMM1 (85%) and TEG1 (15%)/10 nm TMM2/45 nm mixed layer consisting of ETM (50%) and Liq (50%)/100 nm Al.

Example 2 (Comparative Example)

Example 2 is achieved by the following layer structure: 50 nm HIM/10 nm HAT-CN/50 nm HIM/20 nm NPB/20 nm mixed layer consisting of HTM (95%) and TER1 (5%)/20 nm mixed layer consisting of TMM1 (85%) and TEG1 (15%)/10 nm TMM2/45 nm mixed layer consisting of ETM (50%) and Liq (50%)/100 nm Al.

Example 1a according to the invention corresponds precisely to the architecture of Comparative Example 2 apart from the fact that not only 5% of TER1, but additionally 5% of TEG1 have been doped in emitter layer 1. It is clearly evident from the performance data that a significantly improved lifetime is achieved in the case of 1a compared with Example 2 with a very similar overall colour and efficiency. In addition, the colour shift with the lifetime is reduced.

Example 1b and c illustrate that colour, efficiency and lifetime can be changed slightly by variation of the emitter concentrations in emitter layer 1. However, the effect according to the invention of an improved lifetime and a smaller colour shift remains. It is thus not an effect which is based only on a very specific choice of the emitter concentrations.

Example 3 (Comparative Example)

Example 3 is achieved by the following layer structure: 50 nm HIM/10 nm HAT-CN/50 nm HIM/20 nm NPB/20 nm mixed layer consisting of NPB (95%), TER1 (5%)/20 nm mixed layer consisting of TMM1 (85%) and TEG1 (15%)/10 nm TMM2/45 nm mixed layer consisting of ETM (50%) and Liq (50%)/100 nm Al.

Example 3 corresponds to Example 2 apart from the difference that the matrix used for the orange dopant was the widespread material NPB instead of HTM. Here too, a worse lifetime and an increased colour shift arise compared with Example 1a according to the invention. This example is intended to illustrate that the colour shift is not dependent on the choice of the matrix of emitter layer 1, but instead on whether in accordance with the invention two emitters or only one has been doped into the layer.

Example 4 (Comparative Example)

Example 4 is achieved by the following layer structure: 50 nm HIM/10 nm HAT-CN/50 nm HIM/30 nm NPB/30 nm mixed layer consisting of TMM1 (84.7%), TEG1 (15%), TER1 (0.3%)/10 nm TMM2/45 nm mixed layer consisting of ETM (50%) and Liq (50%)/100 nm Al.

This comparative example comprises only one emitting layer into which both emitters have been doped in such a way that they likewise luminesce in a balanced ratio. In this case, the emitter concentration cannot be varied in a large range, but instead on the contrary must be accurately adjusted very sensitively in order to obtain a balanced mixed colour. The depicted concentrations of 15% for TEG1 and 0.3% for TER1 result from this. It is evident from the performance data that although a very small colour shift with the lifetime is present in this case, the lifetime per se is, at 350 h, very short, significantly shorter than in the case of the other comparative examples.

Overall, the examples thus show that the combination according to the invention of a doubly doped emitter layer with a singly doped emitter layer enables both a small colour shift—smaller than in the case of combination of two singly doped layers—and also a very good lifetime to be achieved. The following is particularly surprising here: with respect to colour shift, the result obtained could be regarded as a compromise or average of the two colour shifts (the strong colour shift in the case of the use of two single dopings and the small colour shift in the case of the use of a double doping). By contrast, the lifetime in the case of the architecture according to the invention is not an average between the short lifetime in the case of the double doping and the lifetime which is approximately twice as long in the case of the combination of two single dopings, but instead is significantly increased compared with all comparative architectures.

In order to demonstrate that this behaviour is not based on the specific choice of the matrix or emitter materials, a further example according to the invention which have been achieved with other materials, for example also emitters based on Pt instead of Ir, are shown below.

Example 5

Example 5 according to the invention is achieved by the following layer structure: 50 nm HIM/10 nm HAT-CN/50 nm HIM/20 nm NPB/20 nm mixed layer consisting of HTM2 (75%), TEG1 (15%), TER1 (10%)/20 nm mixed layer consisting of TMM1 (45%), TMM3 (40%) and TEG1 (15%)/10 nm TMM1/45 nm mixed layer consisting of ETM (50%) and Liq (50%)/100 nm Al.

Example 6 (Comparative Example)

Example 6 is achieved by the following layer structure: 50 nm HIM/10 nm HAT-CN/50 nm HIM/20 nm NPB/20 nm mixed layer consisting of HTM2 (85%), TER1 (10%)/20 nm mixed layer consisting of TMM1 (45%), TMM3 (40%) and TEG1 (15%)/10 nm TMM1/45 nm mixed layer consisting of ETM (50%) and Liq (50%)/100 nm Al.

Examples 5 and 6 consist of the same layer structure apart from the use according to the invention of the double doping in emitter layer 1 in Example 5 compared with the single doping in Comparative Example 6. Direct comparison of the two cases again illustrates the advantage of the invention. In this case, both layer architectures allow a very good lifetime, but the colour shift is additionally improved in the case of 5.

Furthermore, a different hole-conducting matrix material (HTM2) is used in Example 5 and 6 than in Examples 2 and 3 (HTM), whose monoamine-based chemical structure is completely different to that of HTM. This example is intended to illustrate that the advantage of the architecture according to the invention is not restricted to a specific class of hole-conducting matrices.

In addition, Examples 5 and 6 comprise a mixed matrix (comprising TMM1 and TMM3) in the second emitter layer. A mixed matrix instead of a simple matrix can (not unusually in the case of OLEDs) be used in order to improve the performance data overall. The examples thus also show, however, that the advantage of the architecture according to the invention is also retained in the case where the OLED comprises further optimised layers elsewhere.

Example 7

Example 5 according to the invention is achieved by the following layer structure: 50 nm HIM/10 nm HAT-CN/50 nm HIM/20 nm NPB/20 nm mixed layer consisting of HTM (85%), TEG2 (10%), TER2 (5%)/20 nm mixed layer consisting of TMM1 (95%) and TEG2 (5%)/10 nm TMM2/45 nm mixed layer consisting of ETM (50%) and Liq (50%)/100 nm Al.

Example 8 (Comparative Example)

Example 8 is achieved by the following layer structure: 50 nm. HIM/10 nm HAT-CN/50 nm HIM/20 nm NPB/20 nm mixed layer consisting of HTM (95%) and TER2 (5%)/20 nm mixed layer consisting of TMM1 (95%) and TEG2 (5%)/10 nm TMM2/45 nm mixed layer consisting of ETM (50%) and Liq (50%)/100 nm Al.

In Examples 7 and 8, other phosphorescent emitters based on Pt instead of Ir are used. Owing to the deeper-red emission of TER2 compared with TER1, a deeper-orange mixed colour arises, causing the absolute values of efficiency and lifetime to come out lower than in the previous examples. Irrespective of this, however, the use of the doubly doped emitter layer 1 according to the invention also results in a significant improvement in the lifetime and also a slight improvement in the colour shift.

Example 9

Example 9 according to the invention is achieved by the following layer structure: 50 nm HIM/10 nm HAT-CN/50 nm HIM/20 nm NPB/20 nm mixed layer consisting of HTM2 (75%), TEG1 (15%), TER1 (10%)/20 nm mixed layer consisting of TMM1 (45%), TMM3 (40%) and TEG3 (15%)/10 nm TMM1/45 nm mixed layer consisting of ETM (50%) and Liq (50%)/100 nm Al.

Example 10

Example 10 according to the invention is achieved by the following layer structure: 50 nm HIM/10 nm HAT-CN/50 nm HIM/20 nm NPB/20 nm mixed layer consisting of HTM2 (75%), TEG3 (15%), TER1 (10%)/20 nm mixed layer consisting of TMM1 (45%), TMM3 (40%) and TEG1 (15%)/10 nm TMM1/45 nm mixed layer consisting of ETM (50%) and Liq (50%)/100 nm Al.

Examples 9 and 10 according to the invention have an analogous structure to Example 5 according to the invention, with the difference that the same short-wave (green-emitting) dopant is not used here in the two emitter layers, but instead, in TEG1 and TEG3, two different dopants are used whose emission maximum differs by less than 10 nm. Example 6 can again serve as comparative example here, and the comparison illustrates that the layer structure according to the invention in Examples 9 and 10 results in a reduced colour shift with ageing.

TABLE 1

Device results

| Ex. (* = comp) | 1st emission layer | 2nd emission layer | Efficiency [cd/A] at 1000 cd/m$^2$ | CIE x/y at 1000 cd/m$^2$ | LT70% [h], with start 4000 cd/m$^2$ | Delta CIE x/y after LT70% |
|---|---|---|---|---|---|---|
| 1a | HTM (90%), TEG1 (5%), TER1 (5%) | TMM1 (85%), TEG1 (15%) | 39 | 0.488/0.486 | 1100 | −0.015/+0.010 |
| 1b | HTM (80%), TEG1 (10%), TER1 (10%) | TMM1 (85%), TEG1 (15%) | 35 | 0.506/0.470 | 1200 | −0.018/+0.015 |
| 1c | HTM (75%), TEG1 (15%), TER1 (10%) | TMM1 (85%), TEG1 (15%) | 35 | 0.513/0.464 | 1400 | −0.019/+0.016 |
| 2 (comp) | HTM (95%), TER1 (5%) | TMM1 (85%), TEG1 (15%) | 40 | 0.480/0.492 | 700 | −0.028/+0.023 |
| 3 (comp) | NPB (95%), TER1 (5%) | TMM1 (85%), TEG1 (15%) | 41 | 0.494/0.483 | 800 | −0.030/+0.024 |
| 4 (comp) | — | TMM1 (84.7%), TEG1 (15%), TER1 (0.3%) | 38 | 0.522/0.467 | 350 | −0.005/+0.04 |
| 5 | HTM2 (75%), TEG1 (15%), TER1 (10%) | TMM1 (45%), TMM3 (40%), TEG1 (15%) | 44 | 0.492/0.485 | 1800 | −0.015/+0.012 |
| 6 (comp) | HTM2 (90%), TER1 (10%) | TMM1 (45%), TMM3 (40%), TEG1 (15%) | 44 | 0.504/0.477 | 1800 | −0.035/+0.022 |

TABLE 1-continued

Device results

| Ex. (* = comp) | 1st emission layer | 2nd emission layer | Efficiency [cd/A] at 1000 cd/m² | CIE x/y at 1000 cd/m² | LT70% [h], with start 4000 cd/m² | Delta CIE x/y after LT70% |
|---|---|---|---|---|---|---|
| 7 | HTM (85%) TEG2 (10%) TER2 (5%) | TMM1 (95%) TEG2 (5%) | 19 | 0.632/0.366 | 500 | −0.014/+0.008 |
| 8 (comp) | HTM (95%) TER2 (5%) | TMM1 (95%) TEG2 (5%) | 18 | 0.620/0.377 | 150 | −0.018/+0.009 |
| 9 | HTM2 (75%), TEG1 (15%), TER1 (10%) | TMM1 (45%), TMM3 (40%), TEG3 (15%) | 40 | 0.502/0.478 | 2100 | −0.017/+0.014 |
| 10 | HTM2 (75%), TEG3 (15%), TER1 (10%) | TMM1 (45%), TMM3 (40%), TEG1 (15%) | 42 | 0.499/0.478 | 1900 | −0.014/+0.012 |

The invention claimed is:

1. An organic electroluminescent device comprising, in this sequence:
   anode, phosphorescent emitter layer 1, phosphorescent emitter layer 2, which is in direct contact with said phosphorescent emitter layer 1, a charge-generation layer, blue-emitting layer, and cathode, wherein said phosphorescent emitter layer 1 comprises a hole-conducting matrix material and two different phosphorescent emitters wherein one phosphorescent emitter is a shorter-wave phosphorescent emitter and one phosphorescent emitter is a longer-wave phosphorescent emitter, and said phosphorescent emitter layer 2 comprises an electron-conducting matrix material and a phosphorescent emitter, wherein the phosphorescent emitter of emitter layer 2 has the same emission maximum as the shorter-wave phosphorescent emitter of emitter layer 1, wherein said device is a white-emitting, tandem organic electroluminescent device.

2. The organic electroluminescent device of claim 1, wherein the phosphorescent emitter of emitter layer 2 is identical to the shorter-wave phosphorescent emitter of emitter layer 1.

3. The organic electroluminescent device of claim 1, wherein said phosphorescent emitter layer 1 is a yellow-, orange-, or red-emitting layer and phosphorescent emitter layer 2 is a green- or yellow-emitting layer.

4. The organic electroluminescent device of claim 1, wherein said phosphorescent emitter layer 1 and said phosphorescent emitter layer 2 emit in total light having color coordinates of $0.45 \leq CIE\ x \leq 0.58$.

5. The organic electroluminescent device of claim 1, wherein said hole-conducting matrix material in said phosphorescent emitter layer 1 is a material which has an HOMO of $\geq -5.5$ eV.

6. The organic electroluminescent device of claim 1, wherein the triplet energy $T_1$ of the hole-conducting matrix material in said phosphorescent emitter layer 1 is greater than that of the longer-wave emitter.

7. The organic electroluminescent device of claim 1, wherein the electron-conducting matrix material in said phosphorescent emitter layer 2 is a material whose LUMO is in the range from $-2.3$ eV to $-3.1$ eV.

8. The organic electroluminescent device of claim 1, wherein said phosphorescent emitter layer 2 comprises a mixture of an electron-conducting matrix material and at least one further matrix material.

9. The organic electroluminescent device of claim 1, wherein the triplet energy $T_1$ of the electron-conducting matrix material in said phosphorescent emitter layer 2 is $\geq 2.5$ eV.

10. The organic electroluminescent device of claim 1, wherein the shorter-wave phosphorescent emitter is present in said phosphorescent emitter layer 1 in a concentration of 3 to 25% by vol. and the longer-wave phosphorescent emitter is present in emitter layer 1 in a concentration of 2 to 15% by vol., and wherein the phosphorescent emitter is present in said phosphorescent emitter layer 2 in a concentration of 2 to 20% by vol.

11. The organic electroluminescent device of claim 1, wherein the electron-conducting matrix material in said phosphorescent emitter layer 2 is selected from the group consisting of compounds of the formulae (1) to (5),

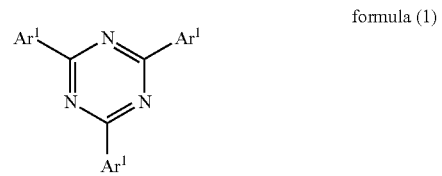

formula (1)

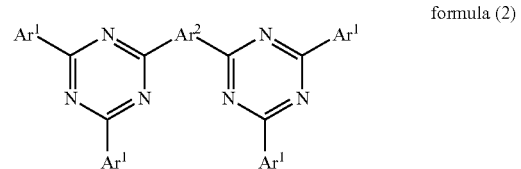

formula (2)

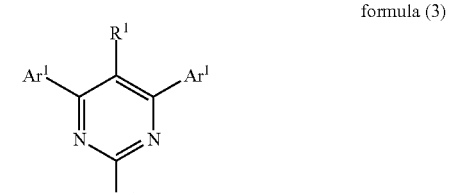

formula (3)

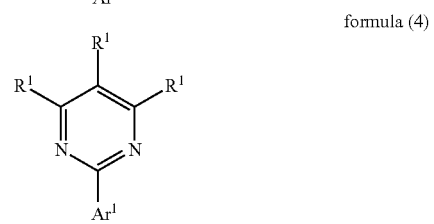

formula (4)

-continued

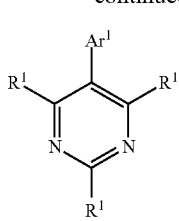

formula (5)

wherein:
Ar$^1$ is, identically or differently on each occurrence, a monovalent aromatic or heteroaromatic ring system having 5 to 60 aromatic ring atoms, optionally substituted by one or more radicals R$^1$;
Ar$^2$ is a divalent aromatic or heteroaromatic ring system having 5 to 60 aromatic ring atoms, optionally substituted by one or more radicals R$^1$;
R$^1$ is, identically or differently on each occurrence, H; D; F; Cl; Br; I; CHO; C(=O)Ar$^3$; P(=O)(Ar$^3$)$_2$; S(=O)Ar$^3$; S(=O)$_2$Ar$^3$; CR$^2$=CR$^2$Ar$^3$; CN; NO$_2$; Si(R$^2$)$_3$; B(OR$^2$)$_2$; B(R$^2$)$_2$; B(N(R$^2$)$_2$)$_2$; OSO$_2$R$^2$; a straight-chain alkyl, alkoxy or thioalkoxy group having 1 to 40 C atoms, a straight-chain alkenyl or alkynyl group having 2 to 40 C atoms, a branched or cyclic alkyl, alkenyl, alkynyl, alkoxy or thioalkoxy group having 3 to 40 C atoms, each of which are optionally substituted by one or more radicals R$^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S, or CONR$^2$ and wherein one or more H atoms are optionally replaced by D, F, Cl, Br, I, CN, or NO$_2$; an aromatic or heteroaromatic ring system having 5 to 60 aromatic ring atoms, optionally substituted by one or more radicals R$^2$; or an aryloxy or heteroaryloxy group having 5 to 60 aromatic ring atoms, optionally substituted by one or more radicals R$^2$; or a combination of these systems; wherein two or more adjacent substituents R$^1$ optionally define a mono- or polycyclic, aliphatic, or aromatic ring system;
Ar$^3$ is, identically or differently on each occurrence, an aromatic or heteroaromatic ring system having 5 to 40 aromatic ring atoms, optionally substituted by one or more radicals R$^2$;
R$^2$ is, identically or differently on each occurrence, H, D, CN, or an aliphatic, aromatic and/or heteroaromatic hydrocarbon radical having 1 to 20 C atoms, wherein one or more H atoms are optionally replaced by D or F, wherein two or more adjacent substituents R$^2$ optionally define a mono- or polycyclic, aliphatic, or aromatic ring system;
or wherein the electron-conducting matrix material in said phosphorescent emitter layer 2 is a compound of formula (21),

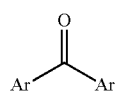

formula (21)

wherein:
Ar is, identically or differently on each occurrence, an aromatic or heteroaromatic ring system having 5 to 60 aromatic ring atoms, optionally substituted by one or more groups R$^1$; and R$^1$ is, identically or differently on each occurrence, H; D; F; Cl; Br; I; CHO; C(=O)Ar$^3$; P(=O)(Ar$^3$)$_2$; S(=O)Ar$^3$; S(=O)$_2$Ar$^3$; CR$^2$=CR$^2$Ar$^3$; CN; NO$_2$; Si(R$^2$)$_3$; B(OR$^2$)$_2$; B(R$^2$)$_2$; B(N(R$^2$)$_2$)$_2$; OSO$_2$R$^2$; a straight-chain alkyl, alkoxy or thioalkoxy group having 1 to 40 C atoms, a straight-chain alkenyl or alkynyl group having 2 to 40 C atoms, a branched or cyclic alkyl, alkenyl, alkynyl, alkoxy or thioalkoxy group having 3 to 40 C atoms, each of which are optionally substituted by one or more radicals R$^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S, or CONR$^2$ and wherein one or more H atoms are optionally replaced by D, F, Cl, Br, I, CN, or NO$_2$; an aromatic or heteroaromatic ring system having 5 to 60 aromatic ring atoms, optionally substituted by one or more radicals R$^2$; or an aryloxy or heteroaryloxy group having 5 to 60 aromatic ring atoms, optionally substituted by one or more radicals R$^2$; or a combination of these systems; wherein two or more adjacent substituents R$_1$ optionally define a mono- or polycyclic, aliphatic, or aromatic ring system.

12. The organic electroluminescent device of claim 1, wherein the hole-conducting matrix material in said phosphorescent emitter layer 1 is selected from the group consisting of the compounds of formulae (26) to (32),

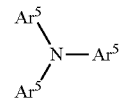

formula (26)

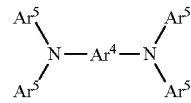

formula (27)

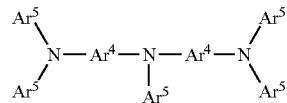

formula (28)

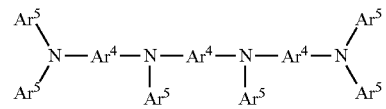

formula (29)

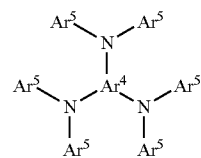

formula (30)

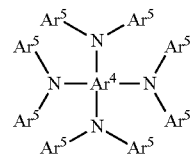

formula (31)

-continued formula (32)

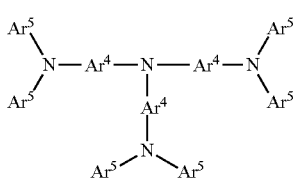

wherein:
Ar$^4$ is, identically or differently on each occurrence, a divalent, trivalent or tetravalent aromatic or heteroaromatic ring system having 5 to 60 aromatic ring atoms, optionally substituted by one or more radicals R$^1$;
Ar$^5$ is, identically or differently on each occurrence, a monovalent aromatic or heteroaromatic ring system having 5 to 60 aromatic ring atoms, optionally substituted by one or more radicals R$^1$, wherein two groups Ar$^5$ which are bonded to the same nitrogen atom or a group Ar$^4$ with a group Ar$^5$ which are bonded to the same nitrogen atom are optionally linked to one another by a single bond or a bridge selected from the group consisting of B(R$^1$), C(R$^1$)$_2$, Si(R$^1$)$_2$, C=O, C=NR$^1$, C=C(R$^1$)$_2$, O, S, S=O, SO$_2$, N(R$^1$), P(R$^1$), and P(=O)R$^1$; and
R$^1$ is, identically or differently on each occurrence, H; D; F; Cl; Br; I; CHO; C(=O)Ar$^3$; P(=O)(Ar$^3$)$_2$; S(=O)Ar$^3$; S(=O)$_2$Ar$^3$; CR$^2$=CR$^2$Ar$^3$; CN; NO$_2$; Si(R$^2$)$_3$; B(OR$^2$)$_2$; B(R$^2$)$_2$; B(N(R$^2$)$_2$)$_2$; OSO$_2$R$^2$; a straight-chain alkyl, alkoxy or thioalkoxy group having 1 to 40 C atoms, a straight-chain alkenyl or alkynyl group having 2 to 40 C atoms, a branched or cyclic alkyl, alkenyl, alkynyl, alkoxy or thioalkoxy group having 3 to 40 C atoms, each of which are optionally substituted by one or more radicals R$^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S, or CONR$^2$ and wherein one or more H atoms are optionally replaced by D, F, Cl, Br, I, CN, or NO$_2$; an aromatic or heteroaromatic ring system having 5 to 60 aromatic ring atoms, optionally substituted by one or more radicals R$^2$; or an aryloxy or heteroaryloxy group having 5 to 60 aromatic ring atoms, optionally substituted by one or more radicals R$^2$; or a combination of these systems; wherein two or more adjacent substituents R$^1$ optionally define a mono- or polycyclic, aliphatic, or aromatic ring system;
or the hole-conducting matrix material in said phosphorescent emitter layer 1 is selected from the group consisting of the compounds of formulae (33) and (34), formula (33)

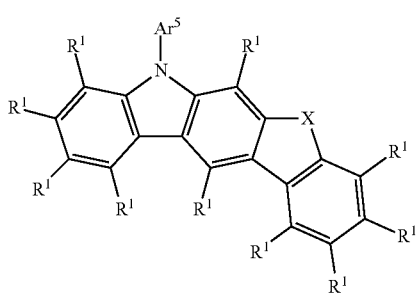

-continued formula (34)

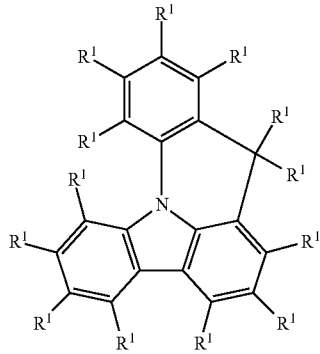

wherein Ar$^5$ and R$^1$ are defined as above.
13. The organic electroluminescent device of claim 1, wherein a phosphorescent compound of the formulae (35) to (38) is present in the phosphorescent emitter layer 1 or the phosphorescent emitter layer 2, formula (35)

formula (36)

formula (37)

formula (38)

wherein:
DCy is, identically or differently on each occurrence, a cyclic group which contains at least one donor atom, carbon in the form of a carbene or phosphorus, via which the cyclic group is bonded to the metal, and which optionally carries one or more substituents R$^1$, wherein the groups DCy and CCy are connected to one another via a covalent bond;
CCy is, identically or differently on each occurrence, a cyclic group which contains a carbon atom via which the cyclic group is bonded to the metal and which optionally carries one or more substituents R$^1$;
A is, identically or differently on each occurrence, a monoanionic, bidentate-chelating ligand; and
R$^1$ is, identically or differently on each occurrence, H; D; F; Cl; Br; I; CHO; C(=O)Ar$^3$; P(=O)(Ar$^3$)$_2$; S(=O)Ar$^3$; S(=O)$_2$Ar$^3$; CR$^2$=CR$^2$Ar$^3$; CN; NO$_2$; Si(R$^2$)$_3$; B(OR$^2$)$_2$; B(R$^2$)$_2$; B(N(R$^2$)$_2$)$_2$; OSO$_2$R$^2$; a straight-chain alkyl, alkoxy or thioalkoxy group having 1 to 40 C atoms, a straight-chain alkenyl or alkynyl group having 2 to 40 C atoms, a branched or cyclic alkyl, alkenyl, alkynyl, alkoxy or thioalkoxy group having 3 to 40 C atoms, each of which are optionally substituted by one or more radicals R$^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, $P(=O)(R^2)$, SO, $SO_2$, $NR^2$, O, S, or $CONR^2$ and wherein one or more H atoms are optionally replaced by D, F, Cl, Br, I, CN, or $NO_2$; an aromatic or heteroaromatic ring system having 5 to 60 aromatic ring atoms, optionally substituted by one or more radicals $R^2$; or an aryloxy or heteroaryloxy group having 5 to 60 aromatic ring atoms, optionally substituted by one or more radicals $R^2$; or a combination of these systems; wherein two or more adjacent substituents $R^1$ optionally define a mono- or polycyclic, aliphatic, or aromatic ring system.

14. The organic electroluminescent device of claim 1, wherein the charge-generation layer is formed by coupling an n-conducting layer and a p-conducting layer to one another, where the p-conducting layer comprises p-doped organic hole-transport materials or comprises inorganic materials, and the n-conducting layer is a doped organic electron-transport layer.

15. A process for the production of the organic electroluminescent device of claim 1, wherein one or more layers are produced by means of a sublimation process or by means of the organic vapour-phase deposition process or with the aid of carrier-gas sublimation or from solution or by means of a printing process.

16. The organic electroluminescent device of claim 5, wherein said hole-conducting matrix material in said phosphorescent emitter layer 1 is a material which has an HOMO of $\geq -5.3$ eV.

17. The organic electroluminescent device of claim 7, wherein the electron-conducting matrix material in emitter layer 2 is a material whose LUMO is in the range from $-2.6$ eV to $-2.9$ eV.

18. The organic electroluminescent device of claim 9, wherein the triplet energy $T_1$ of the electron-conducting matrix material in said phosphorescent emitter layer 2 is $\geq 2.7$ eV.

19. The organic electroluminescent device of claim 13, wherein A is a diketonate ligand.

* * * * *